US012169289B2

(12) United States Patent
Roh et al.

(10) Patent No.: US 12,169,289 B2
(45) Date of Patent: Dec. 17, 2024

(54) IMAGE SENSOR INCLUDING COLOR SEPARATING LENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Sookyoung Roh, Yongin-si (KR); Sangyun Lee, Yongin-si (KR); Sungmo Ahn, Yongin-si (KR); Seokho Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 17/959,608

(22) Filed: Oct. 4, 2022

(65) Prior Publication Data

US 2023/0115006 A1 Apr. 13, 2023

(30) Foreign Application Priority Data

Oct. 8, 2021 (KR) ........................ 10-2021-0134437
Sep. 26, 2022 (KR) ........................ 10-2022-0121966

(51) Int. Cl.
*G02B 3/00* (2006.01)
*H04N 9/64* (2023.01)
*H04N 23/84* (2023.01)

(52) U.S. Cl.
CPC ......... *G02B 3/0056* (2013.01); *G02B 3/0043* (2013.01); *H04N 9/64* (2013.01); *H04N 23/84* (2023.01)

(58) Field of Classification Search
CPC ...... G02B 3/0056; G02B 3/0043; H04N 9/64; H04N 23/84; H01L 27/14627; H01L 27/14621
See application file for complete search history.

(56) References Cited

U.S. PATENT DOCUMENTS 7,202,896 B2 4/2007 Wako et al.
8,076,745 B2 12/2011 Nishiwaki
(Continued)

FOREIGN PATENT DOCUMENTS

EP 3 812 801 A1 4/2021
JP 6707105 B2 6/2020
(Continued)

OTHER PUBLICATIONS

Seiji Nishiwaki et al., "Efficient colour splitters for high-pixel-density image sensors," Nature Photonics, Feb. 3, 2021, (total 7 pages).

(Continued)

*Primary Examiner* — Gevell V Selby

(74) *Attorney, Agent, or Firm* — Sughrue Mion, PLLC

(57) ABSTRACT

An image sensor includes a color separating lens array including a plurality of first pixel corresponding regions respectively corresponding to a plurality of first pixels and a plurality of second pixel corresponding regions respectively corresponding to a plurality of second pixels, wherein each of the plurality of first pixel corresponding regions and the plurality of second pixel corresponding regions includes a plurality of nanoposts, and at least one of a shape, a width, and an arrangement of the plurality of nanoposts of the plurality of first pixel corresponding regions changes according to an azimuth direction of the plurality of nanoposts in a peripheral portion surrounding a central portion of the color separating lens array.

20 Claims, 58 Drawing Sheets

Li
L1 L1 L1 L1
L2 L2 L2 L2
R1 R2 R1 R2 R1 R2 R1 R2
NP
CSLA
$L_{\lambda1}$
$L_{\lambda2}$
PX1 PX2 PX1 PX2 PX1 PX2 PX1 PX2
Z
Y X

(56) References Cited

U.S. PATENT DOCUMENTS

| | | | | |
|---|---|---|---|---|
| 8,289,422 | B2 | 10/2012 | Hiramoto et al. | |
| 9,691,800 | B2 | 6/2017 | Yang | |
| 9,860,491 | B2 | 1/2018 | Park et al. | |
| 11,515,352 | B2 | 11/2022 | Miyata et al. | |
| 2012/0206637 | A1 | 8/2012 | Hiramoto et al. | |
| 2012/0212656 | A1 | 8/2012 | Hiramoto et al. | |
| 2016/0118430 | A1 | 4/2016 | Nam et al. | |
| 2016/0351605 | A1* | 12/2016 | Yang | H01L 27/14625 |
| 2017/0141150 | A1* | 5/2017 | Park | H04N 25/134 |
| 2021/0124179 | A1* | 4/2021 | Yun | G02B 5/1876 |
| 2021/0125301 | A1 | 4/2021 | Park et al. | |
| 2021/0126030 | A1 | 4/2021 | Yun et al. | |
| 2021/0126032 | A1 | 4/2021 | Roh et al. | |
| 2021/0126035 | A1* | 4/2021 | Roh | G02B 5/1876 |
| 2022/0137424 | A1 | 5/2022 | Lee et al. | |

FOREIGN PATENT DOCUMENTS

| | | | |
|---|---|---|---|
| KR | 1020160139266 | A | 12/2016 |
| KR | 1020210048401 | A | 5/2021 |
| KR | 1020210048987 | A | 5/2021 |

OTHER PUBLICATIONS

Communication dated Jan. 30, 2023, issued by the European Patent Office in counterpart European Application No. 22198357.0.

* cited by examiner

| G | B | G | B | G | B | G | B |
|---|---|---|---|---|---|---|---|
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

FIG. 5A

| 111 | 112 | 111 | 112 |
| --- | --- | --- | --- |
| 113 | 114 | 113 | 114 |
| 111 | 112 | 111 | 112 |
| 113 | 114 | 113 | 114 |

IMAGE SENSOR INCLUDING COLOR SEPARATING LENS ARRAY AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2021-0134437, filed on Oct. 8, 2021, and Korean Patent Application No. 10-2022-0121966, filed on Sep. 26, 2022, in the Korean Intellectual Property Office, the disclosure of which is incorporated by reference herein in its entirety.

BACKGROUND

1. Field

The present disclosure relates to an image sensor including a color separating lens array capable of separating incident light into multiple color components or various wavelengths of the light, and an electronic apparatus including the image sensor.

2. Description of the Related Art

Image sensors generally sense the color of incident light by using a color filter. However, a color filter may have low light utilization efficiency because the color filter absorbs light of colors other than the corresponding color of light. For example, when an RGB color filter is used, because only ⅓ of the incident light is transmitted and the rest of the incident light (i.e., ⅔ of the incident light) is absorbed, the light utilization efficiency is only about 33%. Thus, in a color display apparatus or a color image sensor, most light loss occurs in the color filter.

SUMMARY

One or more example embodiments provide an image sensor having improved light utilization efficiency by using a color separating lens array capable of separating or dispersing incident light according to wavelengths of the incident light, and an electronic apparatus including the image sensor.

Also, one or more example embodiments provide an image sensor having improved color purity.

According to an aspect of an embodiment, an image sensor includes: a sensor substrate including a plurality of first pixels sensing light of a first wavelength and a plurality of second pixels sensing light of a second wavelength different from the first wavelength; and a color separating lens array including a plurality of first pixel corresponding regions respectively corresponding to the plurality of first pixels and a plurality of second pixel corresponding regions respectively corresponding to the plurality of second pixels, wherein the plurality of first pixel corresponding regions are configured to change a phase of the light of the first wavelength and condense the light of the first wavelength onto each of the plurality of first pixels, and the plurality of second pixel corresponding regions are configured to change a phase of the light of the second wavelength and condense the light of the second wavelength onto each of the plurality of second pixels, each of the plurality of first pixel corresponding regions and the plurality of second pixel corresponding regions includes a plurality of nanoposts, and at least one of a shape, a width, and an arrangement of the plurality of nanoposts of the plurality of first pixel corresponding regions is set according to an azimuth direction of the plurality of nanoposts in a peripheral portion surrounding a central portion of the color separating lens array.

The plurality of nanoposts of the first pixel corresponding region may include a first nanopost and a second nanopost arranged at different positions in the first pixel corresponding region, and a width of the first nanopost of the first pixel corresponding region located at a first distance from the central portion of the color separating lens array in a first direction on a surface of the color separating lens array may be different from a width of the first nanopost of the first pixel corresponding region located at the first distance from the central portion of the color separating lens array in a second direction perpendicular to the first direction on the surface of the color separating lens array.

A width of the second nanopost of the first pixel corresponding region located at the first distance from the central portion of the color separating lens array in the first direction on the surface of the color separating lens array may be equal to a width of the second nanopost of the first pixel corresponding region located at the first distance from the central portion of the color separating lens array in the second direction on the surface of the color separating lens array.

A width of the first nanopost of the first pixel corresponding region located at the first distance from the central portion of the color separating lens array in a 45-degree direction between the first direction and the second direction on the surface of the color separating lens array may be greater than a width of the first nanopost of the first pixel corresponding region located at the central portion of the color separating lens array.

A width of the second nanopost of the first pixel corresponding region located at the first distance from the central portion of the color separating lens array in the 45-degree direction on the surface of the color separating lens array may be greater than a width of the second nanopost of the first pixel corresponding region located at the central portion of the color separating lens array.

A width of the first nanopost of the first pixel corresponding region located at a second distance greater than the first distance from the central portion of the color separating lens array in the 45-degree direction on the surface of the color separating lens array may be greater than a width of the first nanopost of the first pixel corresponding region located at the first distance from the central portion of the color separating lens array in the 45-degree direction on the surface of the color separating lens array, and a width of the second nanopost of the first pixel corresponding region located at the second distance greater than the first distance from the central portion of the color separating lens array in the 45-degree direction on the surface of the color separating lens array may be greater than a width of the second nanopost of the first pixel corresponding region located at the first distance from the central portion of the color separating lens array in the 45-degree direction on the surface of the color separating lens array.

The arrangement of the plurality of nanoposts of the first pixel corresponding region located at a first distance from the central portion of the color separating lens array in a first direction on a surface of the color separating lens array may be different from the arrangement of the plurality of nanoposts of the first pixel corresponding region located at the first distance from the central portion of the color separating lens array in a second direction perpendicular to the first direction on the surface of the color separating lens array.

Positions of the first pixel corresponding region and the second pixel corresponding region in the central portion of the color separating lens array may be equal to positions of a first pixel and a second pixel respectively corresponding thereto, and among the plurality of first pixels and the plurality of second pixels, the first pixel corresponding region and the second pixel corresponding region in the peripheral portion of the color separating lens array may be shifted toward the central portion of the color separating lens array with respect to the first pixel and the second pixel respectively corresponding thereto.

A degree of shift of the first pixel corresponding region and the second pixel corresponding region with respect to the first pixel and the second pixel respectively corresponding thereto in the peripheral portion of the color separating lens array may increase as a distance from the central portion of the color separating lens array to the first pixel corresponding region and the second pixel corresponding region increases.

The sensor substrate may further include a plurality of third pixels sensing light of a third wavelength different from the first and second wavelengths and a plurality of fourth pixels sensing light of the first wavelength, the color separating lens array may further include a plurality of third pixel corresponding regions corresponding to the third pixel and a plurality of fourth pixel corresponding regions corresponding to the fourth pixel, each of the plurality of third pixel corresponding regions and the plurality of fourth pixel corresponding regions may include a plurality of nanoposts, and the plurality of first pixel corresponding regions, the plurality of second pixel corresponding regions, the plurality of third pixel corresponding regions, and the plurality of fourth pixel corresponding regions may be configured to change a phase of the light of the first wavelength and condense the light of the first wavelength onto each of the first and fourth pixels, to change a phase of the light of the second wavelength and condense the light of the second wavelength onto each of the second pixels, and to change a phase of the light of the third wavelength and condense the light of the third wavelength onto each of the third pixels.

The plurality of first pixel corresponding regions and the plurality of fourth pixel corresponding regions may be arranged adjacent to each other in a first diagonal direction, and the plurality of second pixel corresponding regions and the plurality of third pixel corresponding regions may be arranged adjacent to each other in a second diagonal direction intersecting with the first diagonal direction.

At least one of a shape, a width, and an arrangement of the plurality of nanoposts of the plurality of fourth pixel corresponding regions may change according to an azimuth angle of the plurality of nanoposts of the plurality of fourth pixel corresponding regions in the peripheral portion surrounding the central portion of the color separating lens array.

A plurality of nanoposts of the first pixel corresponding region may include a first nanopost and a second nanopost arranged at different positions in the first pixel corresponding region, a plurality of nanoposts of the fourth pixel corresponding region may include a third nanopost and a fourth nanopost arranged at different positions in the fourth pixel corresponding region, a width of the first nanopost of the first pixel corresponding region located at a first distance from the central portion of the color separating lens array in a first direction on a surface of the color separating lens array may be different from a width of the first nanopost of the first pixel corresponding region located at the first distance from the central portion of the color separating lens array in a second direction perpendicular to the first direction on the surface of the color separating lens array, and a width of the third nanopost of the fourth pixel corresponding region located at the first distance from the central portion of the color separating lens array in the first direction on the surface of the color separating lens array may be different from a width of the third nanopost of the fourth pixel corresponding region located at the first distance from the central portion of the color separating lens array in the second direction on the surface of the color separating lens array.

A width of the second nanopost of the first pixel corresponding region located at the first distance from the central portion of the color separating lens array in the first direction on the surface of the color separating lens array may be equal to a width of the second nanopost of the first pixel corresponding region located at the first distance from the central portion of the color separating lens array in the second direction on the surface of the color separating lens array, and a width of the fourth nanopost of the fourth pixel corresponding region located at the first distance from the central portion of the color separating lens array in the first direction on the surface of the color separating lens array may be equal to a width of the fourth nanopost of the fourth pixel corresponding region located at the first distance from the central portion of the color separating lens array in the second direction on the surface of the color separating lens array.

A width of the first nanopost of the first pixel corresponding region in the central portion of the color separating lens array may be equal to a width of the third nanopost of the fourth pixel corresponding region.

A width of the first nanopost of the first pixel corresponding region located at the first distance from the central portion of the color separating lens array in the first direction may be different from a width of the third nanopost of the fourth pixel corresponding region located at the first distance from the central portion of the color separating lens array in the first direction.

A width of the first nanopost of the first pixel corresponding region located at the first distance from the central portion of the color separating lens array in the second direction may be different from a width of the third nanopost of the fourth pixel corresponding region located at the first distance from the central portion of the color separating lens array in the second direction.

A width of the first nanopost of the first pixel corresponding region located at the first distance from the central portion of the color separating lens array in the first direction may be equal to a width of the third nanopost of the fourth pixel corresponding region located at the first distance from the central portion of the color separating lens array in the second direction.

The first nanoposts of the first pixel corresponding region may be arranged at an edge in the second direction in the first pixel corresponding region, and the third nanopost of the fourth pixel corresponding region may be arranged at an edge in the first direction in the fourth pixel corresponding region.

A width of the first nanopost of the first pixel corresponding region located at the first distance from the central portion of the color separating lens array in a 45-degree direction between the first direction and the second direction on the surface of the color separating lens array may be greater than a width of the first nanopost of the first pixel corresponding region located at the central portion of the color separating lens array, and a width of the third nanopost of the fourth pixel corresponding region located at the first distance from the central portion of the color separating lens array in the 45-degree direction on the surface of the color separating lens array may be greater than a width of the fourth nanopost of the fourth pixel corresponding region located at the central portion of the color separating lens array.

A width of the first nanopost of the first pixel corresponding region located at a second distance greater than the first distance from the central portion of the color separating lens array in the 45-degree direction on the surface of the color separating lens array may be greater than a width of the first nanopost of the first pixel corresponding region located at the first distance from the central portion of the color separating lens array in the 45-degree direction on the surface of the color separating lens array, and a width of the third nanopost of the fourth pixel corresponding region located at the second distance from the central portion of the color separating lens array in the 45-degree direction on the surface of the color separating lens array may be greater than a width of the third nanopost of the fourth pixel corresponding region located at the first distance from the central portion of the color separating lens array in the 45-degree direction on the surface of the color separating lens array.

A width of the second nanopost of the first pixel corresponding region located at the second distance greater than the first distance from the central portion of the color separating lens array in the 45-degree direction on the surface of the color separating lens array may be greater than a width of the second nanopost of the first pixel corresponding region located at the first distance from the central portion of the color separating lens array in the 45-degree direction on the surface of the color separating lens array, and a width of the fourth nanopost of the fourth pixel corresponding region located at the second distance from the central portion of the color separating lens array in the 45-degree direction on the surface of the color separating lens array may be greater than a width of the fourth nanopost of the fourth pixel corresponding region located at the first distance from the central portion of the color separating lens array in the 45-degree direction on the surface of the color separating lens array.

For example, a width of the first nanopost of the first pixel corresponding region located at the second distance from the central portion of the color separating lens array in the 45-degree direction on the surface of the color separating lens array may be about 5% to about 15% greater than a width of the first nanopost of the first pixel corresponding region located at the central portion of the color separating lens array.

While the azimuth angle increases from about 0 degrees to about 45 degrees, the width of the first nanopost of the first pixel corresponding region arranged at the first distance from the central portion of the color separating lens array may be fixed and the width of the third nanopost of the fourth pixel corresponding region may decrease gradually, and while the azimuth angle increases from about 45 degrees to about 90 degrees, the width of the first nanopost of the first pixel corresponding region arranged at the first distance from the central portion of the color separating lens array may increase gradually and the width of the third nanopost of the fourth pixel corresponding region may be fixed.

The nanoposts of the first pixel corresponding region and the fourth pixel corresponding region may be symmetrically arranged in an angle range of about ±45 degrees with respect to an azimuth angle of 0 degrees, 90 degrees, 180 degrees, and 270 degrees.

An arrangement of a plurality of nanoposts of the first pixel corresponding region located at a first distance from the central portion of the color separating lens array in a first direction on a surface of the color separating lens array may be different from an arrangement of a plurality of nanoposts of the first pixel corresponding region located at the first distance from the central portion of the color separating lens array in a second direction perpendicular to the first direction on the surface of the color separating lens array, and an arrangement of a plurality of nanoposts of the fourth pixel corresponding region located at the first distance from the central portion of the color separating lens array in the first direction on the surface of the color separating lens array may be different from an arrangement of a plurality of nanoposts of the fourth pixel corresponding region located at the first distance from the central portion of the color separating lens array in the second direction on the surface of the color separating lens array.

The arrangement of the plurality of nanoposts of the first pixel corresponding region located at the first distance from the central portion of the color separating lens array in the first direction on the surface of the color separating lens array may be equal to the arrangement of the plurality of nanoposts of the fourth pixel corresponding region located at the first distance from the central portion of the color separating lens array in the second direction on the surface of the color separating lens array, and the arrangement of the plurality of nanoposts of the fourth pixel corresponding region located at the first distance from the central portion of the color separating lens array in the first direction on the surface of the color separating lens array may be equal to the arrangement of the plurality of nanoposts of the first pixel corresponding region located at the first distance from the central portion of the color separating lens array in the second direction on the surface of the color separating lens array.

For example, the light of the first wavelength may be green light, the light of the second wavelength may be blue light, and the light of the third wavelength may be red light.

According to an aspect of another embodiment, an image sensor includes: a sensor substrate including a plurality of unit pixel groups, each of the plurality of unit pixel groups including a first pixel configured to sense a green light, a second pixel configured to sense a blue light, a third pixel configured to sense a red light, and a fourth pixel configured to sense the green light; and a color separating lens array including a plurality of pixel corresponding groups, each of the plurality of pixel corresponding groups including a first pixel corresponding region, a second pixel corresponding region, a third pixel corresponding region, and a fourth pixel corresponding region respectively corresponding to the first pixel, the second pixel, the third pixel, and the fourth pixel, wherein the first pixel corresponding region, the second pixel corresponding region, the third pixel corresponding region, and the fourth pixel corresponding region may be configured to change a phase of the green light in an incident light and condense the green light onto the first pixel and the fourth pixel, configured to change a phase of the blue light in the incident light and condense the blue light onto each of the second pixel, and configured to change a phase of the red light in the incident light and condense the red light onto each of the third pixel, each of the first pixel corresponding region, the second pixel corresponding region, the third pixel corresponding region, and the fourth pixel corresponding region may include a plurality of nanoposts, the plurality of pixel corresponding groups include a central group disposed in a central portion of the color separating lens array and a plurality of peripheral groups disposed outside the central portion of the color separating lens array, and the plurality of peripheral groups may include a first peripheral group and a second peripheral group, the first peripheral group and the second peripheral group having a same chief ray angle and different azimuth angles, and the first pixel corresponding region of the first peripheral group may be different from the first pixel corresponding region of the second peripheral group in at least one of a shape, a width, and an arrangement of the plurality of nanoposts and the fourth pixel corresponding region of the first peripheral group may be different from the fourth pixel corresponding region of the second peripheral group in at least one of a shape, a width, and an arrangement of the plurality of nanoposts.

The plurality of nanoposts of the first pixel corresponding region include a first nanopost and a second nanopost arranged at different positions in the first pixel corresponding region, the plurality of nanoposts of the fourth pixel corresponding region include a third nanopost and a fourth nanopost arranged at different positions in the fourth pixel corresponding region, an azimuth angle of the first peripheral group may have zero degrees from a reference line that passes through a central portion of the image sensor, and a width of the first nanopost of the first pixel corresponding region in the first peripheral group is smaller than a width of the third nanopost of the fourth pixel corresponding region in the first peripheral group.

The plurality of nanoposts of the first pixel corresponding region may include a first nanopost and a second nanopost arranged at different positions in the first pixel corresponding region, the plurality of nanoposts of the fourth pixel corresponding region may include a third nanopost and a fourth nanopost arranged at different positions in the fourth pixel corresponding region, an azimuth angle of the second peripheral group may have 90 degrees from a reference line that passes through a central portion of the image sensor, and a width of the first nanopost of the first pixel corresponding region in the second peripheral group may be greater than a width of the third nanopost of the fourth pixel corresponding region in the second peripheral group.

The plurality of nanoposts of the first pixel corresponding region may include a first nanopost and a second nanopost arranged at different positions in the first pixel corresponding region, the plurality of nanoposts of the fourth pixel corresponding region may include a third nanopost and a fourth nanopost arranged at different positions in the fourth pixel corresponding region, the plurality of peripheral groups may include a third peripheral group having the same chief ray angle as the first peripheral group and the second peripheral group and an azimuth angle different from the azimuth angles of the first peripheral group and the second peripheral group, the azimuth angle of the third peripheral group may have 45 degrees from a reference line that passes through a central portion of the image sensor, a width of the first nanopost of the first pixel corresponding region in the third peripheral group may be equal to a width of the third nanopost of the fourth pixel corresponding region in the third peripheral group, and the width of the first nanopost of the first pixel corresponding region in the third peripheral group and the width of the third nanopost of the fourth pixel corresponding region in the third peripheral group may be greater than widths of corresponding nanoposts of the central group.

According to an aspect of another embodiment, an electronic apparatus includes: an image sensor configured to convert an optical image into an electrical signal; a processor configured to control the image sensor and store and output a signal generated by the image sensor; and a lens assembly configured to direct light incident from an object to the image sensor, wherein the image sensor may include: a sensor substrate including a plurality of first pixels configured to sense light of a first wavelength, and a plurality of second pixels configured to sense light of a second wavelength different from the first wavelength; and a color separating lens array including a plurality of first pixel corresponding regions respectively corresponding to the plurality of first pixels and a plurality of second pixel corresponding regions respectively corresponding to the plurality of second pixels, wherein the plurality of first pixel corresponding regions may be configured to change a phase of the light of the first wavelength and condense the light of the first wavelength onto each of the plurality of first pixels, and the plurality of second pixel corresponding regions may be configured to change a phase of the light of the second wavelength and condense the light of the second wavelength onto each of the plurality of second pixels, each of the plurality of first pixel corresponding regions and the plurality of second pixel corresponding regions may include a plurality of nanoposts, and at least one of a shape, a width, and an arrangement of the plurality of nanoposts of the plurality of first pixel corresponding regions may be set according to a position of an azimuth angle of the plurality of nanoposts in a peripheral portion surrounding a central portion of the color separating lens array.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A to 2C illustrate various pixel arrangements of a pixel array of an image sensor;

FIG. 5A is a plan view schematically illustrating an arrangement of pixels in a pixel array.

DETAILED DESCRIPTION

Figure 1:
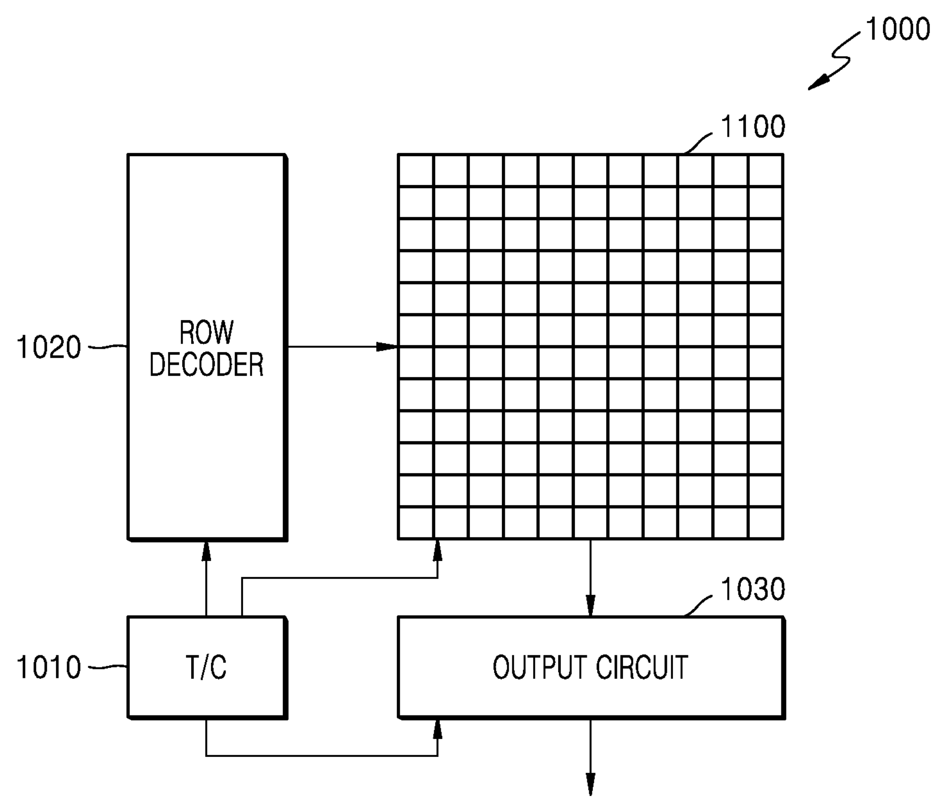
FIG. 1 is a block diagram of an image sensor according to an embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array and an electronic apparatus including the image sensor will be described in detail with reference to accompanying drawings. The described embodiments are merely examples, and various modifications may be made therein. In the drawings, like reference numerals may denote like elements, and the size of each element may be exaggerated for clarity and convenience of description.

When an element is referred to as being "on" or "over" another element, it may be directly or indirectly on or over/under/at left/right sides of the other element.

Although terms such as "first" and "second" may be used herein to describe various elements, these terms are only used to distinguish an element from another element. These terms are not intended to limit that the materials or structures of elements are different from each other.

As used herein, the singular forms "a", "an", and "the" are intended to include the plural forms as well, unless the context clearly indicates otherwise. Also, when something is referred to as "including" an element, another element may be further included unless otherwise specified.

Also, as used herein, the terms "units" and "modules" may refer to units that perform at least one function or operation, and the units may be implemented as hardware or software or a combination of hardware and software.

The use of the terms "a", "an", and "the" and other similar indicative terms may be construed to cover both the singular and the plural.

Operations of a method described herein may be performed in any suitable order unless otherwise specified. Also, example terms (e.g., "such as" and "and/or the like") used herein are merely intended to describe the technical concept of the disclosure in detail, and the scope of the disclosure is not limited by the example terms unless otherwise defined in the following claims.

FIG. 1 is a schematic block diagram of an image sensor according to an embodiment. Referring to FIG. 1, an image sensor 1000 may include a pixel array 1100, a timing controller 1010, a row decoder 1020, and an output circuit 1030. The image sensor 1000 may include a charge coupled device (CCD) image sensor or a complementary metal oxide semiconductor (CMOS) image sensor.

The pixel array 1100 may include pixels that are two-dimensionally arranged in a plurality of rows and columns. The row decoder 1020 may select one of the rows of the pixel array 1100 in response to a row address signal output from the timing controller 1010. The output circuit 1030 may output a photosensitive signal in a column unit from a plurality of pixels arranged in the selected row. For this purpose, the output circuit 1030 may include a column decoder and an analog-to-digital converter (ADC). For example, the output circuit 1030 may include a column decoder and a plurality of ADCs arranged respectively for the columns in the pixel array 1100 or one ADC arranged at an output terminal of the column decoder. The timing controller 1010, the row decoder 1020, and the output circuit 1030 may be implemented as one chip or as separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C illustrate various pixel arrangements of the pixel array 1100 of the image sensor 1000.

Figure 2A:
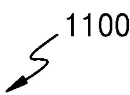

First, FIG. 2A illustrates a Bayer pattern that is generally adopted in the image sensor 1000. Referring to FIG. 2A, one unit pixel group may include four quadrant regions, and first to fourth quadrants may be a blue pixel B, a green pixel G, a red pixel R, and a green pixel G respectively. The unit pixel groups may be repeatedly and two-dimensionally arranged in a first direction (X direction) and a second direction (Y direction). In other words, two green pixels G may be arranged in one diagonal direction and one blue pixel B and one red pixel R may be arranged in another diagonal direction in a unit pixel group of a 2×2 array. In the entire pixel arrangement, a first row in which a plurality of green pixels G and a plurality of blue pixels B are alternately arranged in the first direction and a second row in which a plurality of red pixels R and a plurality of green pixels G are alternately arranged in the first direction may be repeatedly arranged in the second direction.

The pixels of the pixel array 1100 may also be arranged in various other arrangement patterns other than the Bayer pattern. For example, referring to FIG. 2B, a CYGM arrangement, in which a magenta pixel M, a cyan pixel C, a yellow pixel Y, and a green pixel G constitute one unit pixel group, may be used. Also, referring to FIG. 2C, an RGBW arrangement, in which a green pixel G, a red pixel R, a blue pixel B, and a white pixel W constitute one unit pixel group, may be used. Also, although not illustrated, the unit pixel group may have a 3×2 array form. In addition, the pixels of the pixel array 1100 may be arranged in various ways according to color characteristics of the image sensor 1000. Hereinafter, it will be described as an example that the pixel array 1100 of the image sensor 1000 has a Bayer pattern; however, the operation principles may also be applied to other patterns of pixel arrangement other than the Bayer pattern.

Figure 3A:
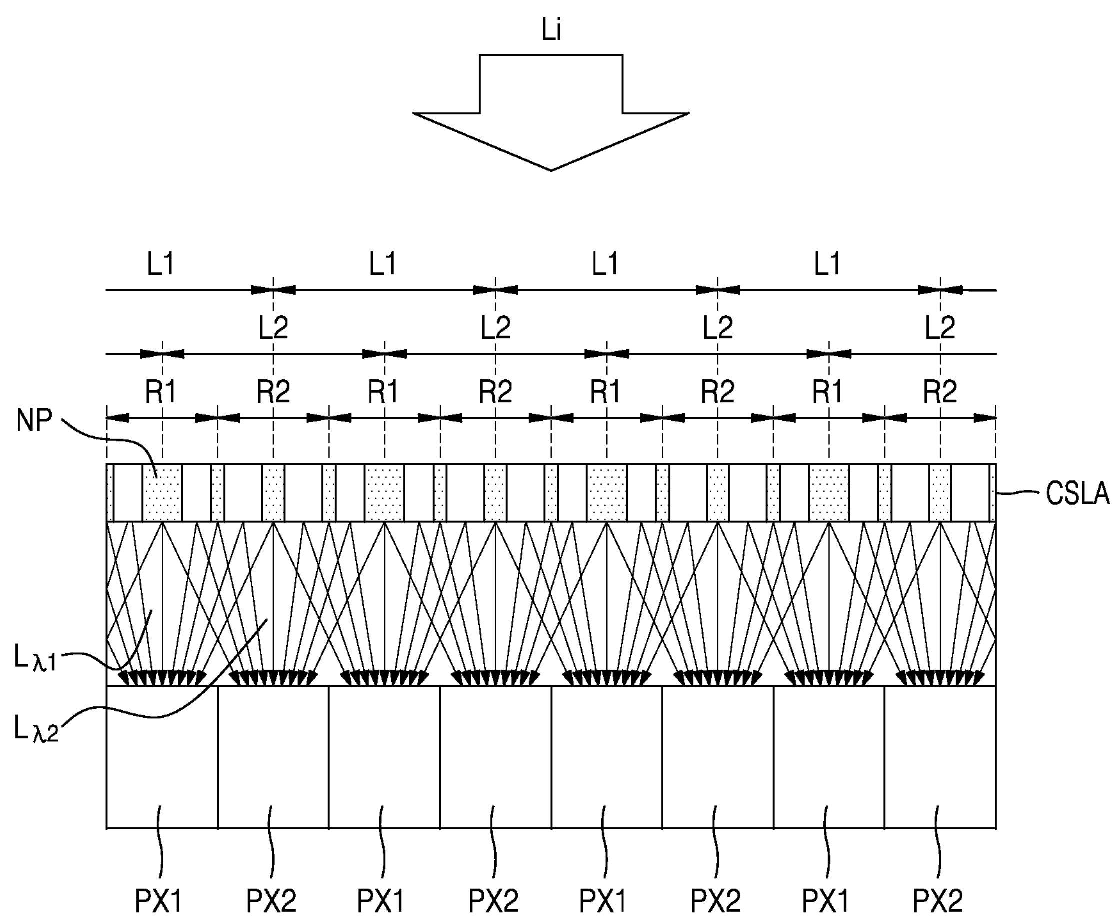
FIGS. 3A and 3B are conceptual diagrams illustrating a schematic structure and operation of a color separating lens array according to an embodiment.
Figure 3B:
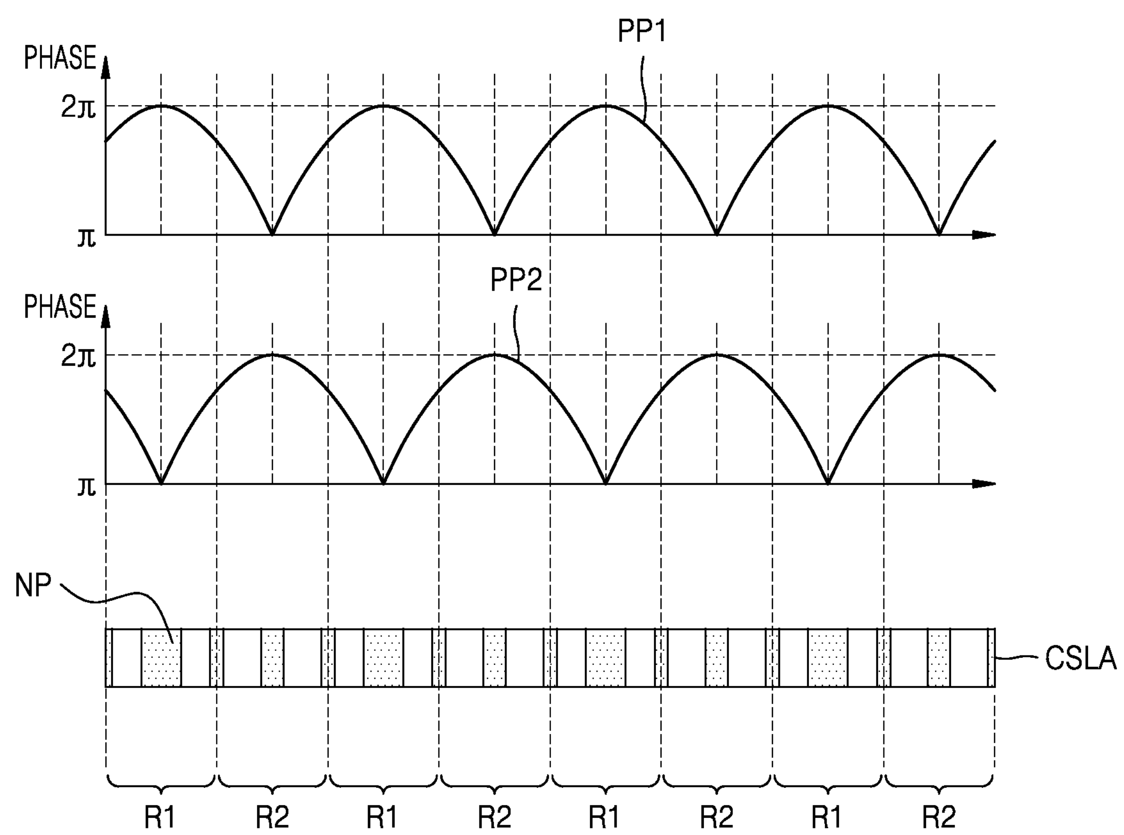

The pixel array 1100 of the image sensor 1000 may include a color separating lens array condensing light of a color corresponding to a particular pixel. FIGS. 3A and 3B are conceptual diagrams illustrating a schematic structure and operation of a color separating lens array.

Referring to FIG. 3A, a color separating lens array CSLA may include a plurality of nanoposts NP that change a phase of incident light Li differently according to incident positions thereof. The color separating lens array CSLA may be partitioned in various ways. For example, the color separating lens array CSLA may be partitioned into a first pixel corresponding region R1 corresponding to or being aligned with a first pixel PX1 on which first wavelength light $L_{\lambda 1}$ included in the incident light Li is condensed, and a second pixel corresponding region R2 corresponding to or being aligned with a second pixel PX2 on which second wavelength light $L_{\lambda 2}$ included in the incident light Li is condensed. Each of the first and the second pixels corresponding regions R1 and R2 may include one or more nanoposts NP, and the first and the second pixels corresponding regions R1 and R2 may respectively face the first and the second pixels PX1 and PX2. As another example, the color separating lens array CSLA may be partitioned into a first wavelength light condensing region L1 for condensing the first wavelength light $L_{\lambda 1}$ onto the first pixel PX1 and a second wavelength light condensing region L2 for condensing the second wavelength light $L_{\lambda 2}$ onto the second pixel PX2. The first wavelength light condensing region L1 and the second wavelength light condensing region L2 may partially overlap each other.

The color separating lens array CSLA may generate different phase profiles of the first wavelength light $L_{\lambda 1}$ and the second wavelength light $L_{\lambda 2}$ included in the incident light Li such that the first wavelength light $L_{\lambda 1}$ may be condensed onto the first pixel PX1 and the second wavelength light $L_{\lambda 2}$ may be condensed onto the second pixel PX2.

For example, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, that is, on a lower surface of the color separating lens array CSLA, such that the first wavelength light $L_{\lambda 1}$ and the second wavelength light $L_{\lambda 2}$ may be respectively condensed on the first pixel PX1 and the second pixel PX2 corresponding thereto. Particularly, the first wavelength light $L_{\lambda 1}$ having passed through the color separating lens array CSLA may have the first phase profile PP1 that is greatest at the center of the first pixel corresponding region R1 and decreases away from the center of the first pixel corresponding region R1, that is, toward the second pixel corresponding regions R2. This phase profile may be similar to a phase profile of light converging on one point after passing through a convex lens, for example, a micro-lens having a convex center in the first wavelength light condensing region L1, and the first wavelength light $L_{\lambda 1}$ may be condensed onto the first pixel PX1. Also, the second wavelength light $L_{\lambda 2}$ having passed through the color separating lens array CSLA may have the second phase profile PP2 that is greatest at the center of the second pixel corresponding region R2 and decreases away from the center of the second pixel corresponding region R2, that is, toward the first pixel corresponding regions R1, and thus, the second wavelength light $L_{\lambda 2}$ may be condensed onto the second pixel PX2.

Because the refractive index of a material varies depending on the wavelength of light, the color separating lens array CSLA may provide different phase profiles with respect to the first and second wavelength light $L_{\lambda 1}$ and $L_{\lambda 2}$ as illustrated in FIG. 3B. In other words, because the same material has a different refractive index according to the wavelength of light reacting with the material and a phase delay of the light having passed through the material is different according to the wavelength, the phase profile may vary depending on the wavelength. For example, because the refractive index of the first pixel corresponding region R1 with respect to the first wavelength light $L_{\lambda 1}$ and the refractive index of the first pixel corresponding region R1 with respect to the second wavelength light $L_{\lambda 2}$ may be different from each other and the phase delay of the first wavelength light $L_{\lambda 1}$ having passed through the first pixel corresponding region R1 and the phase delay of the second wavelength light $L_{\lambda 2}$ having passed through the first pixel corresponding region R1 may be different from each other, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters such as the shape of the nanoposts NP, sizes (width and height), an interval between the nanoposts NP, and the arrangement form thereof, and these parameters may be determined according to a phase profile to be implemented by the color separating lens array CSLA.

A rule in which the nanoposts NP are arranged in the first pixel corresponding region R1 and a rule in which the nanoposts NP are arranged in the second pixel corresponding region R2 may be different from each other. In other words, the sizes, shapes, intervals, and/or arrangement of the nanoposts NP in the first pixel corresponding region R1 may be different from the sizes, shapes, intervals, and/or arrangement of the nanoposts NP in the second pixel corresponding region R2.

A cross-sectional diameter of the nanoposts NP may have a sub-wavelength dimension. Here, the sub-wavelength may refer to a wavelength that is less than a wavelength band of light to be branched. The nanoposts NP may have a dimension that is less than a shorter wavelength among the first wavelength and the second wavelength. When the incident light Li is visible light, the cross-sectional diameter of the nanoposts NP may be less than, for example, 400 nm, 300 nm, or 200 nm. Moreover, the height of the nanoposts NP may be about 500 nm to about 1,500 nm and may be greater than the cross-sectional diameter. Although not illustrated, the nanoposts NP may be obtained by combining two or more posts stacked in a third direction, that is, a height direction (Z direction).

The nanoposts NP may include a material having a higher refractive index than a peripheral material. For example, the nanoposts NP may include c-Si, p-Si, a-Si, a Group III-V compound semiconductor (GaP, GaN, GaAs, or the like), SiC, $TiO_2$, SiN, or any combination thereof. The nanoposts NP having a different refractive index than the peripheral material may change the phase of light passing through the nanoposts NP. This may be caused by a phase delay that occurs due to the shape dimension of the sub-wavelength of the nanoposts NP, and a degree at which the phase is delayed may be determined by a detailed shape dimension and/or arrangement form of the nanoposts NP. A peripheral material of the nanoposts NP may include a dielectric material having a lower refractive index than the nanoposts NP. For example, the peripheral material may include $SiO_2$ or air.

A first wavelength $\lambda$1 and a second wavelength $\lambda$2 may be in a wavelength band of infrared rays and visible rays; however, the disclosure is not limited thereto and various wavelength bands may be implemented according to the arrangement rule of arrays of the plurality of nanoposts NP. Also, it has been described as an example that two wavelengths are branched and condensed; however, the disclosure is not limited thereto and the incident light may be branched and condensed in three directions or more according to wavelengths.

Also, although it has been described as an example that the color separating lens array CSLA includes one layer, the color separating lens array CSLA may have a structure in which a plurality of layers are stacked.

Hereinafter, an example in which the color separating lens array CSLA described above is applied to the pixel array 1100 of the image sensor 1000 will be described in detail.

Figure 4A:
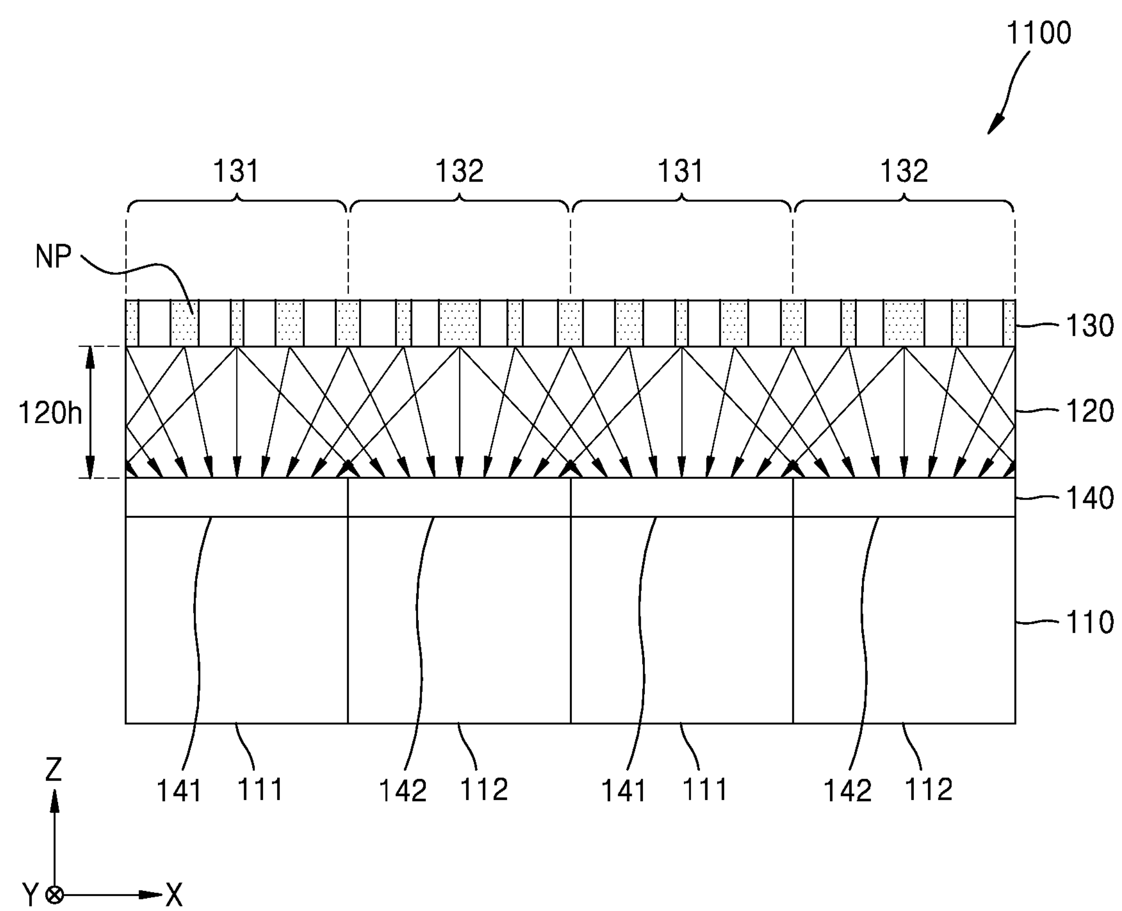
FIGS. 4A and 4B are schematic cross-sectional views illustrating different cross-sections of a pixel array of an image sensor according to an embodiment.
Figure 4B:
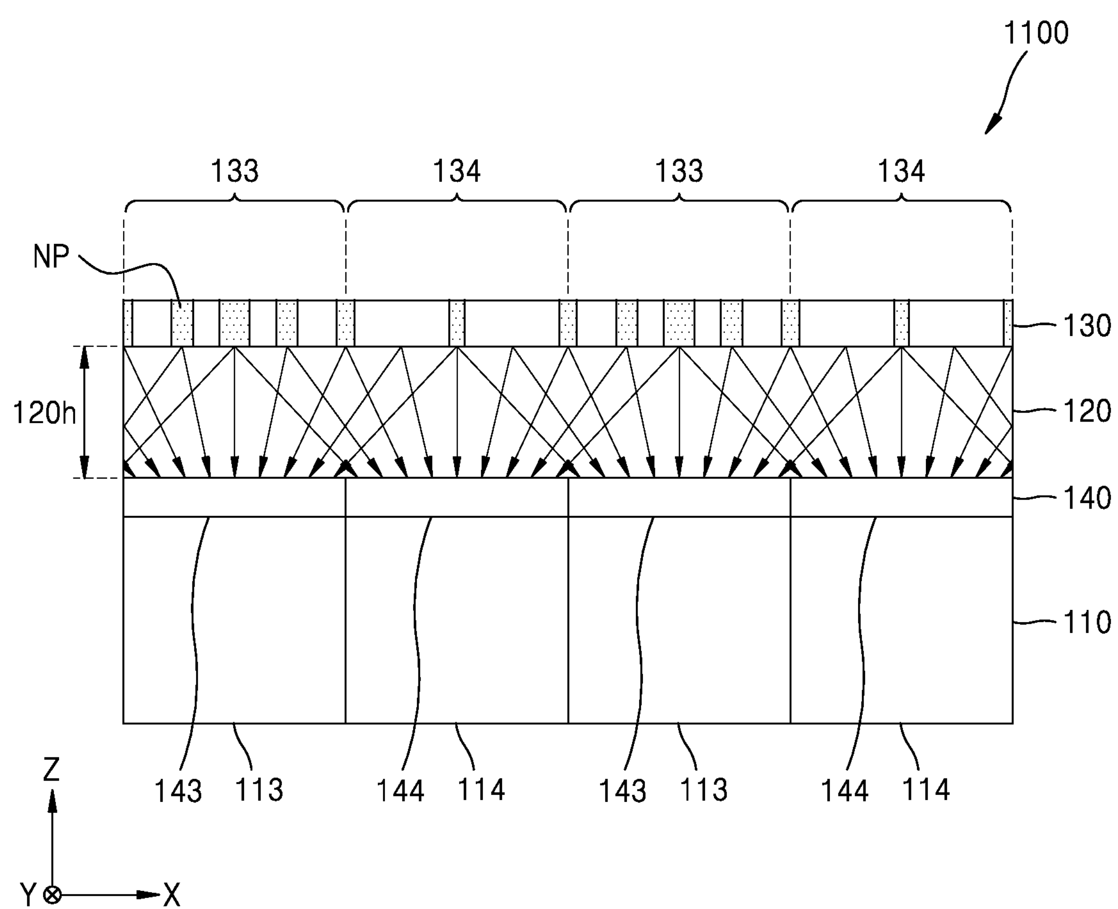
Figure 5B:
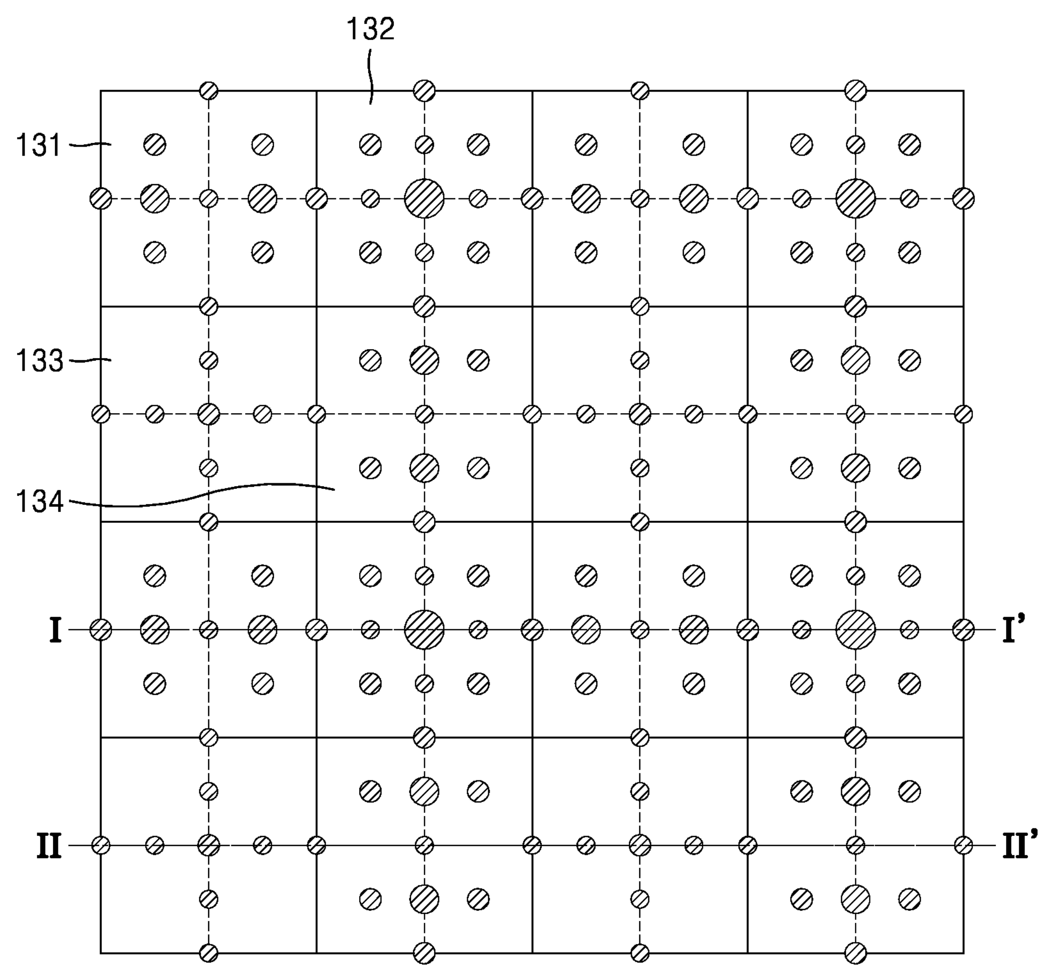
FIG. 5B is a plan view illustrating a form in which a plurality of nanoposts are arranged in a plurality of regions of a color separating lens array.

FIGS. 4A and 4B are schematic cross-sectional views illustrating different cross-sections of the pixel array 1100 of the image sensor 1000 according to an embodiment, FIG. 5A is a plan view schematically illustrating an arrangement of pixels in the pixel array 1100 of the image sensor 1000, and FIG. 5B is a plan view illustrating a form in which a plurality of nanoposts are arranged in a plurality of regions of a color separating lens array.

Referring to FIGS. 4A and 4B, the pixel array 1100 of the image sensor 1000 may include a sensor substrate 110 including a plurality of pixels 111, 112, 113, and 114 for sensing light, a transparent spacer layer 120 arranged on the sensor substrate 110, and a color separating lens array 130 arranged on the spacer layer 120. The sensor substrate 110 may include a first pixel 111, a second pixel 112, a third pixel 113, and a fourth pixel 114 that convert light into an electrical signal. As illustrated in FIG. 4A, the first pixel 111 and the second pixel 112 may be alternately arranged in the first direction (X direction). In a cross-section in which positions in the Y direction are different with respect to the first pixel 111 and the second pixel 112, the third pixel 113 and the fourth pixel 114 may be alternately arranged as illustrated in FIG. 4B. Although not illustrated, a pixel separation layer for separating the pixels may be further formed at the boundary between the pixels.

Figure 2A:
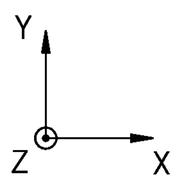

FIG. 5A illustrates an arrangement of pixels when the pixel array 1100 of the image sensor 1000 has a Bayer pattern arrangement as illustrated in FIG. 2. This arrangement may be for sensing incident light by dividing the incident light with a unit pixel group such as a Bayer pattern. Referring to FIG. 5A, the sensor substrate 110 may include a plurality of two-dimensionally arranged unit pixel groups (e.g., four unit pixel groups as illustrated in FIG. 5A). Each of the plurality of unit pixel groups may include the first pixel 111, the second pixel 112, the third pixel 113, and the fourth pixel 114. For example, the first pixel 111 and the fourth pixel 114 may be green pixels sensing green light, the second pixel 112 may be a blue pixel sensing blue light, and the third pixel 113 may be a red pixel sensing red light. The first pixel 111 and the fourth pixel 114 that are green pixels may be arranged in one diagonal direction in a unit pixel group of a 2×2 array form, and the second pixel 112 and the third pixel 113 that are respectively a blue pixel and a red pixel may be arranged in the other diagonal direction.

Also, the pixel array 1100 of the image sensor 1000 may further include a color filter array 140 arranged between the sensor substrate 110 and the spacer layer 120. In this case, the color filter array 140 may be arranged on the sensor substrate 110, and the spacer layer 120 may be arranged on the color filter array 140. The color filter array 140 may include a first color filter 141 arranged on the first pixel 111, a second color filter 142 arranged on the second pixel 112, a third color filter 143 arranged on the third pixel 113, and a fourth color filter 144 arranged on the fourth pixel 114. For example, the first color filter 141 and the fourth color filter 144 may be green color filters transmitting only green light, the second color filter 142 may be a blue color filter transmitting only blue light, and the third color filter 143 may be a red color filter transmitting only red light. Because the light that has already been color-separated to a considerable degree by the color separating lens array 130 propagates toward the first to fourth pixels 111, 112, 113, and 114, a light loss may be low even when the color filter array 140 is used. When the color filter array 140 is used, the color purity of the image sensor 1000 may be further improved. However, the color filter array 140 is not essential, and when the color separation efficiency of the color separating lens array 130 is sufficiently high, the color filter array 140 may be omitted.

The spacer layer 120 may be arranged between the sensor substrate 110 and the color separating lens array 130 to maintain a constant distance between the sensor substrate 110 and the color separating lens array 130. The spacer layer 120 may include a material transparent with respect to visible light, for example, a dielectric material such as $SiO_2$ or siloxane-based spin on glass (SOG) having a lower refractive index than the nanoposts NP and having a low absorptance in the visible light band. A thickness 120*h* of the spacer layer 120 may be determined based on a focal distance of light condensed by the color separating lens array 130 and may be, for example, about ½ to about 1.5 of a focal distance of light of a reference wavelength $\lambda_0$. When a refractive index of the spacer layer 120 with respect to the reference wavelength $\lambda_0$ is n and a pitch between pixels is p, a focal distance f of the light of the reference wavelength $\lambda_0$ condensed by the color separating lens array 130 may be expressed as Equation 1 below.

$$f = \frac{np^2}{\lambda_0} - \frac{\lambda_0}{4n} \quad \text{[Equation 1]}$$

Assuming that the reference wavelength $\lambda_0$ is 540 nm as green light, the pitch between the pixels 111, 112, 113, and 114 is 0.8 μm and the refractive index n of the spacer layer 120 at the wavelength of 540 nm is 1.46, the focal distance f of the green light, that is, the distance between a lower surface of the color separating lens array 130 and a point where the green light converges, may be about 1.64 μm and the thickness 120*h* of the spacer layer 120 may be about 0.82 μm to about 2.46 μm.

The color separating lens array 130 may include nanoposts NP supported by the spacer layer 120 and changing the phase of the incident light, and a dielectric material such as air or $SiO_2$ arranged between the nanoposts NP and having a lower refractive index than the nanoposts NP.

Referring to FIG. 5B, the color separating lens array 130 may be partitioned into four pixel corresponding regions 131, 132, 133, and 134 corresponding to the respective pixels 111, 112, 113, and 114 of FIG. 5A. For example, the first pixel corresponding region 131 may correspond to the first pixel 111 and may be arranged over the first pixel 111 in the vertical direction, the second pixel corresponding region 132 may correspond to the second pixel 112 and may be arranged over the second pixel 112 in the vertical direction, the third pixel corresponding region 133 may correspond to the third pixel 113 and may be arranged over the third pixel 113 in the vertical direction, and the fourth pixel corresponding region 134 may correspond to the fourth pixel 114 and may be arranged over the fourth pixel 114 in the vertical direction. That is, the first to fourth pixel corresponding regions 131, 132, 133, and 134 of the color separating lens array 130 may be arranged to face the corresponding first to fourth pixels 111, 112, 113 and 114 of the sensor substrate 110 in the vertical direction.

The first to fourth pixel corresponding regions 131, 132, 133, and 134 may be two-dimensionally arranged in the first direction (X direction) and the second direction (Y direction) such that a first row in which the first pixel corresponding region 131 and the second pixel corresponding region 132 are alternately arranged and a second row in which the third pixel corresponding region 133 and the fourth pixel corresponding regions 134 are alternately arranged may be alternately repeated. Also, the first pixel corresponding region 131 and the fourth pixel corresponding region 134 may be arranged adjacent to each other in a first diagonal direction, and the second pixel corresponding region 132 and the third pixel corresponding region 133 may be arranged adjacent to each other in a second diagonal direction intersecting with the first diagonal direction. The color separating lens array 130 may also include a plurality of two-dimensionally arranged pixel corresponding groups like the pixel array of the sensor substrate 110, and each pixel corresponding group may include pixel corresponding regions 131, 132, 133, and 134 arranged in a 2×2 form.

Moreover, the color separating lens array 130 may be partitioned into a green light condensing region for condensing green light, a blue light condensing region for condensing blue light, and a red light condensing region for condensing red light, as in the description given with reference to FIG. 3B.

The first to fourth pixel corresponding regions 131, 132, 133, and 134 of the color separating lens array 130 may include nanoposts NP having sizes, shapes, intervals, and/or arrangements determined such that green light may be branched and condensed onto the first and fourth pixels 111 and 114, blue light may be branched and condensed onto the second pixel 112, and red light may be branched and condensed onto the third pixel 113. Moreover, the thickness of the color separating lens array 130 in the third direction (Z direction) may be similar to the height of the nanopost NP and may be about 500 nm to about 1500 nm.

Referring to FIG. 5B, the first to fourth pixel corresponding regions 131, 132, 133, and 134 may include cylindrical nanoposts NP having a circular cross-section, nanoposts NP having different cross-sectional areas may be arranged at central portions of the respective regions, and nanoposts NP may also be arranged at the center on the boundary between pixels and the intersection between pixel boundaries.

Figure 5C:
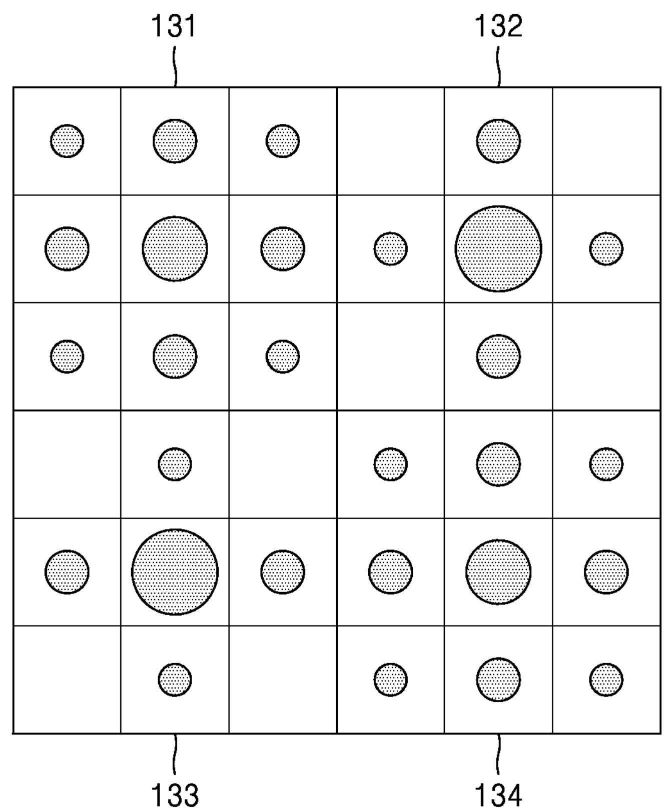
FIGS. 5C to 5F are plan views illustrating various other forms of a color separating lens array.
Figure 5D:
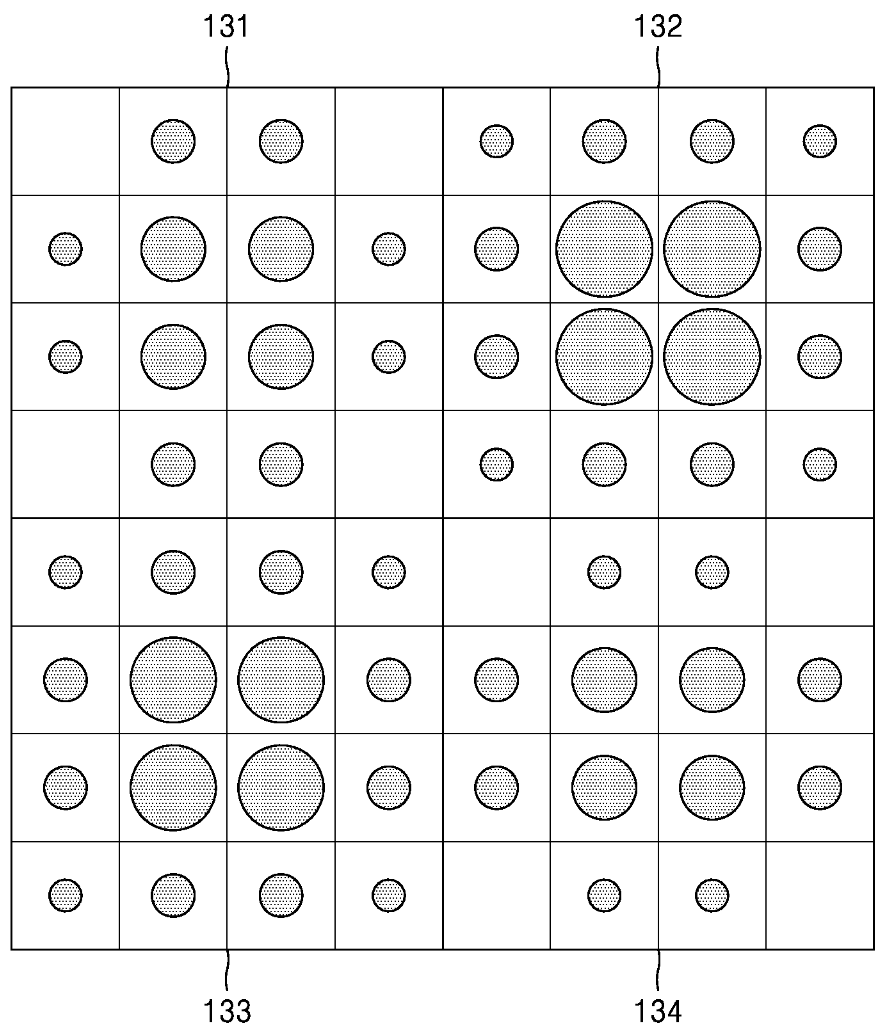

As for the arrangement of nanoposts NP, various arrangements may also be used in addition to the arrangement illustrated in FIG. 5B. For example, FIGS. 5C and 5D illustrate other arrangement forms of the nanoposts NP in the first to fourth pixel corresponding regions 131, 132, 133, and 134 of the color separating lens array 130. The arrangement principle of the nanoposts NPs described above may also be applied to the first to fourth pixel corresponding regions 131, 132, 133, and 134 of the color separating lens array 130 illustrated in FIGS. 5C and 5D.

The nanoposts NP of FIGS. 5B to 5D are illustrated as having symmetrical circular cross-sectional shapes; however, some nanoposts having asymmetrical cross-sectional shapes may be included. For example, the first and fourth pixel corresponding regions 131 and 134 may adopt nanoposts having an asymmetrical cross-sectional shape in which the widths in the first direction (X direction) and the second direction (Y direction) are different from each other, and the second and third pixel corresponding regions 132 and 133 may adopt nanoposts having a symmetrical cross-section shape in which the widths in the first direction (X direction) and the second direction (Y direction) are equal to each other. The illustrated arrangement rule of the nanoposts NP is merely an example and is not limited to the illustrated pattern.

The color separating lens array 130 illustrated in FIGS. 5B to 5D is merely an example, and various types of color separating lens arrays may be obtained through the above optimized design according to the size and thickness of the color separating lens array, the color characteristics of the image sensor to which the color separating lens array is applied, the pixel pitch, the distance between the color separating lens array and the image sensor, the incident angle of the incident light, or the like. Also, the color separating lens array may be implemented in various other patterns instead of the nanoposts. For example, FIG. 5E is a plan view illustrating a form of a pixel corresponding group of a color separating lens array according to another embodiment that may be applied to an image sensor of a Bayer pattern method, and FIG. 5F is a plan view illustrating a form of a pixel corresponding group of a color separating lens array according to another embodiment.

Figure 5E:
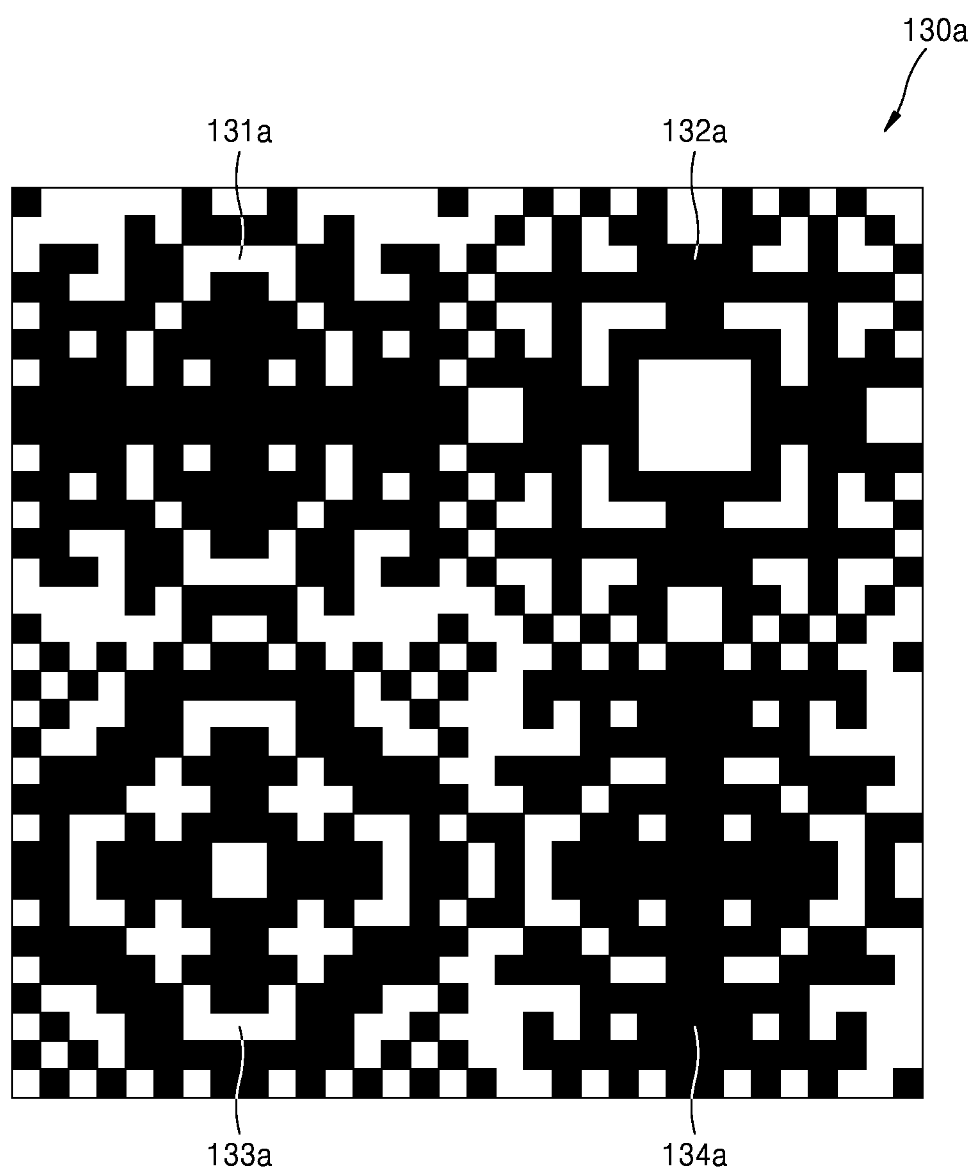
Figure 5F:
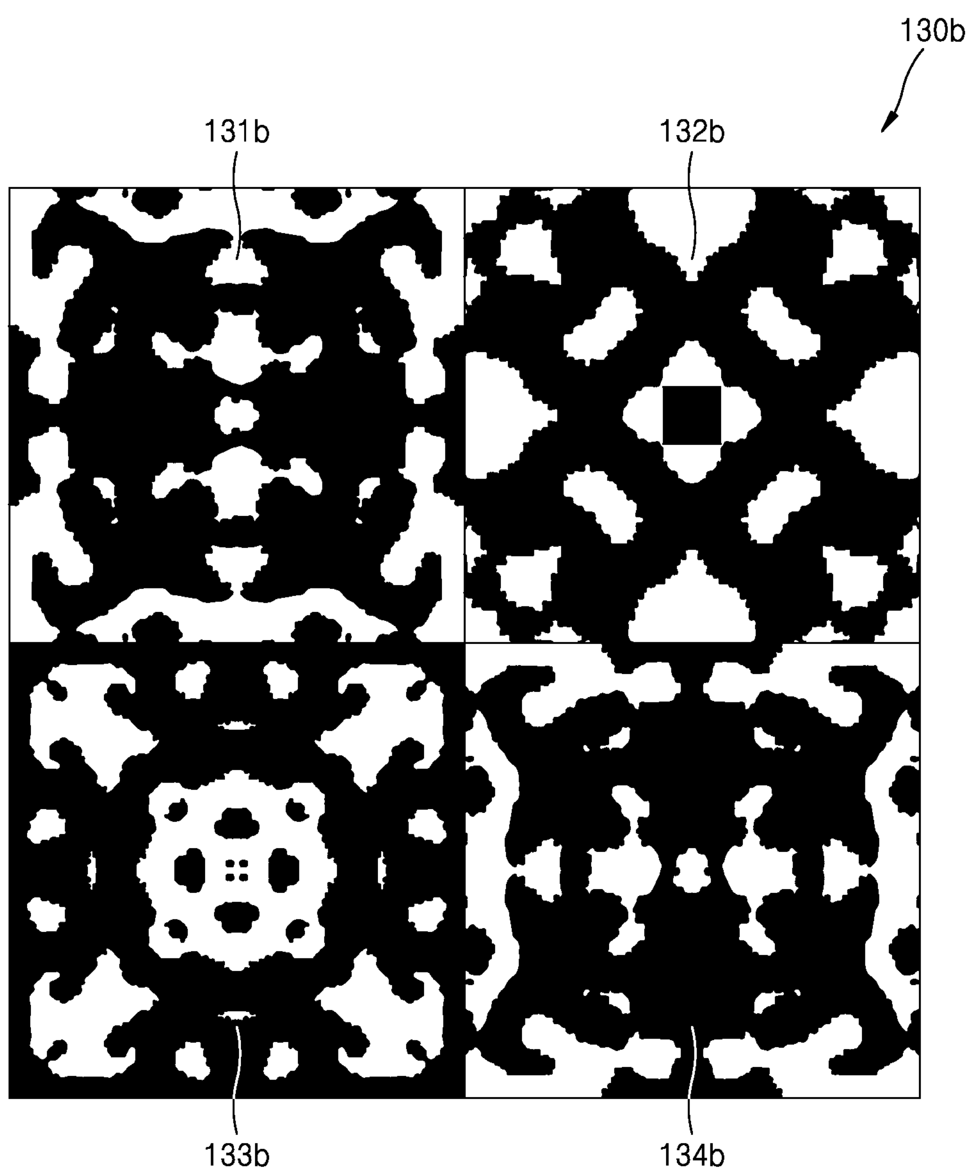

Each of first to fourth pixel corresponding regions 131*a*, 132*a*, 133*a*, and 134*a* of a color separating lens array 130*a* illustrated in FIG. 5E may be optimized in a binary form digitized in a 16×16 rectangular arrangement, and a pixel corresponding group of FIG. 5E may have a 32×32 rectangular arrangement form. Alternatively, each of first to fourth pixel corresponding regions 131*b*, 132*b*, 133*b*, and 134*b* of a color separating lens array 130*b* illustrated in FIG. 5F may be optimized in a non-digitized continuous curved form.

Figure 6A:
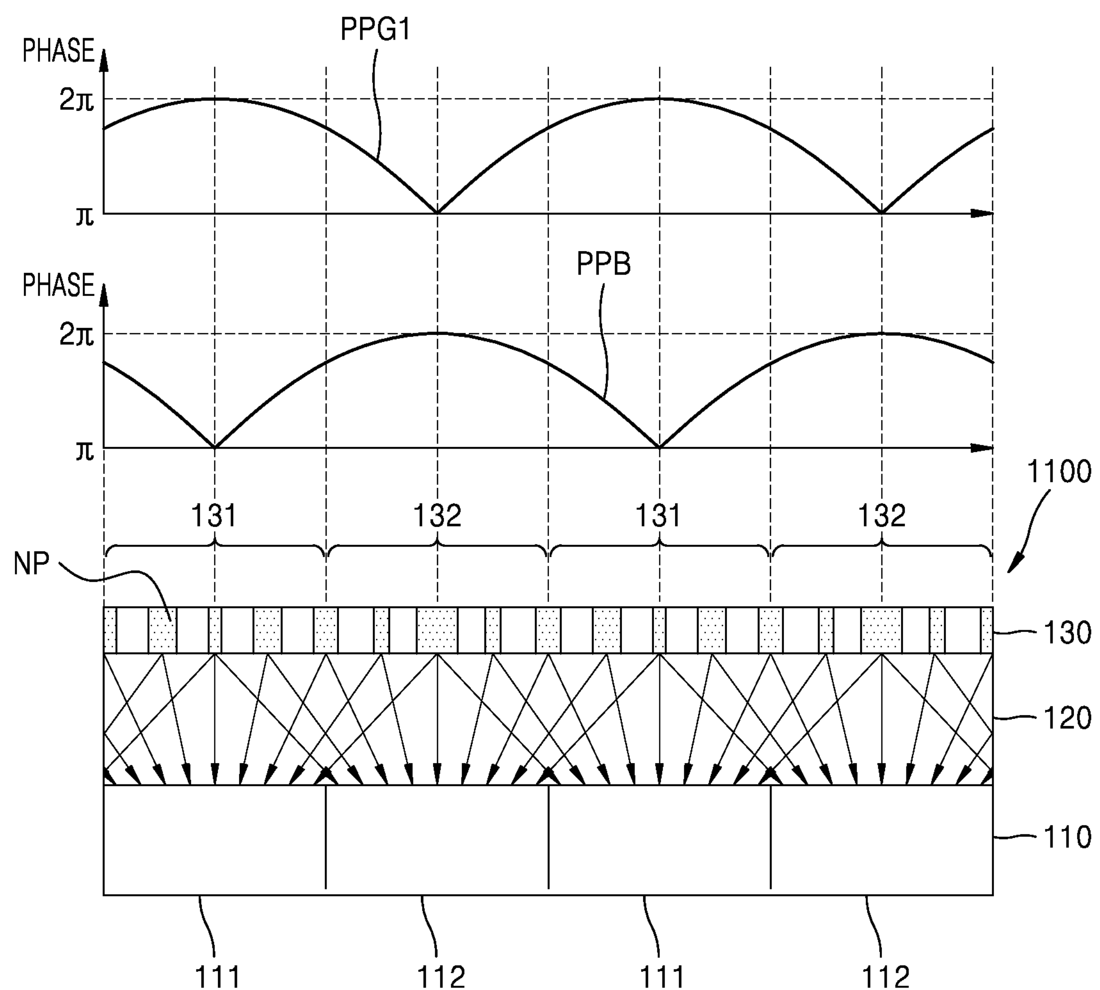
FIG. 6A is a diagram illustrating phase profiles of green light and blue light having passed through a color separating lens array, along line I-I' of FIG. 5B.
Figure 6B:
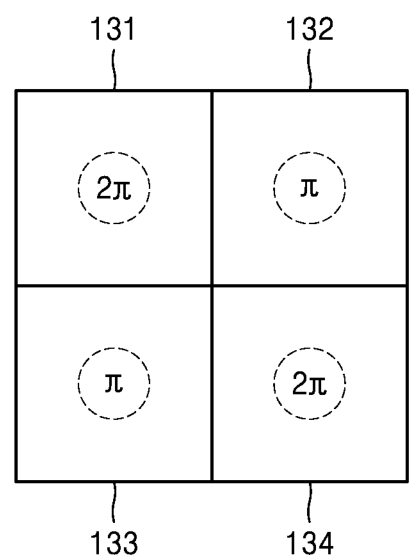
FIG. 6B is a diagram illustrating a phase of green light having passed through a color separating lens array at the center of pixel corresponding regions.
Figure 6C:
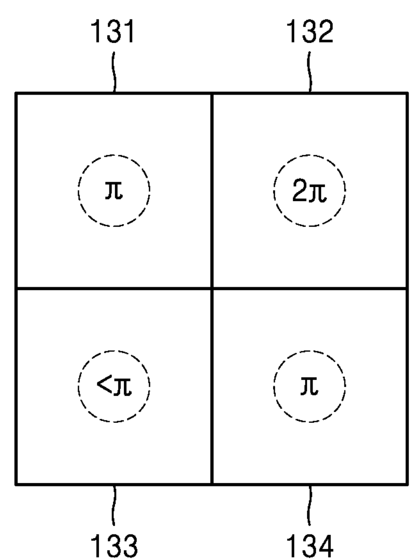
FIG. 6C is a diagram illustrating a phase of blue light having passed through a color separating lens array at the center of pixel corresponding regions.

FIG. 6A illustrates phase profiles of green light and blue light having passed through the color separating lens array 130, along line I-I' of FIG. 5B, FIG. 6B illustrates a phase of green light having passed through the color separating lens array 130 at the center of the pixel corresponding regions 131, 132, 133, and 134, and FIG. 6C illustrates a phase of blue light having passed through the color separating lens array 130 at the center of the pixel corresponding regions 131, 132, 133, and 134. In FIG. 6A, the color filter array 140 is omitted for convenience. The phase profiles of the green light and the blue light illustrated in FIG. 6A may be similar to the phase profiles of the first and second wavelength light illustrated in FIG. 3B.

Referring to FIGS. 6A and 6B, the green light having passed through the color separating lens array 130 may have a first green light phase profile PPG1 that is greatest at the center of the first pixel corresponding region 131 and decreases away from the center of the first pixel corresponding region 131. Particularly, immediately after passing through the color separating lens array 130, that is, at the lower surface of the color separating lens array 130 or the upper surface of the spacer layer 120, the phase of the green light is greatest at the center of the first pixel corresponding region 131 and decreases away from the center of the first pixel corresponding region 131 in the form of a concentric circle, and thus, the phase is smallest at the centers of the second and third pixel corresponding regions 132 and 133 in the X direction and the Y direction and is smallest at the contact point between the first pixel corresponding region 131 and the fourth pixel corresponding region 134 in the diagonal direction.

When the phase of the green light is set as $2\pi$ based on the phase of light emitted from the center of the first pixel corresponding region 131, the light having a phase of about $0.9\pi$ to about $1.1\pi$ may be emitted from the centers of the second and third pixel corresponding regions 132 and 133, and the light having a phase of about $1.1\pi$ to about $1.5\pi$ may be emitted from the contact point between the first pixel corresponding region 131 and the fourth pixel corresponding region 134. Thus, the difference between the phase of the green light having passed through the center of the first pixel corresponding region 131 and the phase of the green light having passed through the centers of the second and third pixel corresponding regions 132 and 133 may be about $0.9\pi$ to about $1.1\pi$.

Moreover, the first green light phase profile PPG1 may not mean that the phase delay amount of the light having passed through the center of the first pixel corresponding region 131 is greatest, and when the phase of the light having passed through the first pixel corresponding region 131 is set as $2\pi$ and a phase delay of the light having passed through another point is greater and has a phase value of $2\pi$ or more, the first green light phase profile PPG1 may be a value remaining after subtracting $2n\pi$, that is, a wrapped phase profile. For example, when the phase of light having passed through the first pixel corresponding region 131 is $2\pi$ and the phase of light having passed through the center of the second pixel corresponding region 132 is $3\pi$, the phase in the second pixel corresponding region 132 may be $\pi$ remaining after subtracting $2\pi$ (n=1) from $3\pi$.

Referring to FIGS. 6A and 6C, the blue light having passed through the color separating lens array 130 may have a blue light phase profile PPB that is greatest at the center of the second pixel corresponding region 132 and decreases as the distance from the center of the second pixel corresponding region 132 increases. Particularly, immediately after passing through the color separating lens array 130, the phase of the blue light is greatest at the center of the second pixel corresponding region 132 and decreases as the distance from the center of the second pixel corresponding region 132 in the form of a concentric circle increases, and thus, the phase is smallest at the centers of the first and fourth pixel corresponding regions 131 and 134 in the X direction and the Y direction and is smallest at the center of the third pixel corresponding region 133 in the diagonal direction. When the phase of the blue light at the center of the second pixel corresponding region 132 is $2\pi$, the phase at the centers of the first and fourth pixel corresponding regions 131 and 134 may be, for example, about $0.9\pi$ to about $1.1\pi$ and the phase at the center of the third pixel corresponding region 133 may be smaller than the phase at the centers of the first and fourth pixel corresponding regions 131 and 134, for example, about $0.5\pi$ to about $0.9\pi$.

Figure 6D:
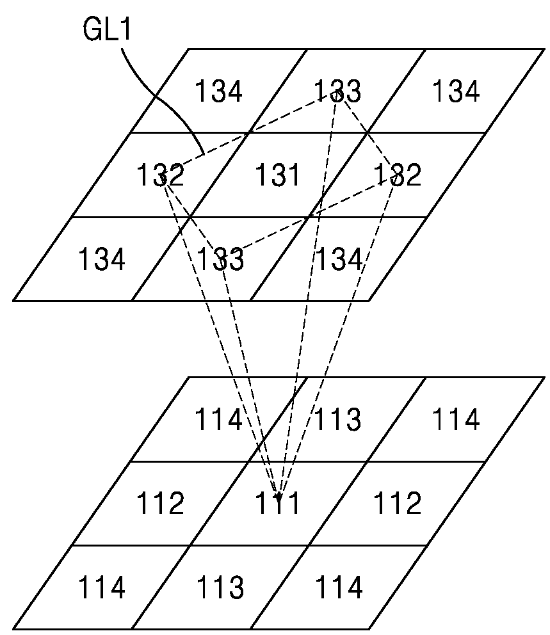
FIG. 6D is a diagram illustrating a propagation direction of green light incident on a first green light condensing region.
Figure 6E:
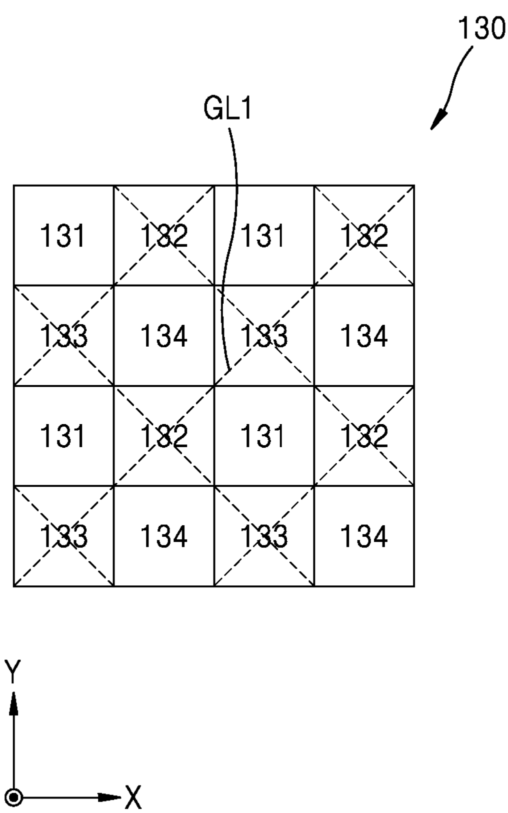
FIG. 6E is a diagram illustrating an array of the first green light condensing region.

FIG. 6D illustrates a propagation direction of green light incident on a first light condensing region, and FIG. 6E illustrates an array of the first green light condensing region.

As illustrated in FIG. 6D, the green light incident on the vicinity of the first pixel corresponding region 131 is condensed onto the first pixel 111 by the color separating lens array 130, and the green light from the second and third pixel corresponding regions 132 and 133, in addition to the first pixel corresponding region 131, is also incident on the first pixel 111. That is, according to the phase profile of the green light described with reference to FIGS. 6A and 6B, the green light having passed through a first green light condensing region GL1 obtained by connecting the centers of two second pixel corresponding regions 132 and two third pixel corresponding regions 133 adjacent to the first pixel corresponding region 131 with one side facing thereto is condensed onto the first pixel 111. Thus, as illustrated in FIG. 6E, the color separating lens array 130 may operate as a first green light condensing region (GL1) array for condensing the green light onto the first pixel 111. The first green light condensing region GL1 may have a greater area than the first pixel 111 corresponding thereto and may be, for example, about 1.2 times to about 2 times greater.

Figure 6F:
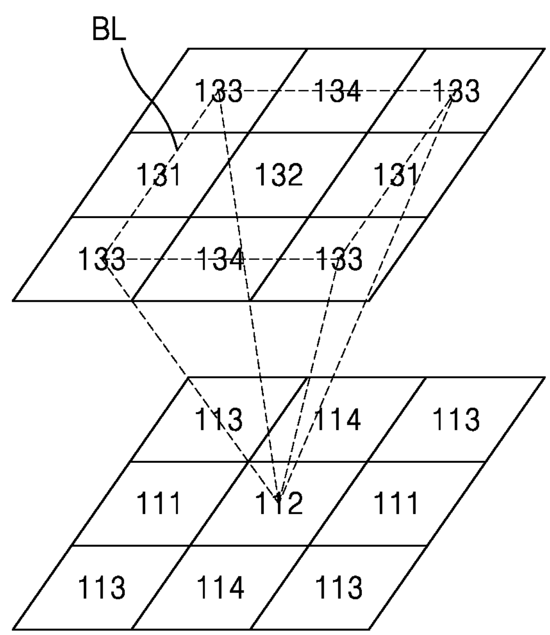
FIG. 6F is a diagram illustrating a propagation direction of blue light incident on a blue light condensing region.
Figure 6G:
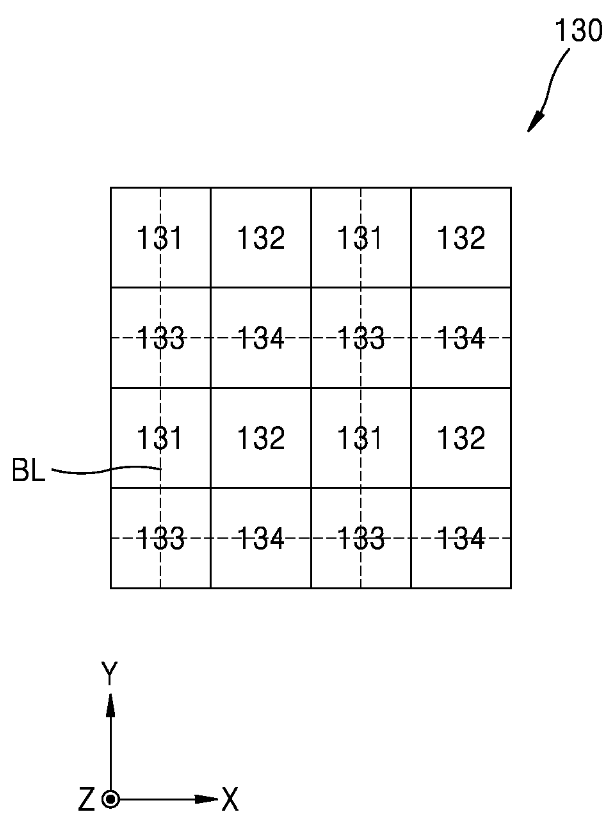
FIG. 6G is a diagram illustrating an array of a blue light condensing region.

FIG. 6F illustrates a propagation direction of blue light incident on a blue light condensing region, and FIG. 6G illustrates an array of the blue light condensing region.

The blue light is condensed onto the second pixel 112 by the color separating lens array 130 as illustrated in FIG. 6F, and the blue light from the pixel corresponding regions 131,

132, 133, and 134 is incident on the second pixel 112. In the phase profile of the blue light described with reference to FIGS. 6A and 6C, the blue light having passed through a blue light condensing region BL obtained by connecting the centers of four third pixel corresponding regions 133 adjacent to the second pixel corresponding region 132 with apexes facing each other is condensed onto the second pixel 112. Thus, as illustrated in FIG. 6G, the color separating lens array 130 may operate as a blue light condensing region (BL) array for condensing the blue light onto the second pixel 112. The blue light condensing region BL may have a greater area than the second pixel 112 corresponding thereto and may be, for example, about 1.5 times to about 4 times greater. The blue light condensing region BL may partially overlap the first green light condensing region GL1 described above and a second green light condensing region GL2 and a red light condensing region RL described below.

Figure 7A:
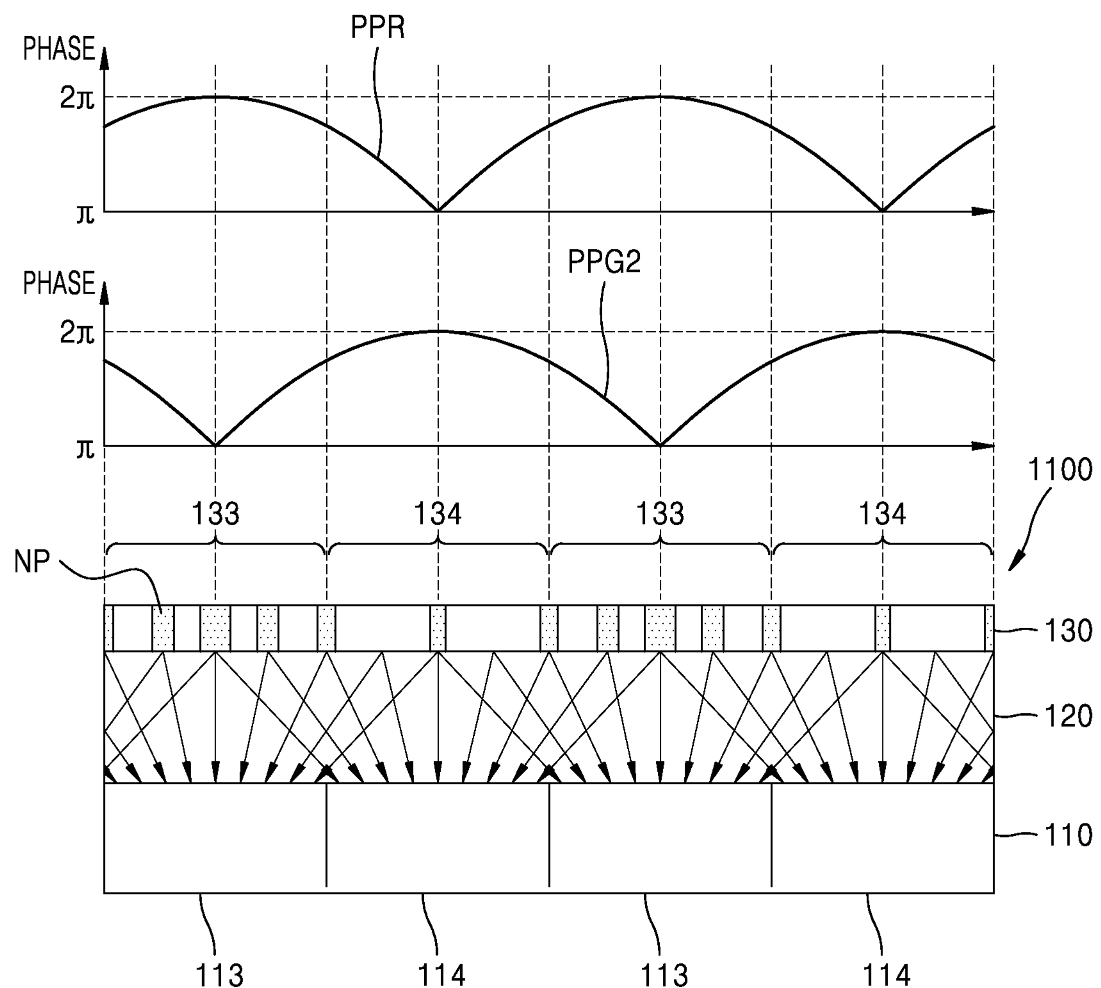
FIG. 7A is a diagram illustrating phase profiles of red light and green light having passed through a color separating lens array, along line II-II' of FIG. 5B.
Figure 7B:
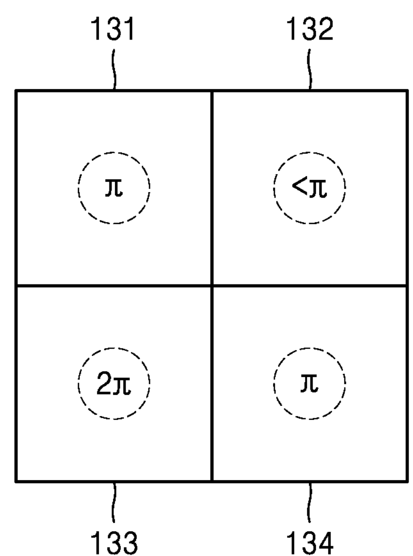
FIG. 7B is a diagram illustrating a phase of red light having passed through a color separating lens array at the center of pixel corresponding regions.
Figure 7C:
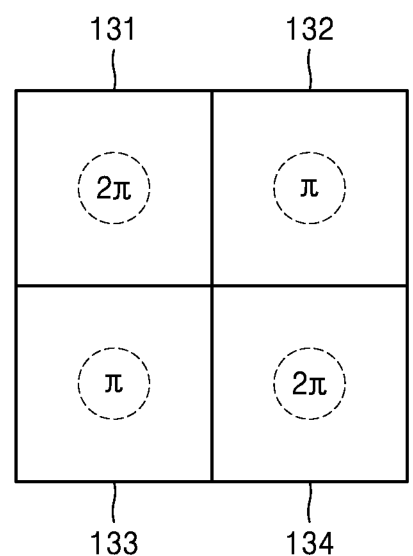
FIG. 7C is a diagram illustrating a phase of green light having passed through a color separating lens array at the center of pixel corresponding regions.

FIG. 7A illustrates phase profiles of red light and green light having passed through the color separating lens array 130, along line II-II' of FIG. 5B, FIG. 7B illustrates a phase of red light having passed through the color separating lens array 130 at the center of the pixel corresponding regions 131, 132, 133, and 134, and FIG. 7C illustrates a phase of green light having passed through the color separating lens array 130 at the center of the pixel corresponding regions 131, 132, 133, and 134.

Referring to FIGS. 7A and 7C, the red light having passed through the color separating lens array 130 may have a red light phase profile PPR that is greatest at the center of the third pixel corresponding region 133 and decreases as the distance from the center of the third pixel corresponding region 133 increases. Particularly, immediately after passing through the color separating lens array 130, the phase of the red light is greatest at the center of the third pixel corresponding region 133 and decreases away from the center of the third pixel corresponding region 133 in the form of a concentric circle, and thus, the phase is smallest at the centers of the first and fourth pixel corresponding regions 131 and 134 in the X direction and the Y direction and is smallest at the center of the second pixel corresponding region 132 in the diagonal direction. When the phase of the red light at the center of the third pixel corresponding region 133 is 2π, the phase at the centers of the first and fourth pixel corresponding regions 131 and 134 may be, for example, about 0.9π to about 1.1π and the phase at the center of the second pixel corresponding region 132 may be smaller than the phase at the centers of the first and fourth pixel corresponding regions 131 and 134, for example, about 0.6π to about 0.9π.

Referring to FIGS. 7A and 7C, the green light having passed through the color separating lens array 130 may have a second green light phase profile PPG2 that is greatest at the center of the fourth pixel corresponding region 134 and decreases as the distance from the center of the fourth pixel corresponding region 134 increases. When comparing the first green light phase profile PPG1 of FIG. 6A with the second green light phase profile PPG2 of FIG. 7A, the second green light phase profile PPG2 is obtained by moving in parallel with the first green light phase profile PPG1 by one-pixel pitch in the X direction and the Y direction. That is, the first green light phase profile PPG1 has the greatest phase at the center of the first pixel corresponding region 131, whereas the second green light phase profile PPG2 has the greatest phase at the center of the fourth pixel corresponding region 134 that is apart by one-pixel pitch from the center of the first pixel corresponding region 131 in the X direction and the Y direction. The phase profiles in FIGS. 6B and 7C illustrating the phases at the centers of the pixel corresponding regions 131, 132, 133, and 134 may be equal to each other. Regarding the phase profile of the green light based on the fourth pixel corresponding region 134, when the phase of the green light emitted from the center of the fourth pixel corresponding region 134 is set as 2π, the light having a phase of about 0.9π to about 1.1π may be emitted from the centers of the second and third pixel corresponding regions 132 and 133, the light having a phase of about 2π may be emitted from the center of the first pixel corresponding regions 131, and the light having a phase of about 1.1π to about 1.5π may be emitted from the contact point between the first pixel corresponding region 131 and the fourth pixel corresponding region 134.

Figure 7D:
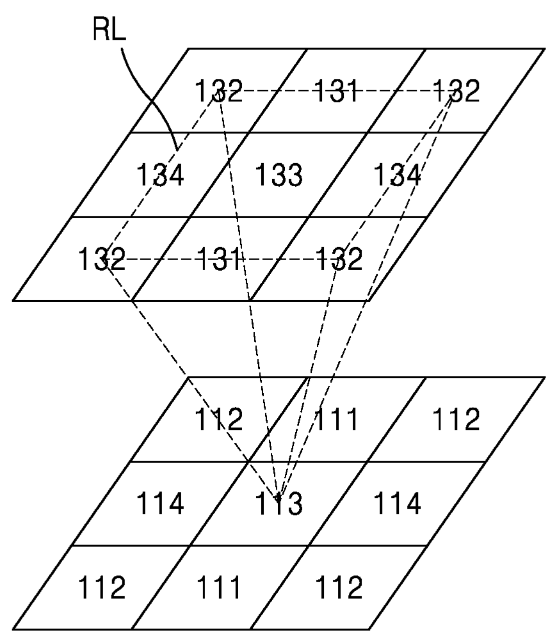
FIG. 7D is a diagram illustrating a propagation direction of red light incident on a red light condensing region.
Figure 7E:
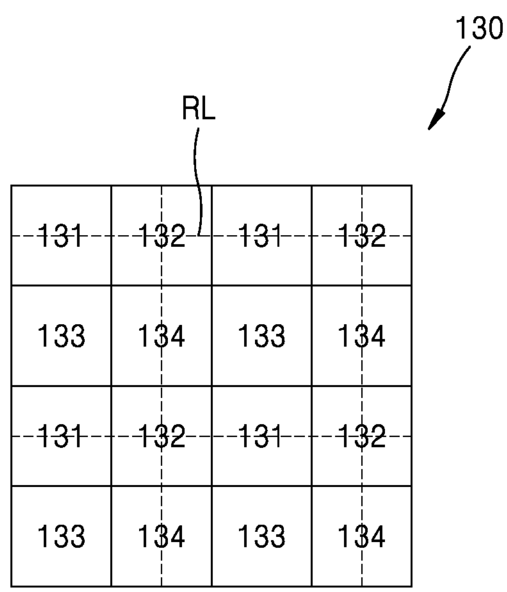
FIG. 7E is a diagram illustrating an array of a red light condensing region.

FIG. 7D illustrates a propagation direction of red light incident on a red light condensing region, and FIG. 7E illustrates an array of the red light condensing region.

The red light is condensed onto the third pixel 113 by the color separating lens array 130 as illustrated in FIG. 7D, and the red light from the pixel corresponding regions 131, 132, 133, and 134 is incident on the third pixel 113. In the phase profile of the red light described with reference to FIGS. 7A and 7B, the red light having passed through a red light condensing region RL obtained by connecting the centers of four second pixel corresponding regions 132 adjacent to the third pixel corresponding region 133 with apexes facing each other is condensed onto the third pixel 113. Thus, as illustrated in FIG. 7E, the color separating lens array 130 may operate as a red light condensing region (RL) array for condensing the red light onto the third pixel 113. The red light condensing region RL may have a greater area than the third pixel 113 corresponding thereto and may be, for example, about 1.5 times to about 4 times greater. The red light condensing region RL may partially overlap the first and second green light condensing regions GL1 and GL2 and the blue light condensing region BL.

Figure 7F:
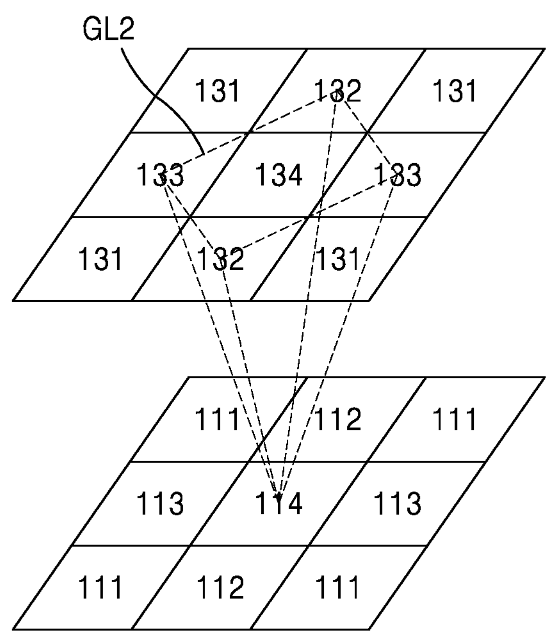
FIG. 7F is a diagram illustrating a propagation direction of green light incident on a second green light condensing region.
Figure 7G:
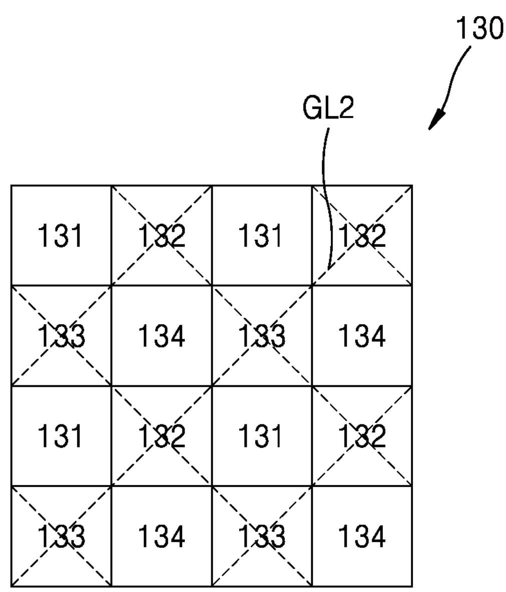
FIG. 7G is a diagram illustrating an array of a second green light condensing region.

Referring to FIGS. 7F and 7G, the green light incident on the vicinity of the fourth pixel corresponding region 134 propagates similarly to the green light incident on the vicinity of the first pixel corresponding region 131, and as illustrated in FIG. 7F, the green light is condensed onto the fourth pixel 114. Thus, as illustrated in FIG. 7G, the color separating lens array 130 may operate as a second green light condensing region (GL2) array for condensing the green light onto the fourth pixel 114. The second green light condensing region GL2 may have a greater area than the fourth pixel 114 corresponding thereto and may be, for example, about 1.2 times to about 2 times greater.

The color separating lens array 130 satisfying the phase profile and performance described above may be automatically designed through various types of computer simulations. For example, the structures of the pixel corresponding regions 131, 132, 133, and 134 may be optimized through a nature-inspired algorithm such as a genetic algorithm, a particle swarm optimization algorithm, or an ant colony optimization algorithm or through a reverse design method based on an adjoint optimization algorithm.

For designing the color separating lens array 130, the structures of the green, blue, red, and infrared pixel corresponding regions may be optimized while evaluating the performances of a plurality of candidate color separating lens arrays based on evaluation factors such as color separation spectrum, optical efficiency, and signal-to-noise ratio. For example, the structures of the green, blue, red, and infrared pixel corresponding regions may be optimized in a manner that a target numerical value of each evaluation factor is determined in advance and the sum of the differences from the target numerical values of a plurality of evaluation factors is minimized. Alternatively, the performance may be indexed for each evaluation factor, and the structures of the green, blue, red, and infrared pixel corresponding regions may be optimized such that a value representing the performance may be maximized.

Moreover, the incident angle of light incident on the image sensor 1000 may be typically defined as a chief ray angle (CRA). A chief ray may refer to a ray incident on the image sensor 1000 from one point of an object through the center of an objective lens. The chief ray angle may refer to an angle formed by the chief ray with the optical axis of the objective lens and may be generally equal to the incident angle of the chief ray incident on the image sensor 1000. For example, a chief ray of light originating from a point on the optical axis of the objective lens may be perpendicularly incident on the central portion of the image sensor 1000, and in this case, the chief ray angle may be 0 degrees. As the starting point is further away from the optical axis of the objective lens, the chief ray angle may increase and the chief ray may be incident on the edge of the image sensor 1000. From the viewpoint of the image sensor 1000, the chief ray angle of the light incident on the central portion of the image sensor 1000 may be 0 degrees, and the chief ray angle of the incident light may increase toward the edge of the image sensor 1000.

However, the color separating lens array 130 described above may generally have directionality with respect to the incident light. In other words, the color separating lens array 130 may operate efficiently with respect to light incident within a particular angle range, but the color separation performance of the color separating lens array 130 may degrade as the incident angle moves away from the particular angle range. Thus, when the nanoposts NP of the color separating lens array 130 have the same arrangement in the entire region of the image sensor 1000, the color separation efficiency may not be uniform in the entire region of the image sensor 1000 and the color separation efficiency may vary according to the region of the image sensor 1000. Accordingly, the quality of the image provided by the image sensor 1000 may be degraded. Thus, the arrangement of the nanoposts NP of the color separating lens array 130 may be differently designed considering the chief ray angle of the incident light that varies according to the position on the image sensor 1000.

Figure 8A:
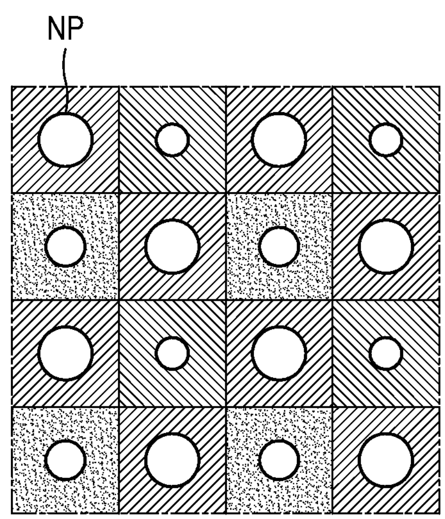
FIGS. 8A to 8C are plan views illustrating an arrangement form change of nanoposts of a color separating lens array considering a change of a chief ray angle according to a position on an image sensor.
Figure 8B:
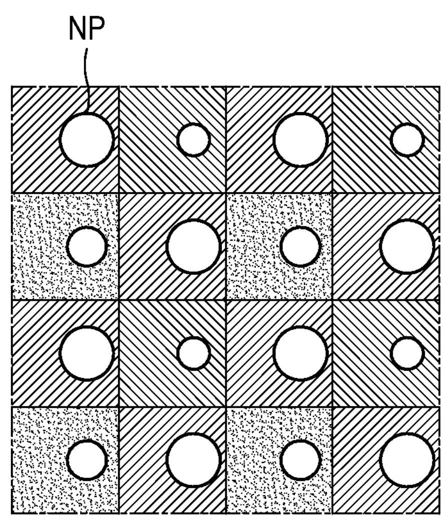
Figure 8C:
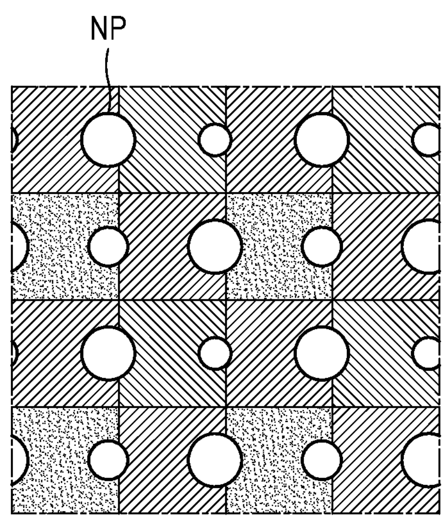

FIGS. 8A to 8C are plan views illustrating an arrangement form change of the nanoposts NP of the color separating lens array 130 considering a change of a chief ray angle according to a position on the image sensor 1000. Particularly, FIG. 8A illustrates the position of the nanopost NP arranged at the central portion of each pixel of the image sensor 1000, FIG. 8B illustrates the position of the nanopost NP arranged at a region between the central portion and edge of each pixel of the image sensor 1000, and FIG. 8C illustrates the position of the nanopost NP arranged at the edge of each pixel of the image sensor 1000. FIGS. 8A to 8C are not intended to restrict the nanoposts NP to a certain arrangement but are provided to conceptually describe a relative position change of the nanoposts NP according to the position on the image sensor 1000.

As illustrated in FIGS. 8A to 8C, from the central portion toward the edge of the image sensor 1000, the first to fourth pixel corresponding regions of the color separating lens array 130 may be shifted farther from the corresponding pixels. For example, on the central portion of the image sensor 1000, on the central portion of the color separating lens array 130, or on the central portion of the sensor substrate 110, the positions of the first to fourth pixel corresponding regions 131, 132, 133, and 134 of the color separating lens array 130 may be equal to the positions of the first to fourth pixels 111, 112, 113, and 114 corresponding thereto. Also, away from the central portion of the image sensor 1000, away from the central portion of the color separating lens array 130, or away from the central portion of the sensor substrate 110, the positions of the first to fourth pixel corresponding regions 131, 132, 133, and 134 of the color separating lens array 130 may be further shifted from the positions of the first to fourth pixels 111, 112, 113, and 114 corresponding thereto. The degree of shifting the first to fourth pixel corresponding regions of the color separating lens array 130 may be determined according to the chief ray angle of light incident to the color separating lens array 130. Particularly, on the peripheral portion of the image sensor 1000, on the peripheral portion of the color separating lens array 130, or on the peripheral portion of the sensor substrate 110, the first to fourth pixel corresponding regions 131, 132, 133, and 134 of the color separating lens array 130 may be shifted toward the central portion of the image sensor 1000 with respect to the first to fourth pixels 111, 112, 113, and 114 corresponding thereto.

Hereinafter, it will be referred to as the central portion of the image sensor 1000; however, because the image sensor 1000, the color separating lens array 130, and the sensor substrate 110 face each other, the central portion of the image sensor 1000 may refer to the central portion of the color separating lens array 130 or the central portion of the sensor substrate 110. Likewise, the peripheral portion/edge of the image sensor 1000 may refer to the peripheral portion/edge of the color separating lens array 130 or the peripheral portion/edge of the sensor substrate 110.

Figure 9:
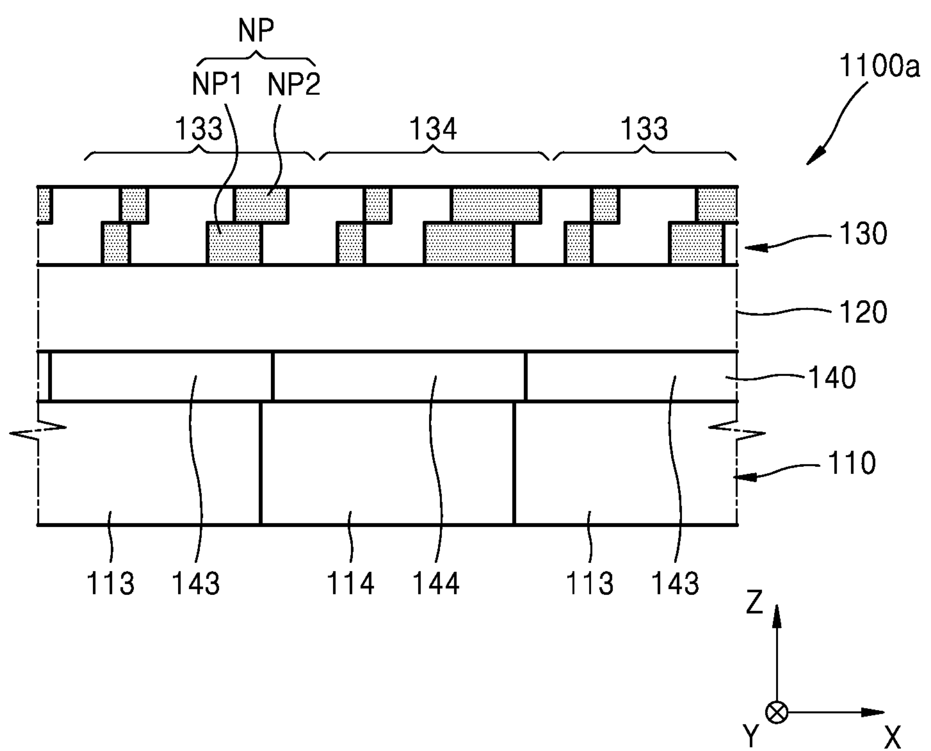
FIG. 9 is a cross-sectional view illustrating a schematic structure of a pixel array of an image sensor according to another embodiment.

FIG. 9 is a cross-sectional view illustrating a schematic structure of a pixel array of the image sensor 1000 according to another embodiment. Referring to FIG. 9, a pixel array 1100*a* may include a color separating lens array 130 including nanoposts NP stacked in two stages. The nanoposts NP may include a first stage nanopost NP1 arranged on a spacer layer 120 and a second stage nanopost NP2 arranged on the first stage nanopost NP1. The second stage nanopost NP2 may be shifted in an inclination direction of light with respect to the first stage nanopost NP1. For example, when the light incident on the color separating lens array 130 is inclined from the right side to the left side, the second stage nanopost NP2 may be shifted to the right side with respect to the first stage nanopost NP1. On the contrary, when the light incident on the color separating lens array 130 is inclined from the left side to the right side, the second stage nanopost NP2 may be shifted to the left side with respect to the first stage nanopost NP1. That is, the second stage nanopost NP2 may be shifted toward the central portion of the image sensor 1000 with respect to the first stage nanopost NP1. Also, toward the left edge from the central portion of the image sensor 1000, the second stage nanopost NP2 may be further shifted to the right side with respect to the first stage nanopost NP1, and toward the right edge from the central portion of the image sensor 1000, the second stage nanopost NP2 may be further shifted to the left side with respect to the first stage nanopost NP1. Thus, the shift distance of the second stage nanopost NP2 may be greater than the shift distance of the first stage nanopost NP1 corresponding thereto.

Likewise, the third and fourth pixel corresponding regions 133 and 134 of the color separating lens array 130 may be shifted toward the central portion of the image sensor 1000 with respect to the third and fourth pixels 113 and 114 corresponding thereto. For example, toward the left edge from the central portion of the image sensor 1000, the third and fourth pixel corresponding regions 133 and 134 of the color separating lens array 130 may be further shifted to the right side with respect to the third and fourth pixels 113 and 114 corresponding thereto. Although not illustrated, the first and second pixel corresponding regions arranged on another cross-section of the color separating lens array 130 may also be shifted toward the central portion of the image sensor 1000 with respect to the first and second pixels corresponding thereto.

Particularly, the third and fourth pixel corresponding regions 133 and 134 of the color separating lens array 130 may be shifted to respectively condense the red light and the green light onto the central portions of the third and fourth pixels 113 and 114 corresponding thereto. A shifted distance "s" of the third and fourth pixel corresponding regions 133 and 134 of the color separating lens array 130 may be determined, for example, by Equation 2 below.

$$s=d\times\tan(CRA') \quad \text{[Equation 2]}$$

In Equation 2, "d" denotes the smallest distance or interval between the lower surface of the color separating lens array 130 and the upper surface of the sensor substrate 110, and CRA' denotes the incident angle of light incident on the sensor substrate 110. Also, CRA' may be determined by Equation 3 below.

$$CRA'=\sin^{-1}(\sin CRA\times n) \quad \text{[Equation 3]}$$

In Equation 3, CRA denotes the incident angle of light incident on the color separating lens array 130, that is, the chief ray angle, and "n" denotes the refractive index of a material arranged between the color separating lens array 130 and the sensor substrate 110. Thus, the shift distance "s" of the third and fourth pixel corresponding regions 133 and 134 of the color separating lens array 130 from the corresponding pixels may be determined by the incident angle of light incident on the color separating lens array 130 and the refractive index of a material arranged between the color separating lens array 130 and the sensor substrate 110.

Also, the third and fourth color filters 143 and 144 of the color filter array 140 may also be shifted in the same way as the third and fourth pixel corresponding regions 133 and 134 of the color separating lens array 130. For example, the third and fourth color filters 143 and 144 of the color filter array 140 may be shifted toward the central portion of the image sensor 1000 with respect to the third and fourth pixels 113 and 114 corresponding thereto. The shift distance of the third and fourth color filters 143 and 144 of the color filter array 140 may be less than the shift distance of the third and fourth pixel corresponding regions 133 and 134 of the color separating lens array 130 corresponding thereto. Although not illustrated, the first and second color filters arranged on another cross-section of the color filter array 140 may also be shifted toward the central portion of the image sensor 1000 with respect to the first and second pixels corresponding thereto.

Figure 10:
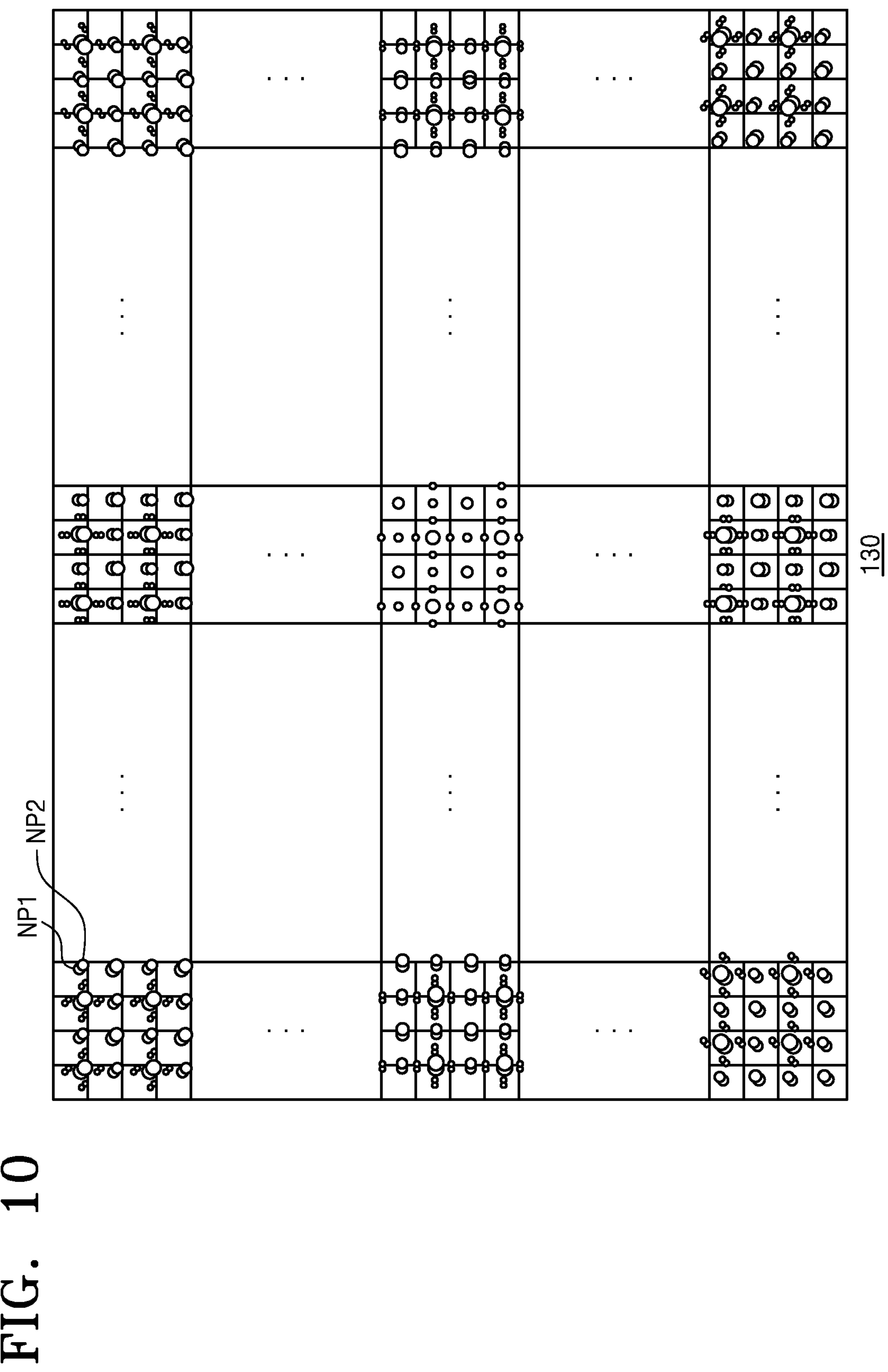
FIG. 10 is a plan view illustrating a shift form of two-dimensionally arranged nanoposts considering a change of a chief ray angle in a color separating lens array.

FIG. 10 is a plan view illustrating a shift form of two-dimensionally arranged nanoposts considering a change of a chief ray angle in the color separating lens array 130. Referring to FIG. 10, the plurality of pixel corresponding groups may include a central group disposed in the central portion of the image sensor 1000 or the color separating lens array 130. The plurality of pixel corresponding groups may further include a plurality of peripheral groups disposed at the periphery of the central portion of the image sensor 1000 or the color separating lens array 130, and/or outside a boundary of the central portion of the image sensor 1000 or the color separating lens array 130. On the central portion of the image sensor 1000, the first to fourth pixel corresponding regions of the central group of the color separating lens array 130 are not shifted with respect to the corresponding pixels. Also, on the central portion of the image sensor 1000, the second stage nanopost NP2 is not shifted with respect to the first stage nanopost NP1. Also, on the peripheral portion of the image sensor 1000, the first to fourth pixel corresponding regions of the plurality of peripheral groups of the color separating lens array 130 are shifted toward the central portion of the image sensor 1000, and the second stage nanopost NP2 is also shifted toward the central portion of the image sensor 1000 with respect to the first stage nanopost NP1. Thus, the entire area of the color separating lens array 130 may be less than the entire area of the pixel array 1100*a* of the image sensor 1000 or the entire area of the sensor substrate 110.

Figure 11A:
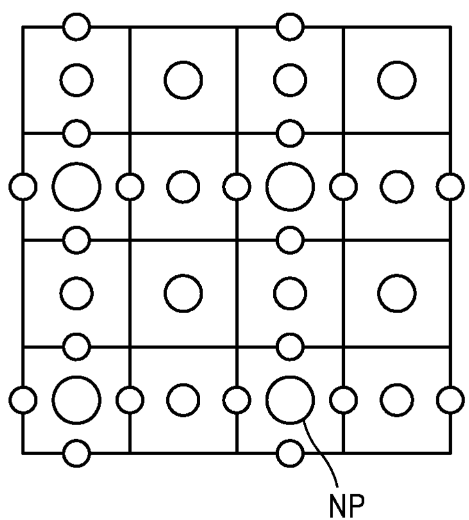
FIGS. 11A and 11B are plan views illustrating a change of the width of a nanopost according to a position on an image sensor according to another embodiment.
Figure 11B:
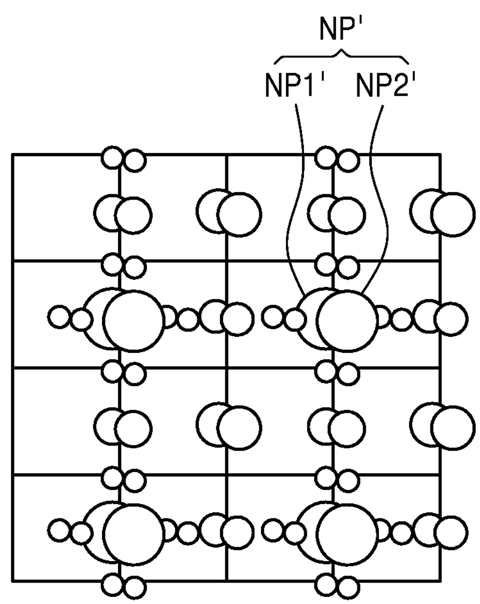

FIGS. 11A and 11B are plan views illustrating a change of the width of a nanopost according to a position on the image sensor 1000 according to another embodiment. FIG. 11A illustrates the width of a nanopost NP of the color separating lens array 130 at the central portion of the image sensor 1000, and FIG. 11B illustrates the width of a nanopost NP' of the color separating lens array 130 at the peripheral portion of the image sensor 1000. In the embodiment illustrated in FIG. 11B, the width of the nanopost NP' is changed while shifting the position of the nanopost NP' with respect to the corresponding pixel and further shifting a second stage nanopost NP2' with respect to a first stage nanopost NP1' corresponding thereto. As illustrated in FIG. 11B, the width of the nanopost NP' may increase toward the peripheral portion of the image sensor 1000. In other words, the width of the nanopost NP' at the peripheral portion of the image sensor 1000 may be greater than the width of the nanopost NP at the central portion of the image sensor 1000. For example, the width of the nanopost NP' at the outermost edge of the image sensor 1000 may be greater than the width of the nanopost NP at the central portion of the image sensor 1000 by about 5% to about 15%.

Here, the width change is obtained by comparing the widths of the nanoposts arranged at the same position in the same region among a plurality of first to fourth pixel corresponding regions of the color separating lens array 130. For example, the width of the nanopost arranged at the central portion of the first pixel corresponding region of the color separating lens array 130 in the central portion of the image sensor 1000 may be compared with the width of the nanopost arranged at the central portion of the first pixel corresponding region of the color separating lens array 130 in the peripheral portion of the image sensor 1000. The nanoposts arranged at different pixel corresponding regions of the color separating lens array 130 or the nanoposts arranged at different positions in the same region are not compared with each other.

As described so far, considering the light obliquely incident on the peripheral portion of the image sensor 1000, by shifting a plurality of pixel corresponding regions of the color separating lens array 130 in the peripheral portion of the image sensor 1000 or the peripheral portion of the color separating lens array 130, by shifting two-stage nanoposts with respect to each other, or by changing the width of nanoposts, the light utilization efficiency in the peripheral portion of the image sensor 1000 may be improved. Also, uniform color characteristics may be secured in the central portion and the peripheral portion of the image sensor 1000.

Figure 12:
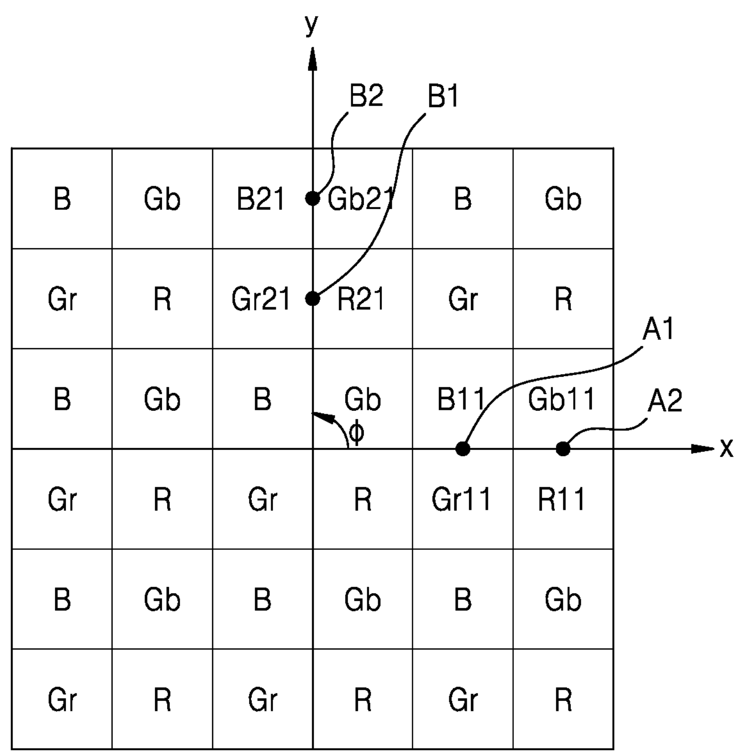
FIG. 12 is a plan view defining an azimuth direction in an image sensor or a color separating lens array.

Moreover, the light utilization efficiency and color characteristics of the image sensor 1000 may change according to the position of the azimuth direction as well as according to the chief ray angle of the incident light. FIG. 12 is a plan view defining an azimuth direction of a pixel or a nanopost in the image sensor 1000 or the color separating lens array 130. Referring to FIG. 12, the azimuth direction of a pixel or a nanopost may be defined as a direction obtained by rotating counterclockwise on the surface of the image sensor 1000 or the color separating lens array 130 from a reference line on the surface of the image sensor 1000 or the color separating lens array 130, to the pixel or the nanopost. The reference line may be a line in the first direction (X direction) that passes through the central portion of the image sensor 1000 or the color separating lens array 130. Also, an azimuth angle φ of a pixel or a nanopost may be defined as a counterclockwise angle from the reference line to the pixel or the nanopost. For example, the azimuth angle of a point (e.g., a point B1 in FIG. 12) of the peripheral portion of the image sensor 1000 may be a counterclockwise angle between a reference line (e.g., an X-axis line) and a line segment (e.g., a Y-axis line) extending from the central portion (e.g., an origin point) of the image sensor 1000 to the point of the peripheral portion (e.g. the point B1).

Also, referring to FIG. 12, when the chief ray angle of the light incident on peripheral pixels is equal between the peripheral pixels, that is, when the peripheral pixels are located at the same distance from the central portion of the image sensor 1000 or the color separating lens array 130, the arrangement and/or the size of peripheral pixels may vary according to the azimuth angle of the peripheral pixels. For example, a blue pixel B11 and a second green pixel Gr11 may be respectively located on the left side and the right side in the light propagation direction from the viewpoint of light that propagates in the first direction (X direction) and is incident on a point 'A1', whereas a second green pixel Gr21 and a red pixel R21 may be respectively located on the left side and the right side in light propagation direction from the viewpoint of light that propagates in the second direction (Y direction) and is incident on a point 'B1'. The point 'A1' and 'B1' may have the same chief ray angle and an azimuth angle difference of 90 degrees. Also, a first green pixel Gb11 and a red pixel R11 may be respectively located on the left side and the right side in the light propagation direction from the viewpoint of light that propagates in the first direction (X direction) and is incident on a point 'A2', whereas a blue pixel B21 and a first green pixel Gb21 may be respectively located on the left side and the right side in the light propagation direction from the viewpoint of light that propagates in the second direction (Y direction) and is incident on a point 'B2' that has the same chief ray angle as the point 'A2' and an azimuth angle difference of 90 degrees from the point 'A2'.

The blue pixel B and the red pixel R may have a relatively small effect due to an azimuth angle change because the arrangement of peripheral pixels is in the form of 4-fold symmetry. For example, four sides of the blue pixel B may contact the green pixels Gb and Gr and four vertexes thereof may contact the red pixel R, and four sides of the red pixel R may contact the green pixels Gb and Gr and four vertexes thereof may contact the blue pixel B. On the other hand, two opposite sides of the first and second green pixels Gb and Gr contact the blue pixel B, and the other two opposite sides of the first and second green pixels Gb and Gr contact the red pixel R. Thus, the first and second green pixels Gb and Gr may have a relatively great effect due to an azimuth angle change because the arrangement of peripheral pixels is in the form of 2-fold symmetry.

Considering this, the arrangement of nanoposts in the first pixel corresponding region 131 and the fourth pixel corresponding region 134 of the color separating lens array 130 corresponding to the first and second green pixels Gb and Gr may vary slightly according to the azimuth direction. For example, at least one of the shape, width, and arrangement of a plurality of nanoposts of the plurality of first and fourth pixel corresponding regions 131 and 134 may change according to the position of the azimuth direction in the peripheral portion surrounding the central portion of the color separating lens array 130.

Figure 13A:
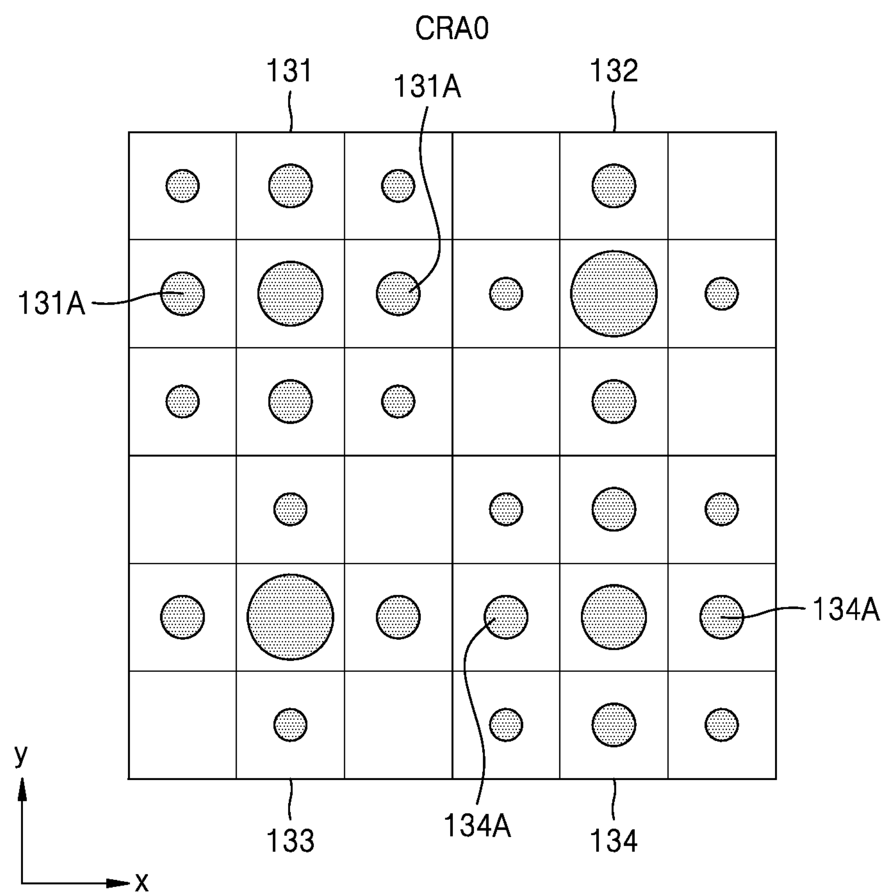
FIGS. 13A to 13C are plan views illustrating an arrangement form change of nanoposts of a color separating lens array according to an azimuth position on an image sensor according to an embodiment.
Figure 13B:
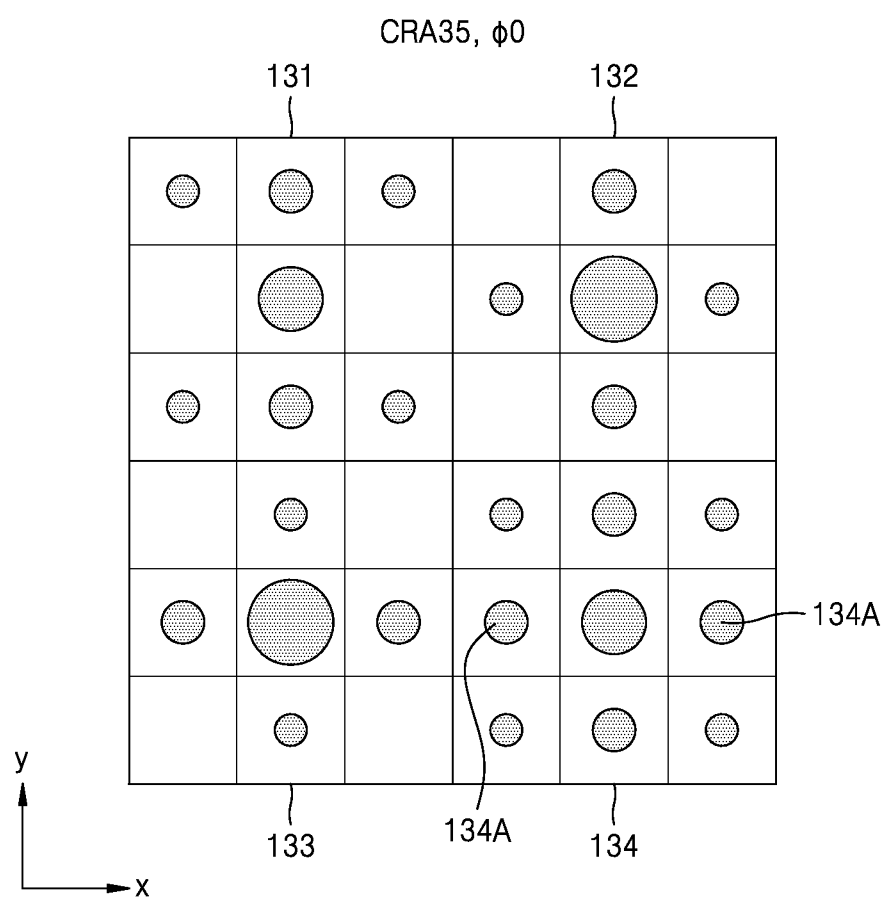
Figure 13C:
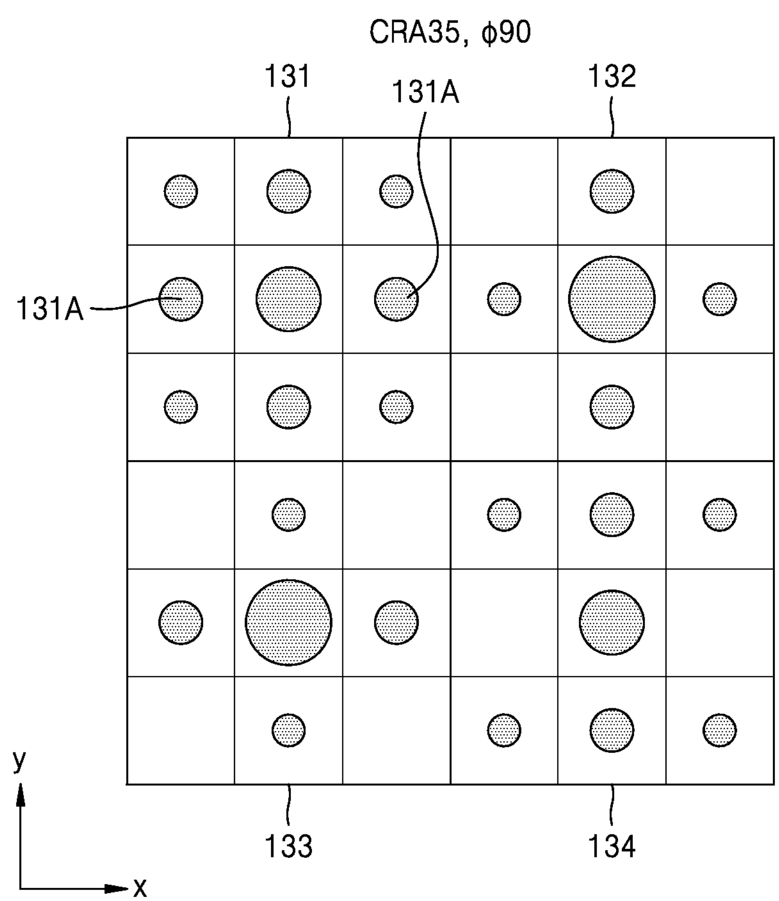

FIGS. 13A to 13C are plan views illustrating an arrangement form change of nanoposts of the color separating lens array 130 according to an azimuth position on the image sensor 1000 according to an embodiment, wherein FIG. 13A illustrates an arrangement form of nanoposts of the pixel corresponding regions of the central group of the color separating lens array 130 at a central portion of the image sensor 1000 or a central portion of the color separating lens array 130 where the chief ray angle is 0 degrees, FIG. 13B illustrates an arrangement form of nanoposts of the pixel corresponding regions of a first peripheral group of the color separating lens array 130 at a position where the chief ray angle is 35 degrees and the azimuth angle is 0 degrees, and FIG. 13C illustrates an arrangement form of nanoposts of the pixel corresponding regions of a second peripheral group of the color separating lens array 130 at a position where the chief ray angle is 35 degrees and the azimuth angle is 90 degrees. The first peripheral group in FIG. 13B and the second peripheral group in FIG. 13C among the plurality of peripheral groups may have the same chief ray angle (e.g., 35 degrees) and different azimuth angles (e.g., 0 degrees and 90 degrees). In FIGS. 13A to 13C, for convenience, the shift of pixel corresponding regions and the width change of nanoposts in the peripheral portion of the color separating lens array 130 are not applied and only the change of some nanoposts according to the azimuth angle is illustrated.

In an example illustrated in FIGS. 13A to 13C, the first pixel corresponding region 131 may include a plurality of nanoposts arranged at different positions in the first pixel corresponding region 131. For example, the first pixel corresponding region 131 may include two first nanoposts 131A arranged at a boundary portion adjacent to the second pixel corresponding region 132 in the first direction (X direction) and a plurality of second nanoposts arranged at other positions. Also, the fourth pixel corresponding region 134 may include two third nanoposts 134A arranged at a boundary portion adjacent to the third pixel corresponding region 133 in the first direction (X direction) and a plurality of fourth nanoposts arranged at other positions.

Referring to FIGS. 13A and 13B, the width of the first nanopost 131A among the nanoposts in the first pixel corresponding region 131 may decrease gradually as the chief ray angle increases in a state where the azimuth angle is 0 degrees. When the chief ray angle is 35 degrees, the width of the first nanopost 131A may be 0 and thus the first nanopost 131A adjacent to the second pixel corresponding region 132 in the first pixel corresponding region 131 may disappear. In other words, the width of the first nanopost 131A of the first pixel corresponding region 131 may decrease gradually toward the peripheral portion in the first direction (X direction) from the central portion of the color separating lens array 130, and the first nanopost 131A may not exist in the first pixel corresponding region 131 located at the edge in the first direction (X direction). On the other hand, the width of the third nanopost 134A among the nanoposts in the fourth pixel corresponding region 134 may not change when the azimuth angle is 0 degrees.

Referring to FIGS. 13B and 13C, when the azimuth angle increases gradually in a state where the chief ray angle is 35 degrees, the width of the first nanopost 131A among the nanoposts in the first pixel corresponding region 131 may increase gradually and the width of the third nanopost 134A among the nanoposts in the fourth pixel corresponding region 134 may decrease gradually. Also, when the chief ray angle is 35 degrees and the azimuth angle is 90 degrees, the width of the third nanopost 134A of the fourth pixel corresponding region 134 may be 0 and the width of the first nanopost 131A of the first pixel corresponding region 131 at the edge of the color separating lens array 130 in the second direction (Y direction) may be equal to the width of the first nanopost 131A of the first pixel corresponding region 131 in the central portion of the color separating lens array 130.

Also, the width of the third nanopost 134A of the fourth pixel corresponding region 134 may decrease gradually toward the peripheral portion in the second direction (Y direction) from the central portion of the color separating lens array 130, and the third nanopost 134A may not exist in the fourth pixel corresponding region 134 located at the edge in the second direction (Y direction). On the other hand, the width of the first nanopost 131A of the first pixel corresponding region 131 may not change when the azimuth angle is 90 degrees. When the azimuth angle decreases gradually in a state where the chief ray angle is 35 degrees, the width of the third nanopost 134A of the fourth pixel corresponding region 134 may increase gradually and the width of the first nanopost 131A of the first pixel corresponding region 131 may decrease gradually.

Thus, the width of the first nanopost 131A of the first pixel corresponding region 131 located at a certain distance from the central portion of the color separating lens array 130 in the first direction (X direction) on the surface of the color separating lens array 130 may be different from the width of the first nanopost 131A of the first pixel corresponding region 131 located at a certain distance from the central portion of the color separating lens array 130 in the second direction (Y direction) on the surface of the color separating lens array 130. Likewise, the width of the third nanopost 134A of the fourth pixel corresponding region 134 located at a certain distance from the central portion of the color separating lens array 130 in the first direction (X direction) on the surface of the color separating lens array 130 may be different from the width of the third nanopost 134A of the fourth pixel corresponding region 134 located at a certain distance from the central portion of the color separating lens array 130 in the second direction (Y direction) on the surface of the color separating lens array 130.

Also, the width of the first nanopost 131A of the first pixel corresponding region 131 located at a first distance from the central portion of the color separating lens array 130 in the first direction (X direction) on the surface of the color separating lens array 130 may be different from the width of the first nanopost 131A of the first pixel corresponding region 131 located at a second distance different from the first distance from the central portion of the color separating lens array 130 in the first direction (X direction) on the surface of the color separating lens array 130. On the other hand, the width of the third nanopost 134A of the fourth pixel corresponding region 134 located at the first distance from the central portion of the color separating lens array 130 in the first direction (X direction) on the surface of the color separating lens array 130 may be equal to the width of the third nanopost 134A of the fourth pixel corresponding region 134 located at the second distance from the central portion of the color separating lens array 130 in the first direction (X direction) on the surface of the color separating lens array 130.

Also, the width of the third nanopost 134A of the fourth pixel corresponding region 134 located at the first distance from the central portion of the color separating lens array 130 in the second direction (Y direction) on the surface of the color separating lens array 130 may be different from the width of the third nanopost 134A of the fourth pixel corresponding region 134 located at the second distance from the central portion of the color separating lens array 130 in the second direction (Y direction) on the surface of the color separating lens array 130. On the other hand, the width of the first nanopost 131A of the first pixel corresponding region 131 located at the first distance from the central portion of the color separating lens array 130 in the second direction (Y direction) on the surface of the color separating lens array 130 may be equal to the width of the first nanopost 131A of the first pixel corresponding region 131 located at the second distance from the central portion of the color separating lens array 130 in the second direction (Y direction) on the surface of the color separating lens array 130.

The width of the other second nanoposts arranged at a different position from the first nanopost 131A in the first pixel corresponding region 131 may be constant regardless of the azimuth angle change. Also, the width of the other fourth nanoposts arranged at a different position from the third nanopost 134A in the fourth pixel corresponding region 134 may be constant regardless of the azimuth angle change. In other words, the widths of the nanoposts corresponding to each other among the second nanoposts other than the first nanoposts 131A in the first pixel corresponding regions 131 located at the same distance from the central portion of the color separating lens array 130 on the surface of the color separating lens array 130 may be equal to each other regardless of the azimuth angle change, and the widths of the nanoposts corresponding to each other among the fourth nanoposts other than the third nanoposts 134A in the fourth pixel corresponding regions 134 located at the same distance from the central portion of the color separating lens array 130 on the surface of the color separating lens array 130 may be equal to each other regardless of the azimuth angle change. For example, the width of any one of the second nanoposts of the first pixel corresponding region 131 located at a certain distance from the central portion of the color separating lens array 130 in the first direction (X direction) on the surface of the color separating lens array 130 may be equal to the width of the corresponding nanopost among the second nanoposts of the first pixel corresponding region 131 located at a certain distance from the central portion of the color separating lens array 130 in the second direction (Y direction) on the surface of the color separating lens array 130. Also, the width of any one of the fourth nanoposts of the fourth pixel corresponding region 134 located at a certain distance from the central portion of the color separating lens array 130 in the first direction (X direction) on the surface of the color separating lens array 130 may be equal to the width of the corresponding nanopost among the fourth nanoposts of the fourth pixel corresponding region 134 located at a certain distance from the central portion of the color separating lens array 130 in the second direction (Y direction) on the surface of the color separating lens array 130.

As a result, the arrangement of a plurality of nanoposts of the first pixel corresponding region 131 located at a certain distance from the central portion of the color separating lens array 130 in the first direction (X direction) on the surface of the color separating lens array 130 may be different from the arrangement of a plurality of nanoposts of the first pixel corresponding region 131 located at a certain distance from the central portion of the color separating lens array 130 in the second direction (Y direction) on the surface of the color separating lens array 130. Also, the arrangement of a plurality of nanoposts of the fourth pixel corresponding region 134 located at a certain distance from the central portion of the color separating lens array 130 in the first direction (X direction) on the surface of the color separating lens array 130 may be different from the arrangement of a plurality of nanoposts of the fourth pixel corresponding region 134 located at a certain distance from the central portion of the color separating lens array 130 in the second direction (Y direction) on the surface of the color separating lens array 134.

Particularly, the arrangement of a plurality of nanoposts of the first pixel corresponding region 131 and the arrangement of a plurality of nanoposts of the fourth pixel corresponding region 134 located at positions having the same chief ray angle and an azimuth angle difference of 90 degrees may be equal to each other. For example, the arrangement of a plurality of nanoposts of the first pixel corresponding region 131 located at a position where the chief ray angle is 35 degrees and the azimuth angle is 0 degrees may be equal to the arrangement of a plurality of nanoposts of the fourth pixel corresponding region 134 located at a position where the chief ray angle is 35 degrees and the azimuth angle is 90 degrees, and the arrangement of a plurality of nanoposts of the fourth pixel corresponding region 134 located at a position where the chief ray angle is 35 degrees and the azimuth angle is 0 degrees may be equal to the arrangement of a plurality of nanoposts of the first pixel corresponding region 131 located at a position where the chief ray angle is 35 degrees and the azimuth angle is 90 degrees. This may be because a plurality of nanoposts are arranged in the form of 2-fold symmetry in the first and fourth pixel corresponding regions 131 and 134 and the first pixel corresponding region 131 and the fourth pixel corresponding region 134 are rotated by 90 degrees with respect to each other.

Moreover, although not illustrated, when the azimuth angle further increases beyond 90 degrees, the width of the nanopost 131A adjacent to the second pixel corresponding region 132 among the nanoposts located in the first pixel corresponding region 131 may decrease gradually until the azimuth angle reaches 180 degrees, and the width of the nanopost 134A adjacent to the third pixel corresponding region 133 among the nanoposts located in the fourth pixel corresponding region 134 may increase gradually. Thus, the nanoposts of the first pixel corresponding region 131 and the fourth pixel corresponding region 134 in the color separating lens array 130 may be symmetrically arranged with respect to the azimuth angle of 0 degrees, 90 degrees, 180 degrees, or 270 degrees.

Although FIGS. 13A to 13C illustrate that each of the first to fourth pixel corresponding regions 131, 132, 133, and 134 includes nanoposts arranged in a 3×3 array form and may include nanoposts and the width of two nanoposts 131A adjacent to the second pixel corresponding region 132 among the nanoposts located in the first pixel corresponding region 131 and the width of two nanoposts 134A adjacent to the third pixel corresponding region 133 among the nanoposts located in the fourth pixel corresponding region 134 change according to the azimuth angle change, this is merely an example and the disclosure is not limited thereto. The arrangement form and the number of nanoposts in the first to fourth pixel corresponding regions 131, 132, 133, and 134 may be variously selected, and a method of changing the width of nanoposts and the position of nanoposts changing according to the azimuth angle change may be variously selected.

Figure 14A:
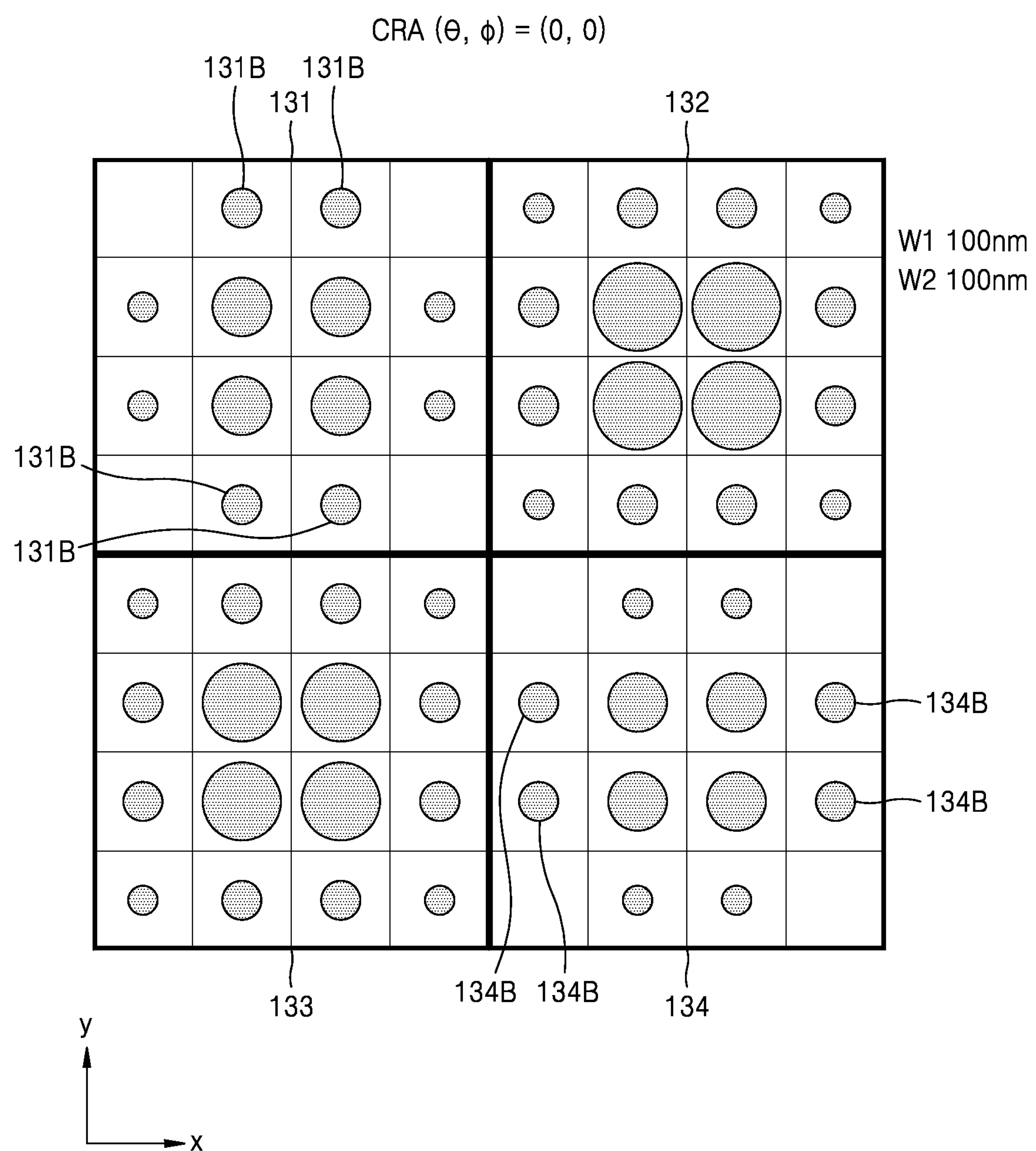
FIGS. 14A to 14D are plan views illustrating an arrangement form change of nanoposts of a color separating lens array according to an azimuth position on an image sensor according to another embodiment.
Figure 14B:
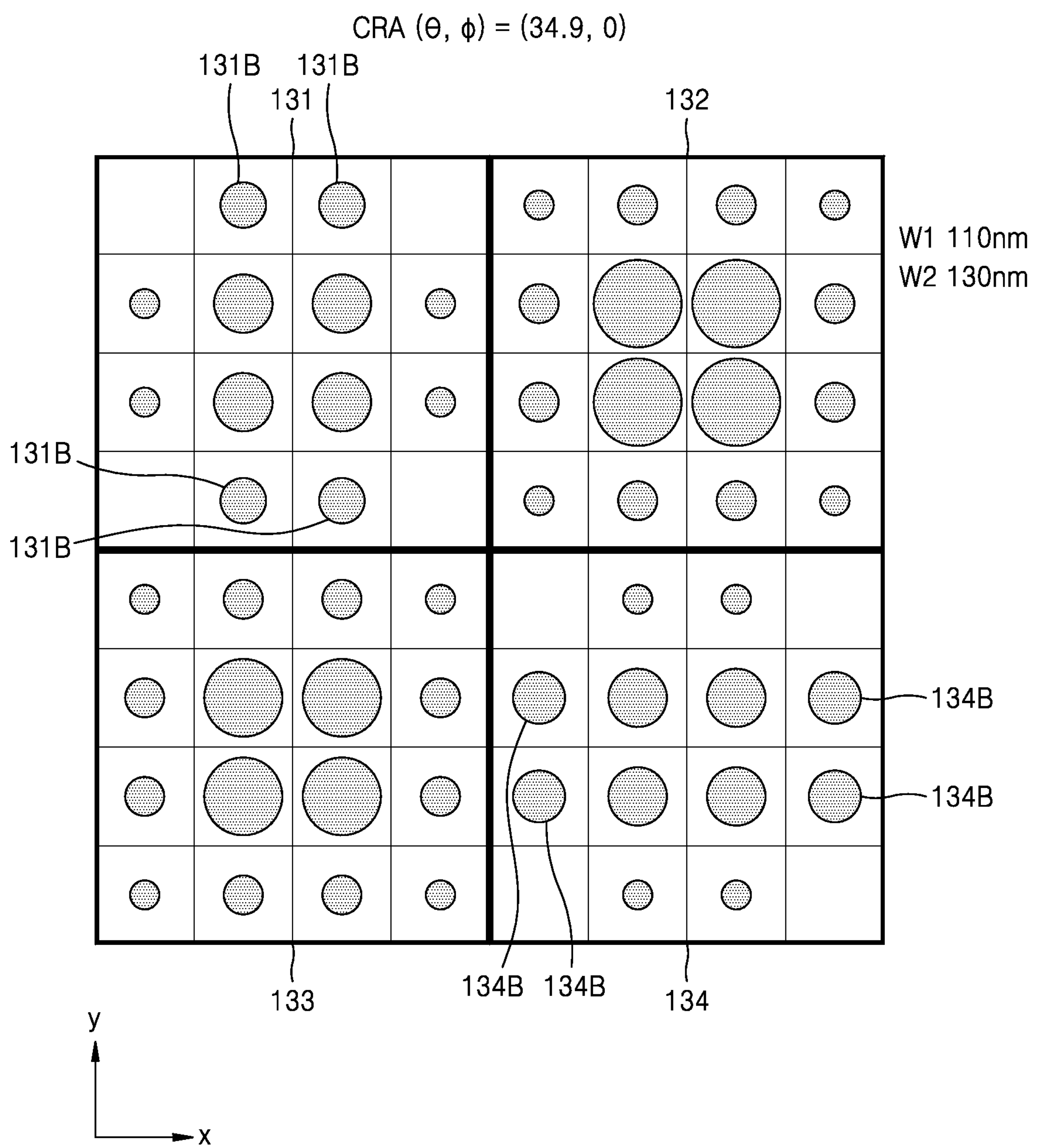
Figure 14C:
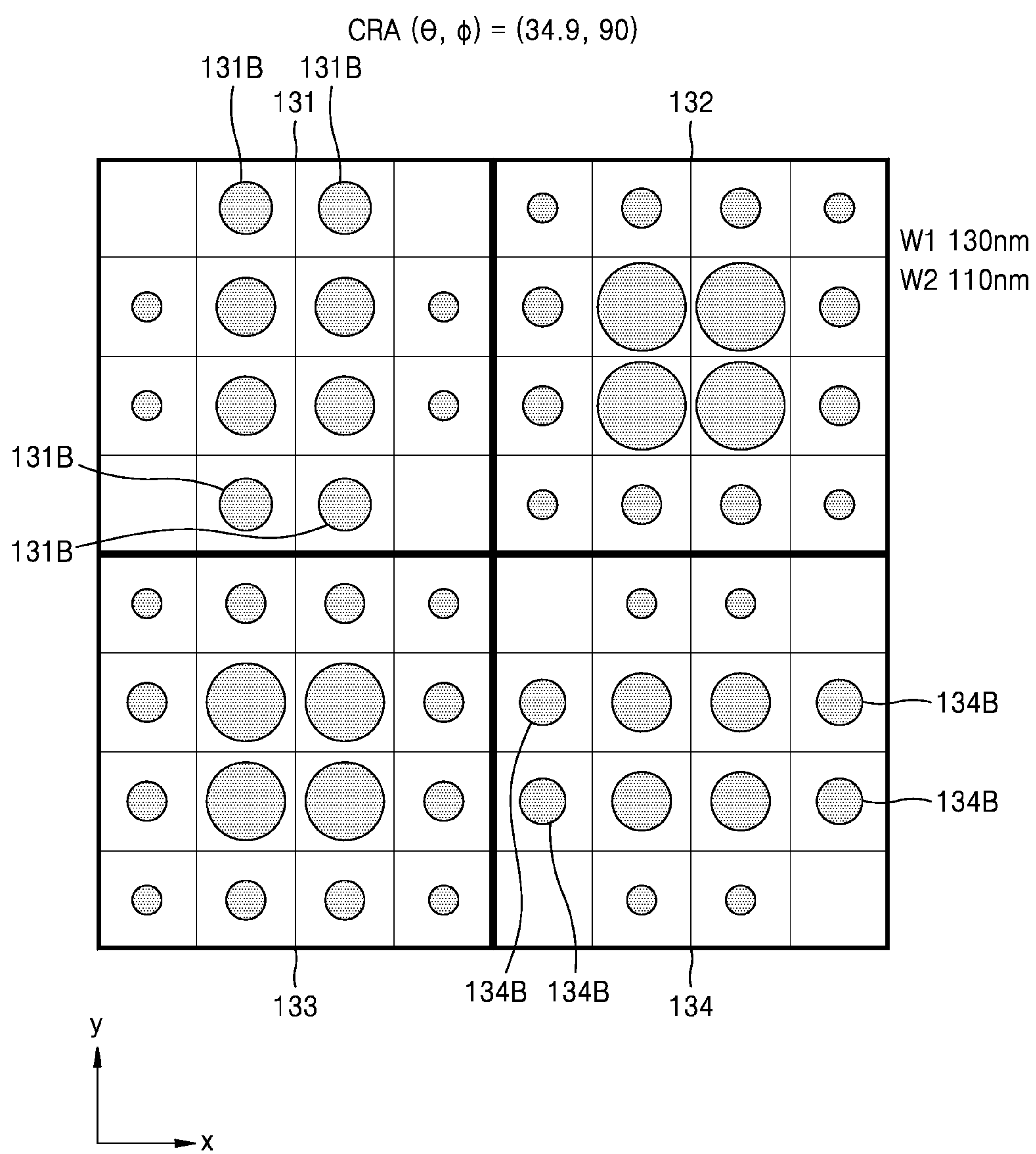
Figure 14D:
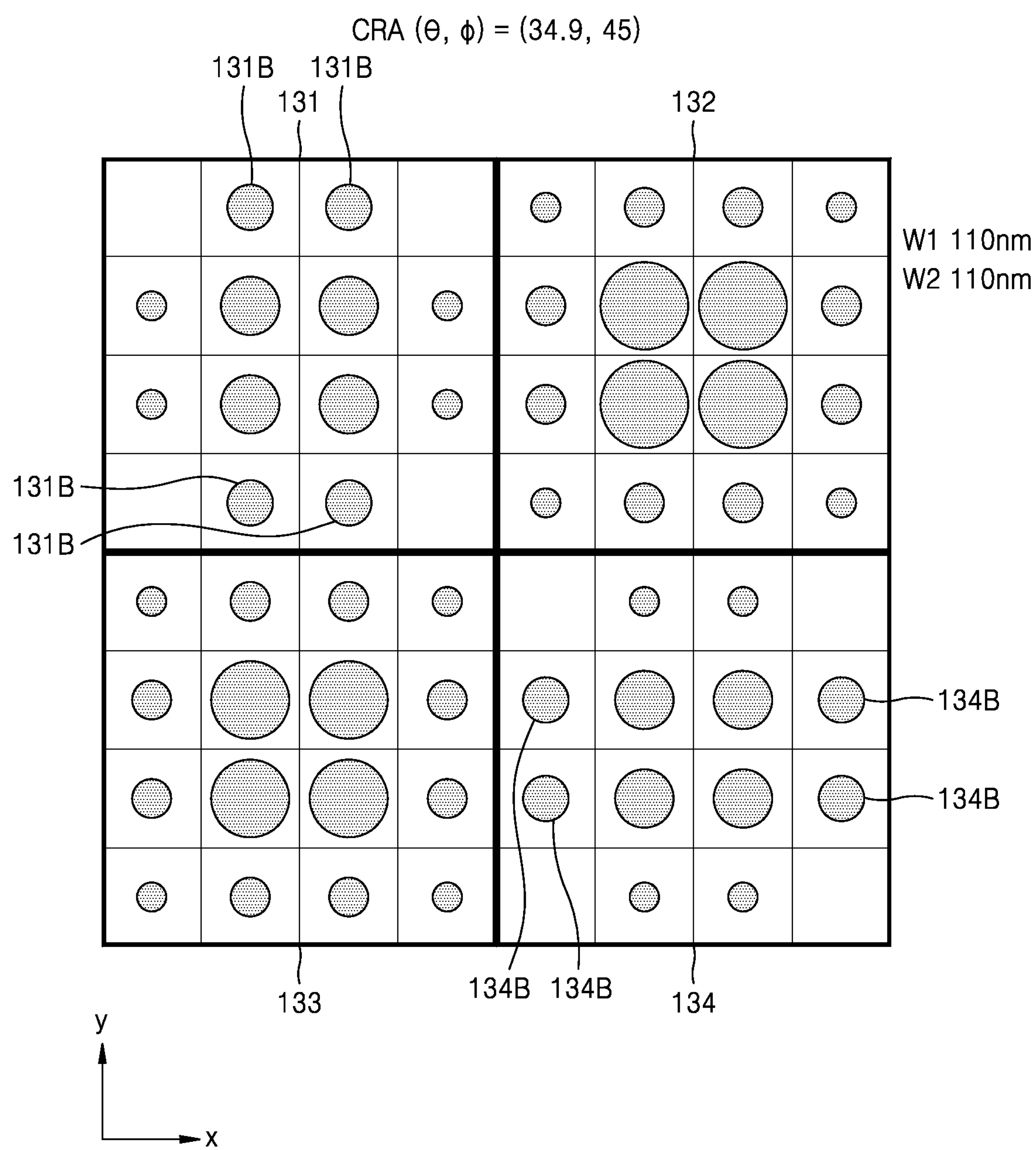

FIGS. 14A to 14D are plan views illustrating an arrangement form change of nanoposts of the color separating lens array 130 according to an azimuth position on the image sensor according to another embodiment, wherein FIG. 14A illustrates an arrangement form of nanoposts of the pixel corresponding regions of the central group of the color separating lens array 130 at a central portion of the image sensor 1000 or a central portion of the color separating lens array 130 where the chief ray angle is 0 degrees, FIG. 14B illustrates an arrangement form of nanoposts of the pixel corresponding regions of a first peripheral group of the color separating lens array 130 at a position where the chief ray angle is 34.9 degrees and the azimuth angle is 0 degrees, FIG. 14C illustrates an arrangement form of nanoposts of the pixel corresponding regions of a second peripheral group of the color separating lens array 130 at a position where the chief ray angle is 34.9 degrees and the azimuth angle is 90 degrees, and FIG. 14D illustrates an arrangement form of nanoposts of the pixel corresponding regions of a third peripheral group of the color separating lens array 130 at a position where the chief ray angle is 34.9 degrees and the azimuth angle is 45 degrees. The first peripheral group in FIG. 14B, the second peripheral group in FIG. 14C, and the third peripheral group in FIG. 14D among the plurality of peripheral groups may have the same chief ray angle (e.g., 34.9 degrees) and different azimuth angles (e.g., 0 degrees, 90 degrees, and 45 degrees). In FIGS. 14A to 14D, for convenience, the shift of pixel corresponding regions and the width change of nanoposts in the peripheral portion of the color separating lens array 130 are not applied and only the change of some nanoposts according to the azimuth angle change is illustrated.

In an example illustrated in FIGS. 14A to 14D, each of the first to fourth pixel corresponding regions 131, 132, 133, and 134 may include nanoposts arranged in a 4×4 array form. In the case of the first and fourth pixel corresponding regions 131 and 134, nanoposts are not arranged at four corners, and in the case of the second and third pixel corresponding regions 132 and 133, nanoposts are arranged in all regions of a 4×4 array. For example, the first pixel corresponding region 131 may include four first nanoposts 131B arranged at an edge portion adjacent to the third pixel corresponding region 133 in the second direction (Y direction) in the first pixel corresponding region 131 and a plurality of second nanoposts arranged at other positions. The second nanoposts may include four nanoposts adjacent to the second pixel corresponding region 132 in the first direction (X direction) and four nanoposts arranged at a central portion thereof. The fourth pixel corresponding region 134 may include four third nanoposts 134B arranged at an edge portion adjacent to the third pixel corresponding region 133 in the first direction (X direction) in the fourth pixel corresponding region 134 and a plurality of fourth nanoposts arranged at other positions. The fourth nanoposts may include four nanoposts adjacent to the second pixel corresponding region 132 in the second direction (Y direction) and four nanoposts arranged at a central portion thereof.

Referring to FIG. 14A, in the central portion of the color separating lens array 130 where the chief ray angle and the azimuth angle are 0 degrees, a width W1 of the first nanopost 131B among the nanoposts in the first pixel corresponding region 131 and a width W2 of the third nanopost 134B among the nanoposts in the fourth pixel corresponding region 134 may be 100 nm and may be equal to each other.

Referring to FIG. 14B, the width W1 of the first nanopost 131B of the first pixel corresponding region 131 and the width W2 of the third nanopost 134B of the fourth pixel corresponding region 134 may increase gradually as the chief ray angle increases in a state where the azimuth angle is 0 degrees. In other words, the width W1 of the first nanopost 131B of the first pixel corresponding region 131 and the width W2 of the third nanopost 134B of the fourth pixel corresponding region 134 may increase gradually toward the peripheral portion in the first direction (X direction) from the central portion of the color separating lens array 130. Although not illustrated for convenience, the width of the other nanoposts in the first and fourth pixel corresponding regions 131 and 134 may also increase as the chief ray angle increases. When the azimuth angle is 34.9 degrees, the width W1 of the first nanopost 131B of the first pixel corresponding region 131 may be 110 nm and the width W2 of the third nanopost 134B of the fourth pixel corresponding region 134 may be 130 nm. Thus, the width W2 of the third nanopost 134B of the fourth pixel corresponding region 134 may increase more greatly than the width W1 of the first nanopost 131B of the first pixel corresponding region 131. In other words, the width W1 of the first nanopost 131B of the first pixel corresponding region 131 in the first peripheral group having the azimuth angle of a 0-degree may be smaller than the width W2 of the third nanopost 134B of the fourth pixel corresponding region 134 in the first peripheral group. It may be considered that the increase of the width W1 of the first nanopost 131B of the first pixel corresponding region 131 is simply due to the increase of the chief ray angle in the first direction (X direction) and the increase of the width W2 of the third nanopost 134B of the fourth pixel corresponding region 134 is based on the directionality of the color separating lens array 130 with respect to the azimuth angle.

Referring to FIG. 14C, when the azimuth angle increases in a state where the chief ray angle is 34.9 degrees, the width W1 of the first nanopost 131B among the nanoposts in the first pixel corresponding region 131 may increase and the width W2 of the third nanopost 134B among the nanoposts in the fourth pixel corresponding region 134 may decrease. For example, when the chief ray angle is 34.9 degrees and the azimuth angle is 90 degrees, the width W1 of the first nanopost 131B of the first pixel corresponding region 131 may be 130 nm and the width W2 of the third nanopost 134B of the fourth pixel corresponding region 134 may be 110 nm.

In other words, the width W1 of the first nanopost 131B of the first pixel corresponding region 131 and the width W2 of the third nanopost 134B of the fourth pixel corresponding region 134 may increase gradually toward the peripheral portion in the second direction (Y direction) from the central portion of the color separating lens array 130, and particularly, the width W1 of the first nanopost 131B of the first pixel corresponding region 131 may increase more greatly than the width W2 of the third nanopost 134B of the fourth pixel corresponding region 134. In other words, the width W1 of the first nanopost 131B of the first pixel corresponding region 131 in the second peripheral group having the azimuth angle of 90 degrees is greater than the width W2 of the third nanopost 134B of the fourth pixel corresponding region 134 in the second peripheral group. It may be considered that the increase of the width W1 of the first nanopost 131B of the first pixel corresponding region 131 is based on the directionality of the color separating lens array 130 with respect to the azimuth angle and the increase of the width W2 of the third nanopost 134B of the fourth pixel corresponding region 134 is simply due to the increase of the chief ray angle in the second direction (Y direction).

Although not illustrated, when the azimuth angle increases from 90 degrees to 180 degrees in a state where the chief ray angle is 34.9 degrees, the width W1 of the first nanopost 131B among the nanoposts in the first pixel corresponding region 131 may again decrease gradually and the width W2 of the third nanopost 134B among the nanoposts in the fourth pixel corresponding region 134 may again increase gradually. When the chief ray angle is 34.9 degrees and the azimuth angle is 180 degrees, the width W1 of the first nanopost 131B of the first pixel corresponding region 131 may be 110 nm and the width W2 of the third nanopost 134B of the fourth pixel corresponding region 134 may be 130 nm.

Thus, the width of the first nanopost 131B of the first pixel corresponding region 131 located at a certain distance from the central portion of the color separating lens array 130 in the first direction (X direction) on the surface of the color separating lens array 130 may be different from the width of the first nanopost 131B of the first pixel corresponding region 131 located at a certain distance from the central portion of the color separating lens array 130 in the second direction (Y direction) on the surface of the color separating lens array 130. Particularly, the width of the first nanoposts 131B of the first pixel corresponding region 131 located at the edge in the second direction (Y direction) from the central portion of the color separating lens array 130 may be greater than the width of the first nanopost 131B of the first pixel corresponding region 131 located at the edge in the first direction (X direction). Also, the width of the third nanopost 134B of the fourth pixel corresponding region 134 located at a certain distance from the central portion of the color separating lens array 130 in the first direction (X direction) on the surface of the color separating lens array 130 may be different from the width of the third nanopost 134B of the fourth pixel corresponding region 134 located at a certain distance from the central portion of the color separating lens array 130 in the second direction (Y direction) on the surface of the color separating lens array 130. Particularly, the width of the third nanoposts 134B of the fourth pixel corresponding region 134 located at the edge in the first direction (X direction) from the central portion of the color separating lens array 130 may be greater than the width of the third nanopost 134B of the fourth pixel corresponding region 134 located at the edge in the second direction (Y direction).

Also, the width of the first nanopost 131B of the first pixel corresponding region 131 located at a certain distance from the central portion of the color separating lens array 130 in the first direction (X direction) may be different from the width of the third nanopost 134B of the fourth pixel corresponding region 134 located at a certain distance from the central portion of the color separating lens array 130 in the first direction (X direction). The width of the first nanopost 131B of the first pixel corresponding region 131 located at a certain distance from the central portion of the color separating lens array 130 in the second direction (Y direction) may be different from the width of the third nanopost 134B of the fourth pixel corresponding region 134 located at a certain distance from the central portion of the color separating lens array 130 in the second direction (Y direction).

As a result, the arrangement of a plurality of nanoposts of the first pixel corresponding region 131 arranged in the first direction (X direction) from the central portion of the color separating lens array 130 may be different from the arrangement of a plurality of nanoposts of the first pixel corresponding region 131 arranged in the second direction (Y direction), and the arrangement of a plurality of nanoposts of the fourth pixel corresponding region 134 arranged in the first direction (X direction) from the central portion of the color separating lens array 130 may be different from the arrangement of a plurality of nanoposts of the fourth pixel corresponding region 134 arranged in the second direction (Y direction). Also, the arrangement of a plurality of nanoposts of the first pixel corresponding region 131 and the arrangement of a plurality of nanoposts of the fourth pixel corresponding region 134 located at positions having the same chief ray angle and an azimuth angle difference of 90 degrees may be equal to each other. For example, the width of the first nanopost 131B of the first pixel corresponding region 131 located at a certain distance from the central portion of the color separating lens array 130 in the first direction (X direction) may be equal to the width of the third nanopost 134B of the fourth pixel corresponding region 134 located at a certain distance from the central portion of the color separating lens array 130 in the second direction (Y direction).

Referring to FIG. 14D, the width W1 of the first nanopost 131B of the first pixel corresponding region 131 in the third peripheral group arranged at a certain distance from the central portion of the color separating lens array 130 in a 45-degree direction between the first direction (X direction) and the second direction (Y direction) and the width W2 of the third nanopost 134B of the fourth pixel corresponding region 134 in the third peripheral group may be equal to each other. Even when the azimuth angles are 135 degrees, 225 degrees, or 315 degrees, the width W1 of the first nanopost 131B of the first pixel corresponding region 131 and the width W2 of the third nanopost 134B of the fourth pixel corresponding region 134 may be equal to each other. For example, when the chief ray angle is 34.9 degrees and the azimuth angle is 45 degrees, the width W1 of the first nanopost 131B of the first pixel corresponding region 131 and the width W2 of the third nanopost 134B of the fourth pixel corresponding region 134 may be 110 nm.

Thus, it may be considered that the width of the nanoposts of the first pixel corresponding region 131 and the fourth pixel corresponding region 134 increase overall in the 45-degree azimuth direction considering only the chief ray angle. For example, on the surface of the color separating lens array 130, the width of the first nanopost 131B of the first pixel corresponding region 131 in the third peripheral group located at a certain distance from the central portion of the color separating lens array 130 in the 45-degree direction may be greater than the width of the first nanopost 131B of the first pixel corresponding region 131 in the central group located at the central portion of the color separating lens array 130, and the width of the third nanopost 134B of the fourth pixel corresponding region 134 in the third peripheral group located at a certain distance from the central portion of the color separating lens array 130 in the 45-degree direction may be greater than the width of the third nanopost 134B of the fourth pixel corresponding region 134 in the central group located at the central portion of the color separating lens array 130. Also, the width of the second nanopost of the first pixel corresponding region 131 in the third peripheral group located at a certain distance from the central portion of the color separating lens array 130 in the 45-degree direction may be greater than the width of the second nanopost of the first pixel corresponding region 131 in the central group located at the central portion of the color separating lens array 130, and the width of the fourth nanopost of the fourth pixel corresponding region 134 in the third peripheral group located at a certain distance from the central portion 130 of the color separating lens array in the 45-degree direction may be greater than width of the fourth nanopost of the fourth pixel corresponding region 134 in the central group located at the central portion of the color separating lens array 130.

The width of the nanoposts of the first pixel corresponding region 131 and the fourth pixel corresponding region 134 may increase gradually in the 45-degree azimuth direction as the chief ray angle increases. For example, on the surface of the color separating lens array 130, the width of the first nanopost 131B of the first pixel corresponding region 131 located at a second distance greater than a first distance from the central portion of the color separating lens array 130 in the 45-degree direction may be greater than the width of the first nanopost 131B of the first pixel corresponding region 131 located at the first distance from the central portion of the color separating lens array 130 in the 45-degree direction, and the width of the third nanopost 134B of the fourth pixel corresponding region 134 located at the second distance from the central portion of the color separating lens array 130 in the 45-degree direction may be greater than the width of the third nanopost 134B of the fourth pixel corresponding region 134 located at the first distance from the central portion of the color separating lens array 130 in the 45-degree direction. Also, the width of the second nanopost of the first pixel corresponding region 131 located at the second distance greater than the first distance from the central portion of the color separating lens array 130 in the 45-degree direction may be greater than the width of the second nanopost of the first pixel corresponding region 131 located at the first distance from the central portion of the color separating lens array 130 in the 45-degree direction, and the width of the fourth nanopost of the fourth pixel corresponding region 134 located at the second distance from the central portion of the color separating lens array 130 in the 45-degree direction may be greater than the width of the fourth nanopost of the fourth pixel corresponding region 134 located at the first distance from the central portion of the color separating lens array 130 in the 45-degree direction. For example, the width of the first nanopost 131B of the first pixel corresponding region 131 located at a distance corresponding to a chief ray angle of 34.9 degrees from the central portion of the color separating lens array 130 in the 45-degree direction may be about 5% to about 15% greater than the width of the first nanopost 131B of the first pixel corresponding region 131 located at the central portion of the color separating lens array 130.

Moreover, while the azimuth angle increases from 0 degrees to 45 degrees, the width of the first nanopost 131B of the first pixel corresponding region 131 arranged at a position with the same chief ray angle (i.e., arranged at the same distance from the central portion of the color separating lens array 130) may be fixed and the width of the third nanopost 134B of the fourth pixel corresponding region 134 arranged at a position with the same chief ray angle may decrease gradually. Also, while the azimuth angle increases from 45 degrees to 90 degrees, the width of the first nanopost 131B of the first pixel corresponding region 131 arranged at a position with the same chief ray angle may increase gradually and the width of the third nanopost 134B of the fourth pixel corresponding region 134 arranged at a position with the same chief ray angle may be fixed. Although not illustrated, while the azimuth angle increases from 90 degrees to 135 degrees, the width of the first nanopost 131B of the first pixel corresponding region 131 arranged at a position with the same chief ray angle may decrease gradually and the width of the third nanopost 134B of the fourth pixel corresponding region 134 arranged at a position with the same chief ray angle may be fixed. Also, while the azimuth angle increases from 135 degrees to 180 degrees, the width of the first nanopost 131B of the first pixel corresponding region 131 arranged at a position with the same chief ray angle may be fixed and the width of the third nanopost 134B of the fourth pixel corresponding region 134 arranged at a position with the same chief ray angle may increase gradually.

Thus, in the azimuth angle range between 45 degrees and −45 degrees, the nanoposts of the first pixel corresponding region 131 and the fourth pixel corresponding region 134 may be symmetrically arranged with respect to an azimuth angle of 0 degrees. Also, the nanoposts of the first pixel corresponding region 131 and the fourth pixel corresponding region 134 may be symmetrically arranged with respect to 90 degrees in the azimuth angle range between 45 degrees and 135 degrees, with respect to 180 degrees in the azimuth angle range between 135 degrees and 225 degrees, and with respect to 270 degrees in the azimuth angle range between 225 degrees and 315 degrees. In other words, the nanoposts of the first pixel corresponding region 45 and the fourth pixel corresponding region 134 may be symmetrically arranged in the angle range of ±45 degrees with respect to an azimuth angle of 0 degrees, 90 degrees, 180 degrees, or 270 degrees.

Figure 15A:
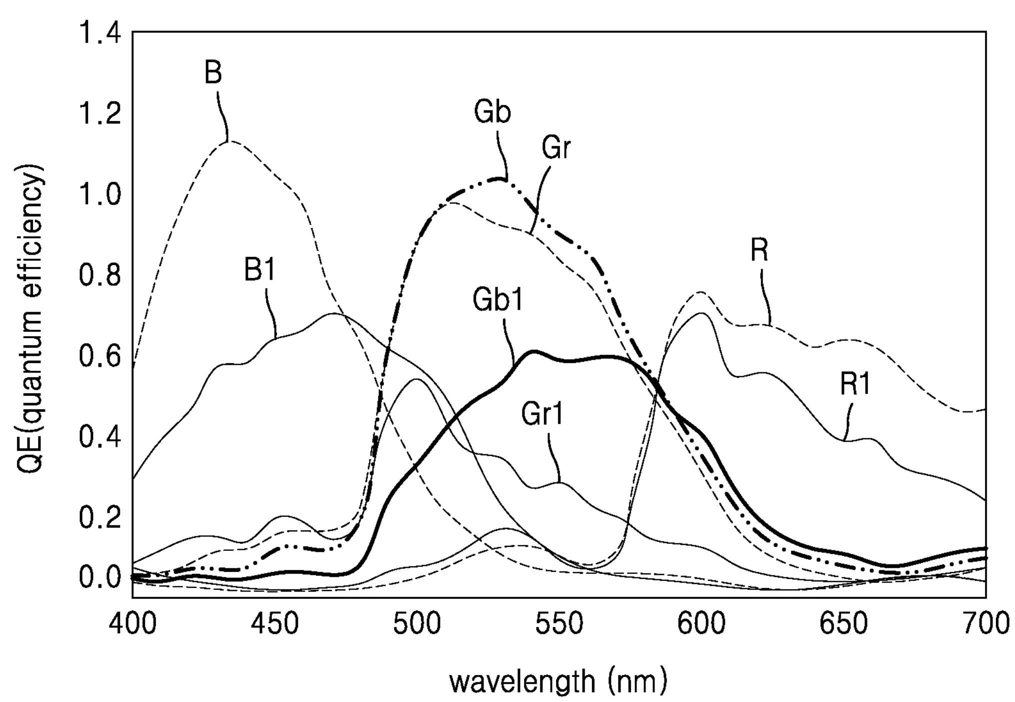
FIG. 15A is a graph illustrating a spectrum distribution of light incident on the pixels of an image sensor in a case where the chief ray angle is not considered.
Figure 15B:
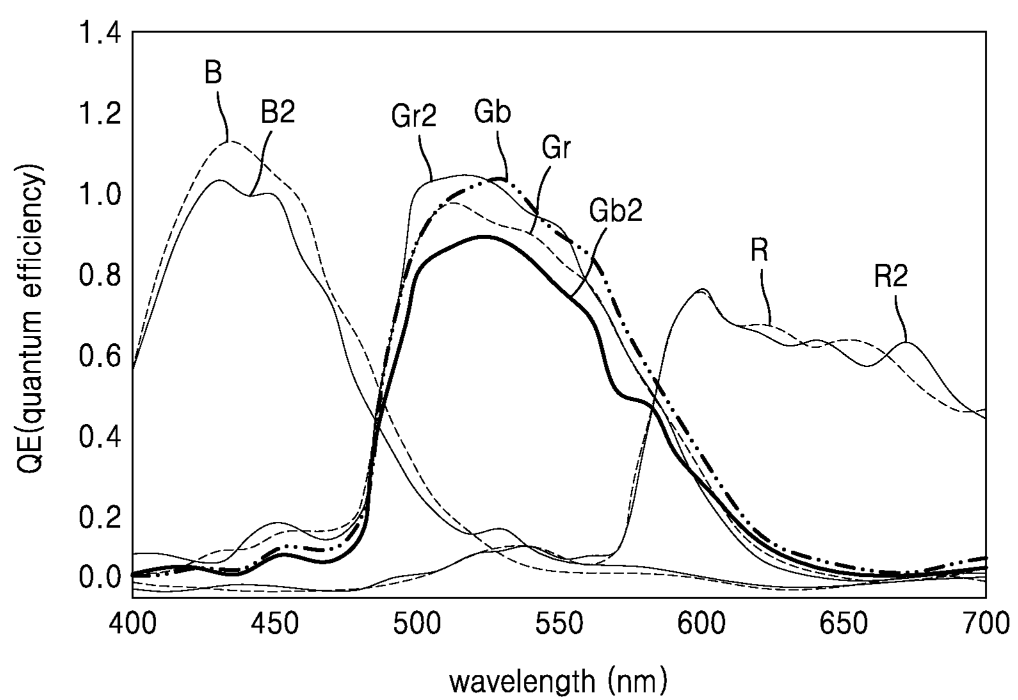
FIG. 15B is a graph illustrating a spectrum distribution of light incident on the pixels of an image sensor in a case where the nanoposts are shifted considering the chief ray angle.
Figure 15C:
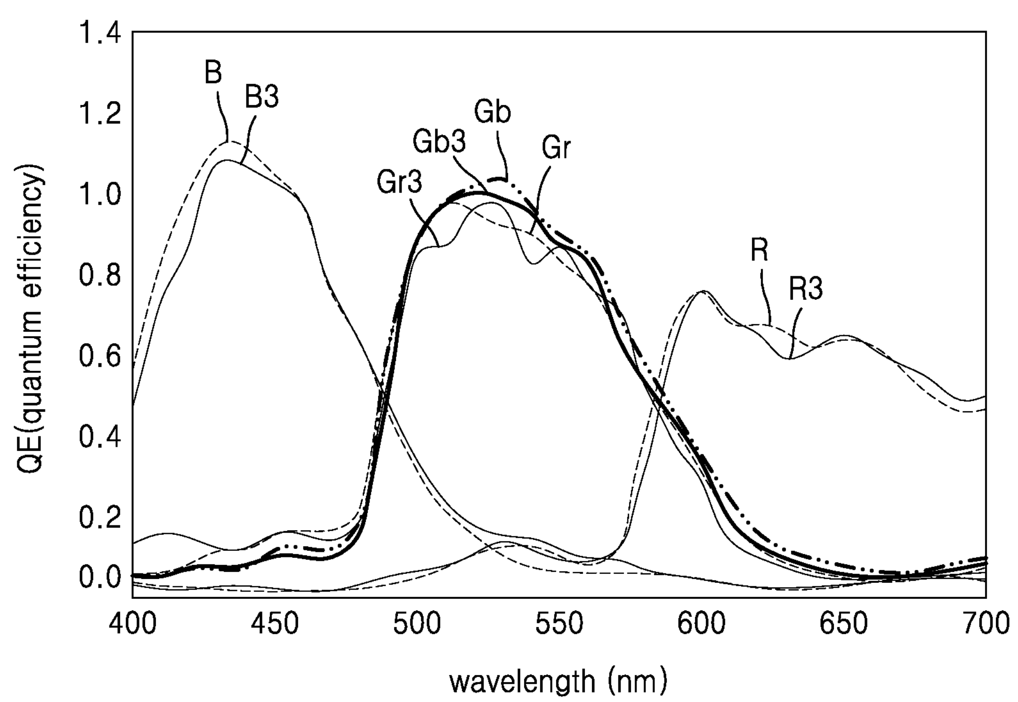
FIG. 15C is a graph illustrating a spectrum distribution of light incident on the pixels of an image sensor in a case where the nanoposts are shifted considering the chief ray angle and the arrangement of nanoposts is changed considering the azimuth direction.

FIG. 15A is a graph illustrating a spectrum distribution of light incident on each of the pixels of the image sensor 1000 in a case where the chief ray angle is not considered, FIG. 15B is a graph illustrating a spectrum distribution of light incident on each of the pixels of the image sensor 1000 in a case where the nanoposts are shifted considering the chief ray angle, an FIG. 15C is a graph illustrating a spectrum distribution of light incident on each of the pixels of the image sensor 1000 in a case where the nanoposts are shifted considering the chief ray angle and the arrangement of nanoposts is changed considering the azimuth direction.

In FIG. 15A, graphs denoted by 'Gb', 'B', 'R', and 'Gr' represent the spectrum distribution of light incident on each of the first to fourth pixels 111, 112, 113, and 114 arranged at the central portion of the image sensor 1000 with a chief ray angle of 0 degrees, and graphs denoted by 'Gb1', 'B1', 'R1' and 'Gr1' represent the spectrum distribution of light incident on each of the first to fourth pixels 111, 112, 113, and 114 at the peripheral portion of the image sensor 1000. Referring to FIG. 15A, when the chief ray angle is not considered at all, the spectrum distribution of light incident on the first to fourth pixels 111, 112, 113, and 114 arranged at the peripheral portion of the image sensor 1000 is greatly different from the spectrum distribution of light incident on the first to fourth pixels 111, 112, 113, and 114 arranged at the central portion of the image sensor 1000. Thus, it may be seen that the color separation characteristics are degraded in the peripheral portion of the color separating lens array 130 having a great chief ray angle.

Also, in FIG. 15B, graphs denoted by 'Gb2', 'B2', 'R2', and 'Gr2' represent the spectrum distribution of light incident on each of the first to fourth pixels 111, 112, 113, and 114 arranged at the peripheral portion of the image sensor 1000 in which the chief ray angle is 35 degrees when the nanoposts are shifted considering the chief ray angle. Referring to FIG. 15B, when the nanoposts are shifted considering the chief ray angle, the spectrum distribution of light incident on the first to fourth pixels 111, 112, 113, and 114 arranged at the peripheral portion of the image sensor 1000 is relatively similar to the spectrum distribution of light incident on the first to fourth pixels 111, 112, 113, and 114 arranged at the center of the image sensor 1000. However, a characteristic difference occurs in the spectrum of green light incident on each of the first pixel 111 and the fourth pixel 114 that are green pixels. This may be due to the fact that the pixel arrangement around the green pixel varies according to the azimuth direction.

In FIG. 15C, graphs denoted by 'Gb3', 'B3', 'R3', and 'Gr3' represent the spectrum distribution of light incident on each of the first to fourth pixels 111, 112, 113, and 114 arranged at the peripheral portion of the image sensor 1000 in which the chief ray angle is 35 degrees when the nanoposts are shifted considering the chief ray angle and the arrangement of nanoposts is changed considering the azimuth direction. Referring to FIG. 15C, it may be seen that, when the arrangement of nanoposts is changed considering the azimuth direction, even when the chief ray angle is 35 degrees, the spectrum distribution of light incident on the first to fourth pixels 111, 112, 113, and 114 at the central portion and the peripheral portion of the image sensor 1000 is maintained almost constant.

According to the image sensor 1000 including the pixel array 1100 described above, because a light loss due to a color filter, for example, an organic color filter, rarely occurs, a sufficient amount of light may be provided to the pixels even when the pixels become smaller. Thus, an ultra-high resolution, ultra-small, and highly-sensitive image sensor having hundreds of millions of pixels or more may be manufactured. Such an ultra-high resolution, ultra-small, and highly-sensitive image sensor may be employed in various high-performance optical devices or high-performance electronic apparatuses. The electronic apparatuses may include, for example, smart phones, mobile phones, cellular phones, personal digital assistants (PDAs), laptop computers, personal computers (PCs), various portable devices, electronic apparatuses, surveillance (security) cameras, medical cameras, automobiles, Internet of Things (IoT) devices, other mobile or non-mobile computing devices but are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor.

Figure 16:
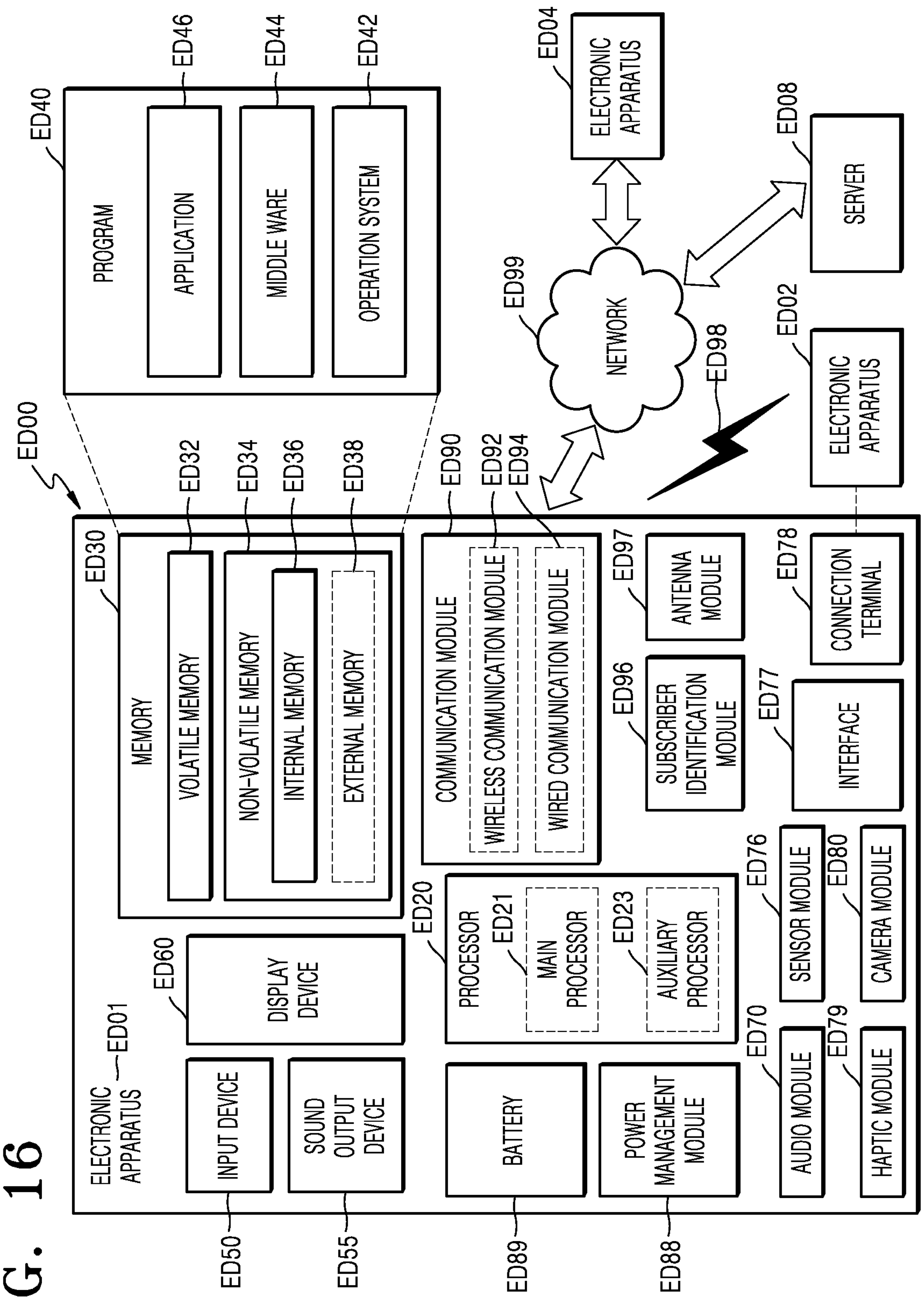
FIG. 16 is a block diagram schematically illustrating an electronic apparatus including an image sensor according to embodiments.

FIG. 16 is a block diagram illustrating an example of an electronic apparatus ED01 including the image sensor 1000. Referring to FIG. 16, in a network environment ED00, the electronic apparatus ED01 may communicate with another electronic apparatus ED02 via a first network ED98 (short-range wireless communication network or the like), or may communicate with another electronic apparatus ED04 and/or a server ED08 via a second network ED99 (long-range wireless communication network or the like). The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60 or the like) of the elements may be omitted or another element may be added. Some of the elements may be configured as one integrated circuit. For example, the sensor module ED76 (a fingerprint sensor, an iris sensor, an illuminance sensor, or the like) may be embedded and implemented in the display device ED60 (display or the like).

The processor ED20 may control one or more elements (hardware, software elements, or the like) of the electronic apparatus ED01 connected to the processor ED20 by executing software (program ED40 or the like), and may perform various data processes or operations. As a portion of the data processing or operations, the processor ED20 may load a command and/or data received from another element (sensor module ED76, communication module ED90, or the like) to a volatile memory ED32, may process the command and/or data stored in the volatile memory ED32, and may store result data in a non-volatile memory ED34. The processor ED20 may include a main processor ED21 (central processing unit, application processor, or the like) and an auxiliary processor ED23 (graphic processing unit, image signal processor, sensor hub processor, communication processor, or the like) that may be operated independently from or along with the main processor ED21. The auxiliary processor ED23 may use less power than the main processor ED21 and may perform specialized functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, or the like) of the elements in the electronic apparatus ED01. The auxiliary processor ED23 (image signal processor, communication processor, or the like) may be implemented as a portion of another element (camera module ED80, communication module ED90, or the like) that is functionally related thereto.

The memory ED30 may store various data required by the elements (processor ED20, sensor module ED76, or the like) of the electronic apparatus ED01. The data may include, for example, input data and/or output data about software (program ED40 or the like) and commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable.

The program ED40 may be stored as software in the memory ED30, and may include an operation system ED42, middle ware ED44, and/or an application ED46.

The input device ED50 may receive commands and/or data to be used in the elements (processor ED20 or the like) of the electronic apparatus ED01, from outside (user or the like) of the electronic apparatus ED01. The input device ED50 may include a microphone, a mouse, a keyboard, and/or a digital pen (stylus pen).

The sound output device ED55 may output a sound signal to the outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a portion of the speaker or may be implemented as an independent device.

The display device ED60 may provide visual information to the outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor or the like) that is set to measure the strength of a force generated by the touch.

The audio module ED70 may convert sound into an electrical signal or vice versa. The audio module ED70 may obtain sound through the input device ED50, or may output sound via the sound output device ED55 and/or a speaker and/or a headphone of another electronic apparatus (electronic apparatus ED0 or the like) connected directly or wirelessly to the electronic apparatus ED01.

The sensor module ED76 may sense an operating state (power, temperature, or the like) of the electronic apparatus ED01, or an outer environmental state (user state or the like) and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02 or the like). The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02 or the like). The connection terminal ED78 may include an HDMI connector, a USB connector, an SD card connector, and/or an audio connector (headphone connector or the like).

The haptic module ED79 may convert the electrical signal into a mechanical stimulus (vibration, motion, or the like) or an electrical stimulus that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a portion of a power management integrated circuit (PMIC).

The battery ED89 may supply electric power to elements of the electronic apparatus ED01. The battery ED89 may include a primary battery that is not rechargeable, a secondary battery that is rechargeable, and/or a fuel cell.

The communication module ED90 may support establishment of a direct (wired) communication channel and/or a wireless communication channel between the electronic apparatus ED01 and another electronic apparatus (electronic apparatus ED02, electronic apparatus ED04, server ED08, or the like), and execution of communication through the established communication channel. The communication module ED90 may be operated independently from the processor ED20 (application processor or the like) and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, or the like). From among the communication modules, a corresponding communication module may communicate with another electronic apparatus via a first network ED09 (short-range communication network such as Bluetooth, WiFi direct, or infrared data association (IrDA)) or a second network ED99 (long-range communication network such as a cellular network, Internet, or computer network (LAN, WAN, or the like)). Such various kinds of communication modules may be integrated as one element (single chip or the like) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI) or the like) stored in the subscriber identification module ED96.

The antenna module ED97 may transmit/receive the signal and/or power to/from the outside (another electronic apparatus or the like). An antenna may include a radiator formed as a conductive pattern formed on a substrate (PCB or the like). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC or the like) other than the antenna may be included as a portion of the antenna module ED97.

Some of the elements may be connected to one another via the communication method among the peripheral devices (bus, general purpose input and output (GPIO), serial peripheral interface (SPI), mobile industry processor interface (MIPI), or the like) and may exchange signals (commands, data, or the like).

The command or data may be transmitted or received between the electronic apparatus ED01 and the external electronic apparatus ED04 via the server ED08 connected to the second network ED99. Other electronic apparatuses ED02 and ED04 may be apparatuses that are the same as or different kinds from the electronic apparatus ED01. All or some of the operations executed in the electronic apparatus Ed01 may be executed in one or more apparatuses among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request may execute an additional function or service related to the request and may transmit the result of the execution to the electronic apparatus ED01. For this purpose, for example, a cloud computing, a distributed computing, or a client-server computing technique may be used.

Figure 17:
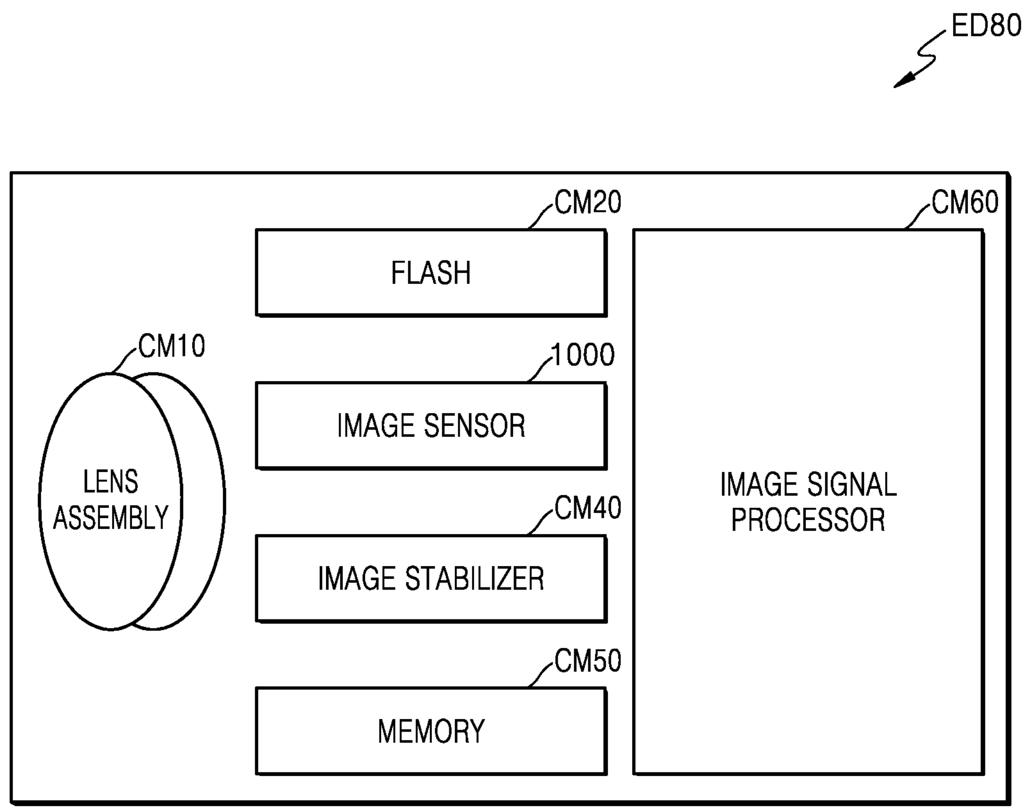
FIG. 17 is a block diagram schematically illustrating a camera module of FIG. 16.

FIG. 17 is a block diagram illustrating an example of the camera module ED80 of FIG. 16. Referring to FIG. 17, the camera module ED80 may include a lens assembly CM10, a flash CM20, an image sensor 1000 (the image sensor 1000 of FIG. 1), an image stabilizer CM40, a memory CM50 (buffer memory or the like), and/or an image signal processor CM60. The lens assembly CM10 may collect light emitted from an object, that is, an object to be captured. The camera module ED80 may include a plurality of lens assemblies CM10, and in this case, the camera module ED80 may include a dual camera module, a 360-degree camera, or a spherical camera. Some of the plurality of lens assemblies CM10 may have the same lens properties (viewing angle, focal distance, auto-focus, F number, optical zoom, or the like) or different lens properties. The lens assembly CM10 may include a wide-angle lens or a telephoto lens.

The flash CM20 may emit light that is used to strengthen the light emitted or reflected from the object. The flash CM20 may include one or more light-emitting diodes (red-green-blue (RGB) LED, white LED, infrared LED, ultraviolet LED, or the like), and/or a Xenon lamp. The image sensor 1000 may be the image sensor described above with reference to FIG. 1 and may convert the light emitted or reflected from the object and transmitted through the lens assembly CM10 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge coupled device (CCD) sensor and/or a complementary metal oxide semiconductor (CMOS) sensor.

The image stabilizer CM40, in response to a motion of the camera module ED80 or the electronic apparatus ED01 including the camera module ED80, may move one or more lenses included in the lens assembly CM10 or the image sensor 1000 in a certain direction or may control the operating characteristics of the image sensor 1000 (adjusting of a read-out timing or the like) to compensate for a negative influence of the motion. The image stabilizer CM40 may sense the movement of the camera module ED80 or the electronic apparatus ED01 by using a gyro sensor (not illustrated) or an acceleration sensor (not illustrated) arranged inside or outside the camera module ED80. The image stabilizer CM40 may be implemented as an optical type.

The memory CM50 may store some or all data of the image obtained through the image sensor 1000 for next image processing operation. For example, when a plurality of images are obtained at a high speed, obtained original data (Bayer-patterned data, high resolution data, or the like) may be stored in the memory CM50 and only a low resolution image may be displayed and then original data of a selected image (user selection or the like) may be transmitted to the image signal processor CM60. The memory CM50 may be integrated with the memory ED30 of the electronic apparatus ED01 or may include an additional memory that is operated independently.

The image signal processor CM60 may perform image processing on the image obtained through the image sensor 1000 or the image data stored in the memory CM50. The image processing may include depth map generation, three-dimensional modeling, panorama generation, feature extraction, image synthesis, and/or image compensation (noise reduction, resolution adjustment, brightness adjustment, blurring, sharpening, softening, or the like). The image signal processor CM60 may perform controlling (exposure time control, read-out timing control, or the like) of the elements (image sensor 1000 or the like) included in the camera module ED80. The image processed by the image signal processor CM60 may be stored again in the memory CM50 for additional process, or may be provided to an external element of the camera module ED80 (the memory ED30, the display device ED60, the electronic apparatus ED02, the electronic apparatus ED04, the server ED08, or the like). The image signal processor CM60 may be integrated with the processor ED20 or may be configured as an additional processor that is operated independently from the processor ED20. When the image signal processor CM60 is configured as an additional processor separately from the processor ED20, the image processed by the image signal processor CM60 may undergo additional image processing by the processor ED20 and then may be displayed on the display device ED60.

The electronic apparatus ED01 may include a plurality of camera modules ED80 having different properties or functions. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

Figure 18:
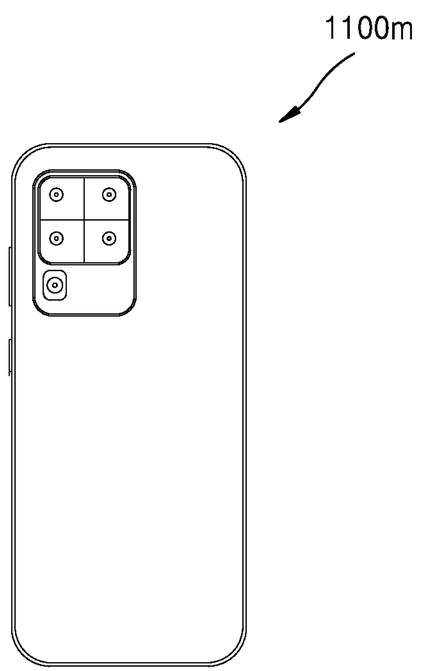
FIGS. 18 to 27 are diagrams illustrating various examples of an electronic apparatus to which image sensors are applied according to embodiments.
Figure 19:
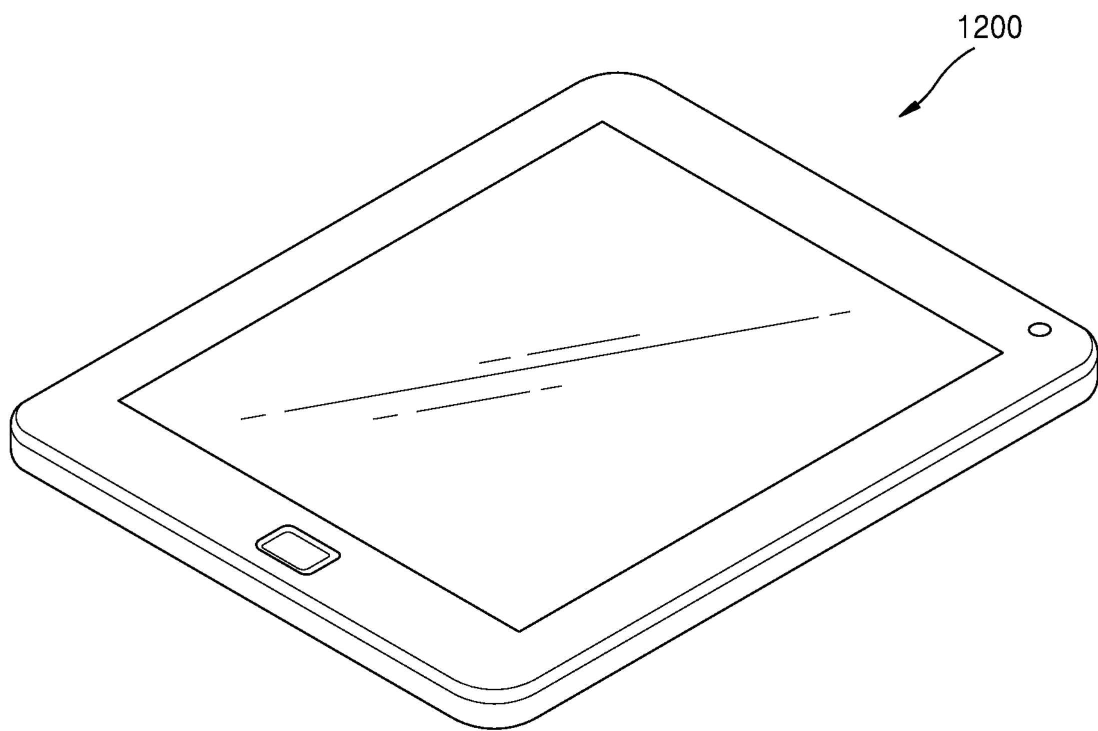
Figure 20:
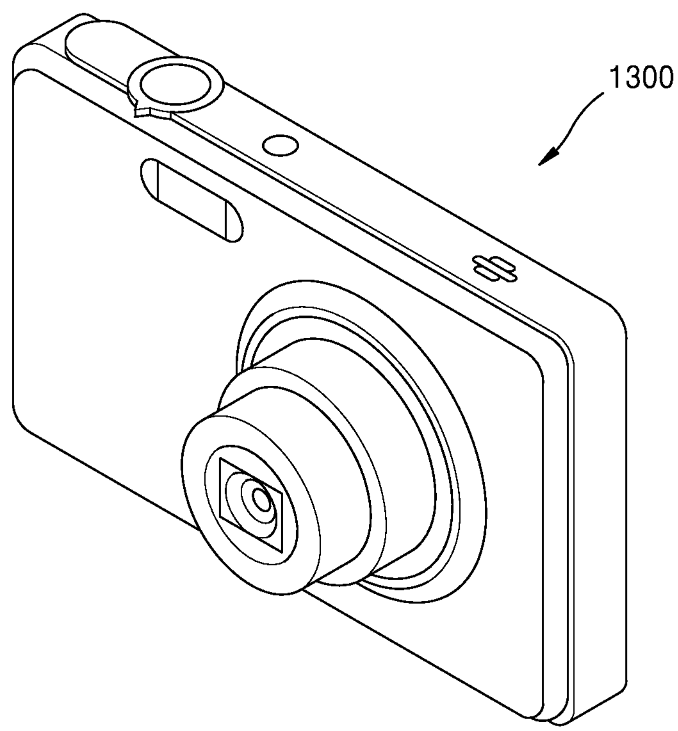
Figure 21:
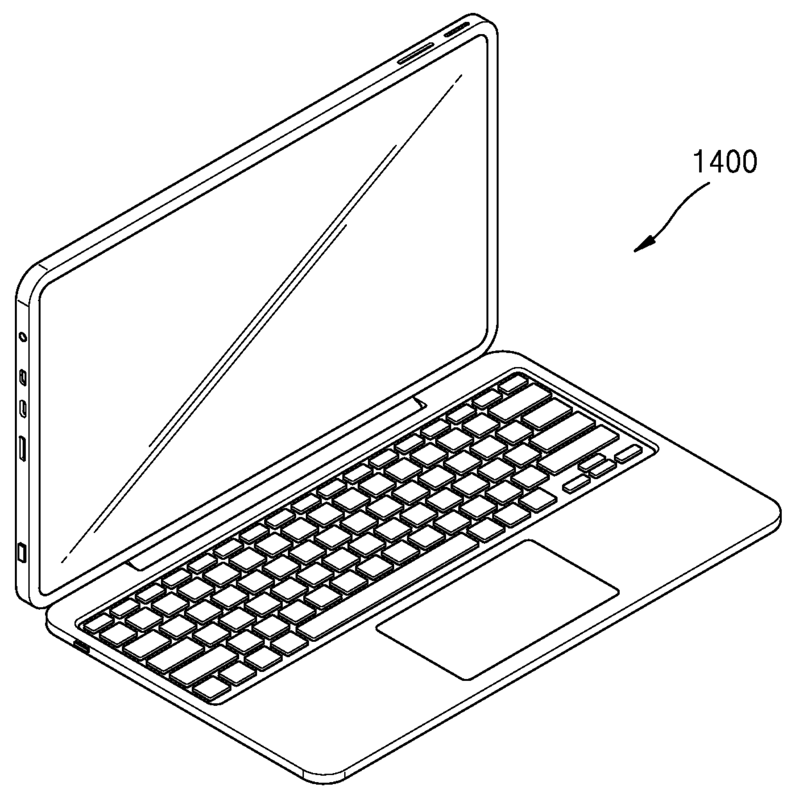
Figure 22:
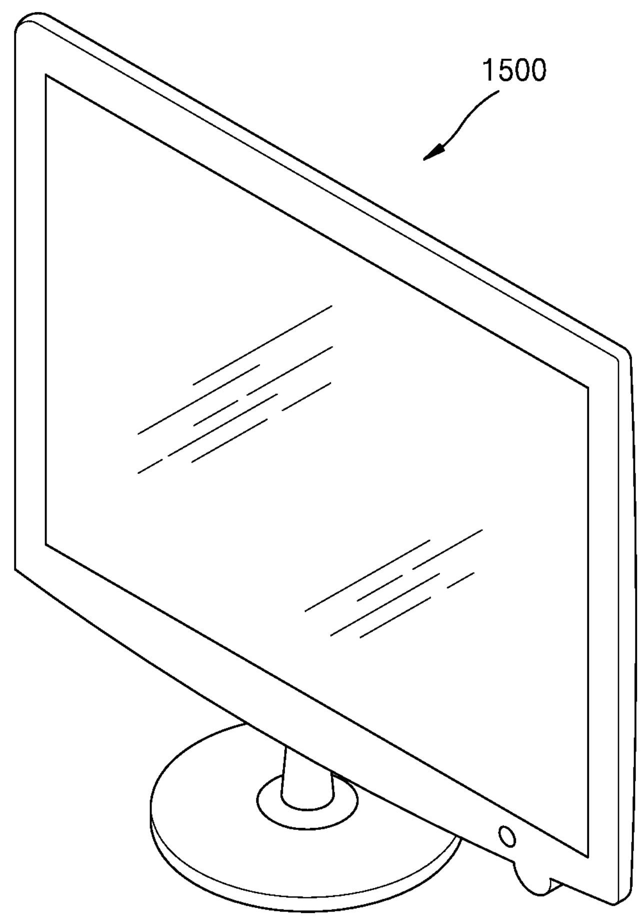

The image sensor 1000 according to the embodiments may be applied to a mobile phone or a smartphone 1100*m* illustrated in FIG. 18, a tablet or a smart tablet 1200 illustrated in FIG. 19, a digital camera or a camcorder 1300 illustrated in FIG. 20, a laptop computer 2400 illustrated in FIG. 21, or a television or a smart television 1500 illustrated in FIG. 22. For example, the smartphone 1100*m* or the smart tablet 1200 may include a plurality of high-resolution cameras each including a high-resolution image sensor. Depth information of objects in an image may be extracted, out focusing of the image may be adjusted, or objects in the image may be automatically identified by using the high-resolution cameras.

Figure 23:
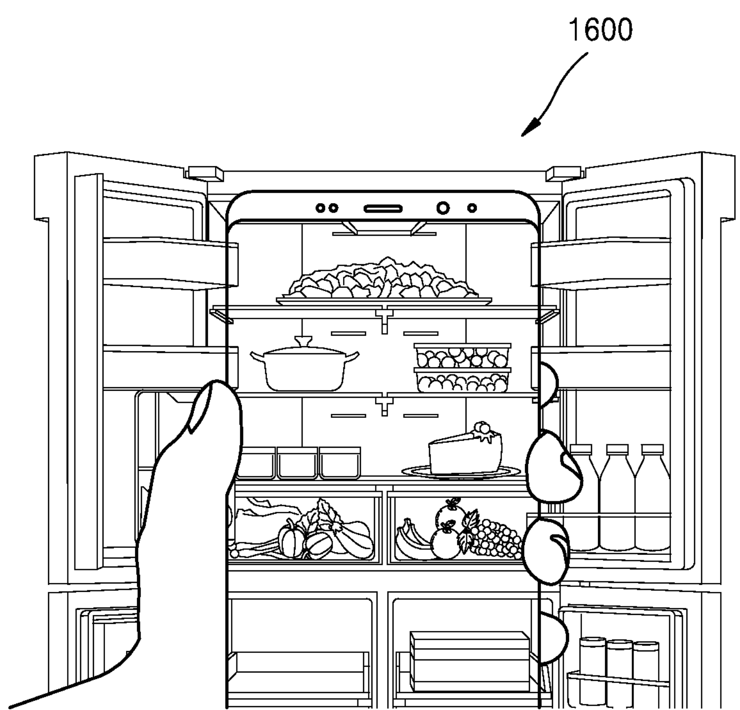
Figure 24:
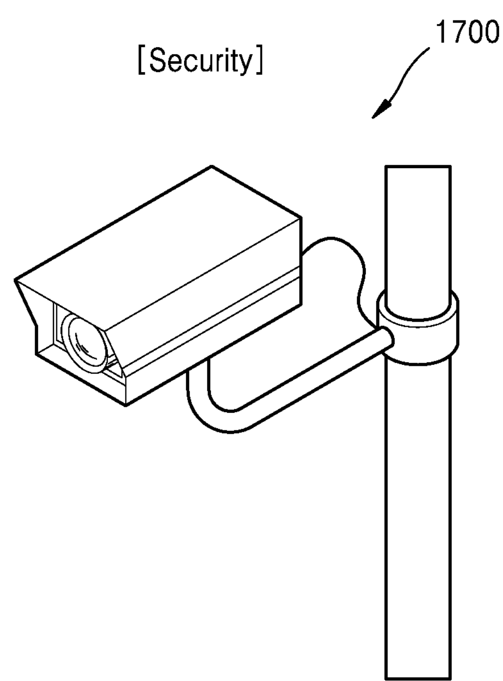
Figure 25:
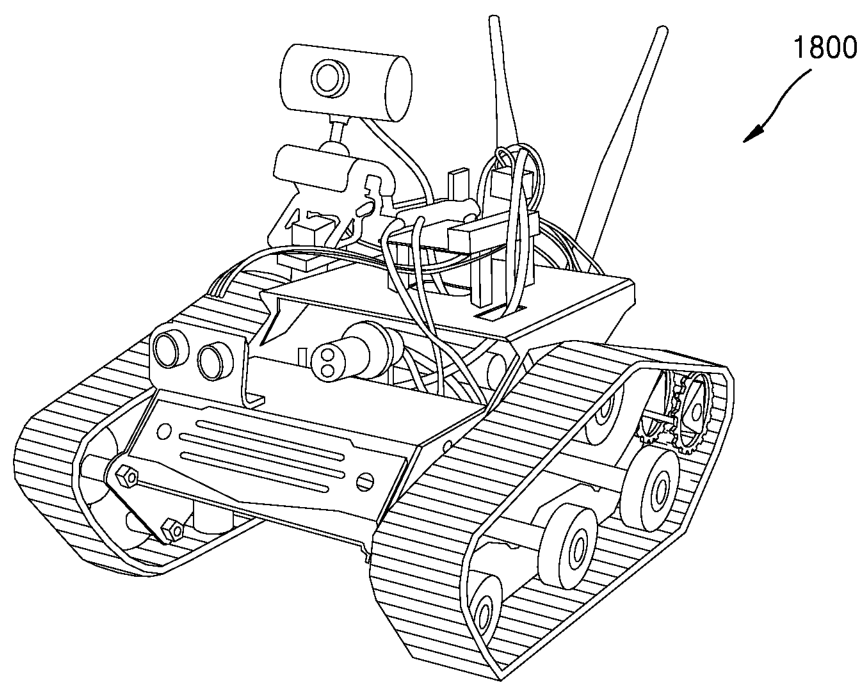
Figure 26:
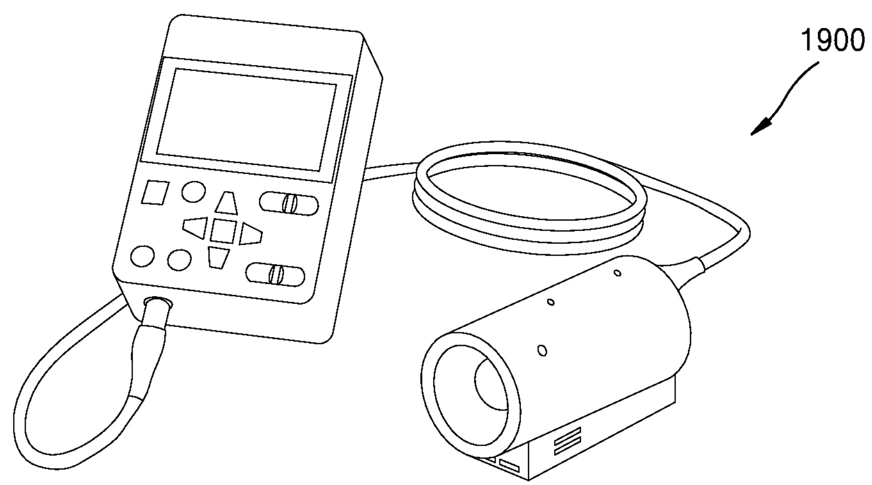

Also, the image sensor 1000 may be applied to a smart refrigerator 1600 illustrated in FIG. 23, a surveillance (security) camera 1700 illustrated in FIG. 24, a robot 1800 illustrated in FIG. 25, a medical camera 1900 illustrated in FIG. 26, or the like. For example, the smart refrigerator 1600 may automatically recognize food in the refrigerator by using the image sensor and may notify the user of the existence of a certain kind of food, kinds of food put into or taken out, or the like through a smartphone. Also, the surveillance camera 1700 may provide an ultra-high-resolution image and may allow the user to recognize an object or a person in the image even in dark environment by using high sensitivity. The robot 1800 may be input to a disaster or industrial site that a person may not directly access, to provide the user with high-resolution images. The medical camera 1900 may provide high-resolution images for diagnosis or surgery and may dynamically adjust a field of view.

Figure 27:
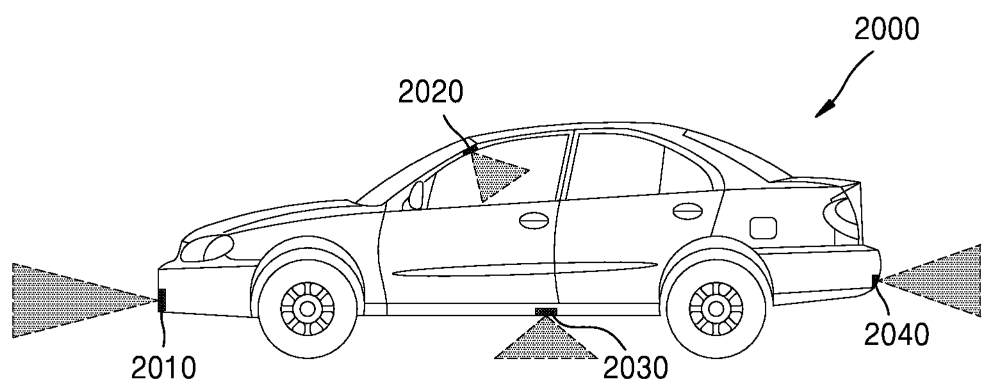

Also, the image sensor 1000 may be applied to a vehicle 2000 as illustrated in FIG. 27. The vehicle 2000 may include a plurality of vehicle cameras 2010, 2020, 2030, and 2040 at various positions. Each of the vehicle cameras 2010, 2020, 2030, and 2040 may include the image sensor according to one or more embodiments. The vehicle 2000 may provide a driver with various information about the interior of the vehicle 2000 or the periphery of the vehicle 2000 by using the plurality of vehicle cameras 2010, 2020, 2030, and 2040 and may provide the driver with information necessary for autonomous driving by automatically recognizing an object or a person in the image.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:

a sensor substrate comprising a plurality of first pixels configured to sense light of a first wavelength and a plurality of second pixels configured to sense light of a second wavelength different from the first wavelength; and a color separating lens array comprising a plurality of first pixel corresponding regions respectively corresponding to the plurality of first pixels and a plurality of second pixel corresponding regions respectively corresponding to the plurality of second pixels, wherein the plurality of first pixel corresponding regions are configured to change a phase of the light of the first wavelength and condense the light of the first wavelength onto each of the plurality of first pixels, and the plurality of second pixel corresponding regions are configured to change a phase of the light of the second wavelength and condense the light of the second wavelength onto each of the plurality of second pixels, each of the plurality of first pixel corresponding regions and the plurality of second pixel corresponding regions comprises a plurality of nanoposts, and at least one of a shape, a width, and an arrangement of the plurality of nanoposts of the plurality of first pixel corresponding regions is set according to an azimuth angle of the plurality of nanoposts in a peripheral portion surrounding a central portion of the color separating lens array, wherein in area having a same chief ray angle and different azimuth angles, the plurality of nanoposts in the plurality of first pixel corresponding regions have different shapes, widths, or arrangements.

2. The image sensor of claim 1, wherein the plurality of nanoposts of the first pixel corresponding region comprise a first nanopost and a second nanopost arranged at different positions in the first pixel corresponding region, and a width of the first nanopost of the first pixel corresponding region located at a first distance from the central portion of the color separating lens array in a first direction on a surface of the color separating lens array is different from a width of the first nanopost of the first pixel corresponding region located at the first distance from the central portion of the color separating lens array in a second direction perpendicular to the first direction on the surface of the color separating lens array.

3. The image sensor of claim 2, wherein a width of the second nanopost of the first pixel corresponding region located at the first distance from the central portion of the color separating lens array in the first direction on the surface of the color separating lens array is equal to a width of the second nanopost of the first pixel corresponding region located at the first distance from the central portion of the color separating lens array in the second direction on the surface of the color separating lens array.

4. The image sensor of claim 2, wherein a width of the first nanopost of the first pixel corresponding region located at the first distance from the central portion of the color separating lens array in a 45-degree direction between the first direction and the second direction on the surface of the color separating lens array is greater than a width of the first nanopost of the first pixel corresponding region located at the central portion of the color separating lens array.

5. The image sensor of claim 1, wherein positions of the first pixel corresponding region and the second pixel corresponding region in the central portion of the color separating lens array are equal to positions of a first pixel and a second pixel respectively corresponding to the first pixel corresponding region and the second pixel corresponding region, among the plurality of first pixels and the plurality of second pixels, and the first pixel corresponding region and the second pixel corresponding region in the peripheral portion of the color separating lens array are shifted toward the central portion of the color separating lens array with respect to the first pixel and the second pixel respectively corresponding to the first pixel corresponding region and the second pixel corresponding region.

6. The image sensor of claim 5, wherein a degree of shift of the first pixel corresponding region and the second pixel corresponding region with respect to the first pixel and the second pixel respectively corresponding to the first pixel corresponding region and the second pixel corresponding region in the peripheral portion of the color separating lens array increases as a distance from the central portion of the color separating lens array to the first pixel corresponding region and the second pixel corresponding region increases.

7. The image sensor of claim 1, wherein the sensor substrate further comprises a plurality of third pixels sensing light of a third wavelength different from the first wavelength and the second wavelength and a plurality of fourth pixels sensing light of the first wavelength, the color separating lens array further comprises a plurality of third pixel corresponding regions corresponding to the plurality of third pixels and a plurality of fourth pixel corresponding regions corresponding to the plurality of fourth pixels, each of the plurality of third pixel corresponding regions and the plurality of fourth pixel corresponding regions comprises a plurality of nanoposts, and the plurality of first pixel corresponding regions, the plurality of second pixel corresponding regions, the plurality of third pixel corresponding regions, and the plurality of fourth pixel corresponding regions are configured to change a phase of the light of the first wavelength and condense the light of the first wavelength onto each of the plurality of first pixels and the plurality of fourth pixels, to change a phase of the light of the second wavelength and condense the light of the second wavelength onto each of the plurality of second pixels, and to change a phase of the light of the third wavelength and condense the light of the third wavelength onto each of the plurality of third pixels, wherein the plurality of first pixel corresponding regions and the plurality of fourth pixel corresponding regions are arranged adjacent to each other in a first diagonal direction, and the plurality of second pixel corresponding regions and the plurality of third pixel corresponding regions are arranged adjacent to each other in a second diagonal direction intersecting with the first diagonal direction, and wherein at least one of a shape, a width, and an arrangement of the plurality of nanoposts of the plurality of fourth pixel corresponding regions is set according to an azimuth angle of the plurality of nanoposts of the plurality of fourth pixel corresponding regions in the peripheral portion surrounding the central portion of the color separating lens array.

8. The image sensor of claim 7, wherein a plurality of nanoposts of the first pixel corresponding region comprises a first nanopost and a second nanopost arranged at different positions in the first pixel corresponding region, a plurality of nanoposts of the fourth pixel corresponding region comprises a third nanopost and a fourth nanopost arranged at different positions in the fourth pixel corresponding region, a width of the first nanopost of the first pixel corresponding region located at a first distance from the central portion of the color separating lens array in a first direction on a surface of the color separating lens array is different from a width of the first nanopost of the first pixel corresponding region located at the first distance from the central portion of the color separating lens array in a second direction perpendicular to the first direction on the surface of the color separating lens array, and a width of the third nanopost of the fourth pixel corresponding region located at the first distance from the central portion of the color separating lens array in the first direction on the surface of the color separating lens array is different from a width of the third nanopost of the fourth pixel corresponding region located at the first distance from the central portion of the color separating lens array in the second direction on the surface of the color separating lens array.

9. The image sensor of claim 8, wherein a width of the first nanopost of the first pixel corresponding region in the central portion of the color separating lens array is equal to a width of the third nanopost of the fourth pixel corresponding region.

10. The image sensor of claim 9, wherein a width of the first nanopost of the first pixel corresponding region located at the first distance from the central portion of the color separating lens array in the first direction is different from a width of the third nanopost of the fourth pixel corresponding region located at the first distance from the central portion of the color separating lens array in the first direction.

11. The image sensor of claim 10, wherein a width of the first nanopost of the first pixel corresponding region located at the first distance from the central portion of the color separating lens array in the second direction is different from a width of the third nanopost of the fourth pixel corresponding region located at the first distance from the central portion of the color separating lens array in the second direction.

12. The image sensor of claim 9, wherein a width of the first nanopost of the first pixel corresponding region located at the first distance from the central portion of the color separating lens array in the first direction is equal to a width of the third nanopost of the fourth pixel corresponding region located at the first distance from the central portion of the color separating lens array in the second direction.

13. The image sensor of claim 8, wherein the first nanoposts of the first pixel corresponding region is arranged at an edge in the second direction in the first pixel corresponding region, and the third nanopost of the fourth pixel corresponding region is arranged at an edge in the first direction in the fourth pixel corresponding region.

14. The image sensor of claim 8, wherein a width of the first nanopost of the first pixel corresponding region located at a second distance greater than the first distance from the central portion of the color separating lens array in a 45-degree direction on the surface of the color separating lens array is about 5% to about 15% greater than a width of the first nanopost of the first pixel corresponding region located at the central portion of the color separating lens array.

15. The image sensor of claim 8, wherein while the azimuth angle increases from about 0 degree to about 45 degrees, the width of the first nanopost of the first pixel corresponding region arranged at the first distance from the central portion of the color separating lens array is fixed and the width of the third nanopost of the fourth pixel corresponding region decreases gradually, and while the azimuth angle increases from about 45 degrees to about 90 degrees, the width of the first nanopost of the first pixel corresponding region arranged at the first distance from the central portion of the color separating lens array increases gradually and the width of the third nanopost of the fourth pixel corresponding region is fixed.

16. An image sensor comprising:

a sensor substrate comprising a plurality of unit pixel groups, each of the plurality of unit pixel groups comprising a first pixel configured to sense a green light, a second pixel configured to sense a blue light, a third pixel configured to sense a red light, and a fourth pixel configured to sense the green light; and a color separating lens array comprising a plurality of pixel corresponding groups, each of the plurality of pixel corresponding groups comprising a first pixel corresponding region, a second pixel corresponding region, a third pixel corresponding region, and a fourth pixel corresponding region respectively corresponding to the first pixel, the second pixel, the third pixel, and the fourth pixel, wherein the first pixel corresponding region, the second pixel corresponding region, the third pixel corresponding region, and the fourth pixel corresponding region are configured to change a phase of the green light in an incident light and condense the green light onto the first pixel and the fourth pixel, configured to change a phase of the blue light in the incident light and condense the blue light onto each of the second pixel, and configured to change a phase of the red light in the incident light and condense the red light onto each of the third pixel, each of the first pixel corresponding region, the second pixel corresponding region, the third pixel corresponding region, and the fourth pixel corresponding region comprises a plurality of nanoposts, and the first pixel corresponding region is different from fourth pixel corresponding region in at least one of a shape, a width, and an arrangement of the plurality of nanoposts, wherein the first pixel corresponding region and the fourth pixel corresponding region have a same chief ray angle and different azimuth angles.

17. The image sensor of claim 16, wherein the plurality of nanoposts of the first pixel corresponding region comprise a first nanopost and a second nanopost arranged at different positions in the first pixel corresponding region, the plurality of nanoposts of the fourth pixel corresponding region comprise a third nanopost and a fourth nanopost arranged at different positions in the fourth pixel corresponding region, and in an area having a first azimuth angle, a width of the first nanopost of the first pixel corresponding region is smaller than a width of the third nanopost of the fourth pixel corresponding region.

18. The image sensor of claim 17, wherein in an area having a second azimuth angle different from the first azimuth angle, the width of the first nanopost of the first pixel corresponding region is greater than the width of the third nanopost of the fourth pixel corresponding region.

19. The image sensor of claim 18, wherein in an area having a third azimuth angle between the first azimuth angel and the second azimuth angle, the width of the first nanopost of the first pixel corresponding region is equal to the width of the third nanopost of the fourth pixel corresponding region.

20. An electronic apparatus comprising:

an image sensor configured to convert an optical image into an electrical signal;

a processor configured to control the image sensor and store and output a signal generated by the image sensor; and a lens assembly configured to direct light incident from an object to the image sensor, wherein the image sensor comprises:

a sensor substrate comprising a plurality of first pixels configured to sense light of a first wavelength, and a plurality of second pixels configured to sense light of a second wavelength different from the first wavelength; and a color separating lens array comprising a plurality of first pixel corresponding regions respectively corresponding to the plurality of first pixels and a plurality of second pixel corresponding regions respectively corresponding to the plurality of second pixels, wherein the plurality of first pixel corresponding regions are configured to change a phase of the light of the first wavelength and condense the light of the first wavelength onto each of the plurality of first pixels, and the plurality of second pixel corresponding regions are configured to change a phase of the light of the second wavelength and condense the light of the second wavelength onto each of the plurality of second pixels, each of the plurality of first pixel corresponding regions and the plurality of second pixel corresponding regions comprises a plurality of nanoposts, and at least one of a shape, a width, and an arrangement of the plurality of nanoposts of the plurality of first pixel corresponding regions is set according to an azimuth angle of the plurality of nanoposts in a peripheral portion surrounding a central portion of the color separating lens array, wherein in area having a same chief ray angle and different azimuth angles, the plurality of nanoposts in the plurality of first pixel corresponding regions have different shapes, widths, or arrangements.

* * * * *